US010453752B2

(12) United States Patent
Van Dal et al.

(10) Patent No.: US 10,453,752 B2
(45) Date of Patent: Oct. 22, 2019

(54) METHOD OF MANUFACTURING A GATE-ALL-AROUND SEMICONDUCTOR DEVICE

(71) Applicant: TAIWAN SEMICONDUCTOR MANUFACTURING CO., LTD., Hsinchu (TW)

(72) Inventors: Mark Van Dal, Linden (BE); Gerben Doornbos, Kessel-Lo (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/707,634

(22) Filed: Sep. 18, 2017

(65) Prior Publication Data

US 2019/0088553 A1   Mar. 21, 2019

(51) Int. Cl.
*H01L 21/8238* (2006.01)
*H01L 29/423* (2006.01)
(Continued)

(52) U.S. Cl.
CPC ........... *H01L 21/823807* (2013.01); *H01L 21/02532* (2013.01); *H01L 21/02603* (2013.01); *H01L 21/823814* (2013.01); *H01L 21/823828* (2013.01); *H01L 21/823871* (2013.01); *H01L 21/823878* (2013.01); *H01L 27/092* (2013.01);
(Continued)

(58) Field of Classification Search
CPC .......... H01L 29/4239; H01L 29/78696; H01L 29/66545; H01L 29/42392
See application file for complete search history.

(56) References Cited

U.S. PATENT DOCUMENTS 5,976,951 A    11/1999  Huang et al.
9,209,247 B2  12/2015  Colinge et al.
(Continued)

FOREIGN PATENT DOCUMENTS

JP        2015-103531 A     6/2015
KR    10-2015-0039488      4/2015
KR       10-1727798         4/2017

OTHER PUBLICATIONS

Office Action dated Sep. 28, 2018 issued in corresponding Korean Application No. 10-2017-0165324.

*Primary Examiner* — Nelson Garces
(74) *Attorney, Agent, or Firm* — McDermott Will & Emery LLP

(57) ABSTRACT

A fin including a bottom portion, a first sacrificial layer disposed over the bottom portion, a first semiconductor layer disposed over the first sacrificial layer, a second sacrificial layer disposed over the first semiconductor layer and a second semiconductor layer disposed over the second sacrificial layer, is formed. The second semiconductor layer protrudes from a first insulating layer. A dummy gate is formed over the second semiconductor layer. A sidewall spacer layer is formed on side faces of the dummy gate. A first dielectric layer is formed over the dummy gate and the sidewall spacer layer. The dummy gate is removed, thereby forming a gate space. The first insulating layer is etched in the gate space, thereby exposing the first semiconductor layer and the first and second sacrificial layers. The first and second sacrificial layers are removed. A gate dielectric layer and a gate electrode layer are formed.

17 Claims, 57 Drawing Sheets

(51) Int. Cl.
*H01L 29/786* (2006.01)
*H01L 29/66* (2006.01)
*H01L 29/06* (2006.01)
*H01L 21/02* (2006.01)
*H01L 27/092* (2006.01)
*H01L 27/11* (2006.01)

(52) U.S. Cl.
CPC ...... *H01L 29/0649* (2013.01); *H01L 29/0673* (2013.01); *H01L 29/42392* (2013.01); *H01L 29/66545* (2013.01); *H01L 29/78618* (2013.01); *H01L 29/78696* (2013.01); *H01L 27/1108* (2013.01)

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,431,388 B1 | 8/2016 | Gauthier, Jr. et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2008/0099849 A1 | 5/2008 | Kim et al. | |
| 2014/0203334 A1* | 7/2014 | Colinge | H01L 29/66795 257/288 |
| 2015/0090958 A1 | 4/2015 | Yang et al. | |
| 2015/0123193 A1 | 5/2015 | Masuoka et al. | |
| 2015/0263088 A1 | 9/2015 | Cheng et al. | |
| 2016/0211264 A1 | 7/2016 | Peng | |
| 2016/0211276 A1 | 7/2016 | Liu et al. | |
| 2016/0211326 A1 | 7/2016 | Tsai et al. | |
| 2016/0240681 A1* | 8/2016 | Ching | H01L 29/66545 |
| 2017/0040321 A1 | 2/2017 | Mitard | |
| 2017/0194480 A1 | 7/2017 | Chen et al. | |

\* cited by examiner

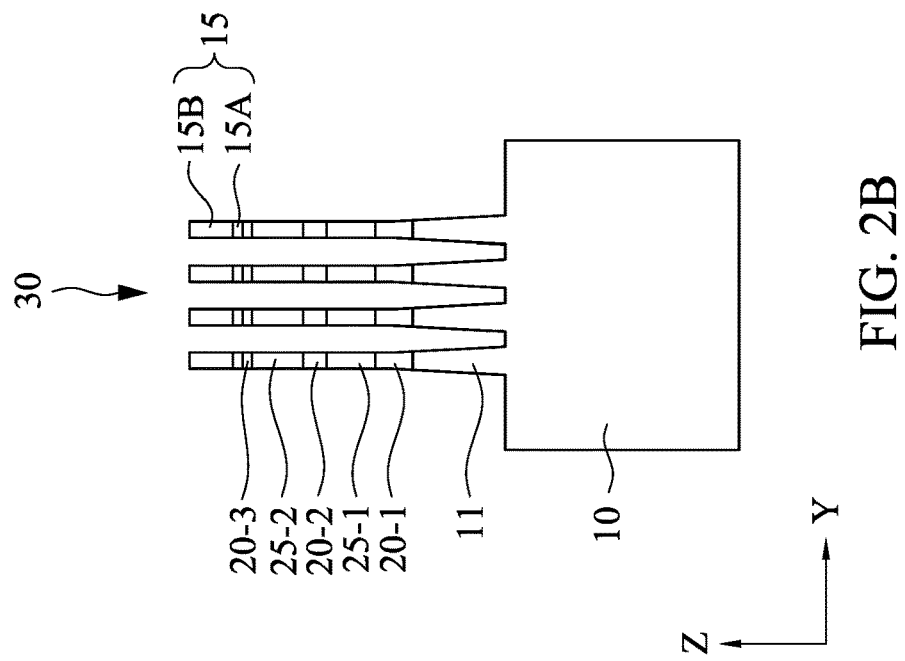
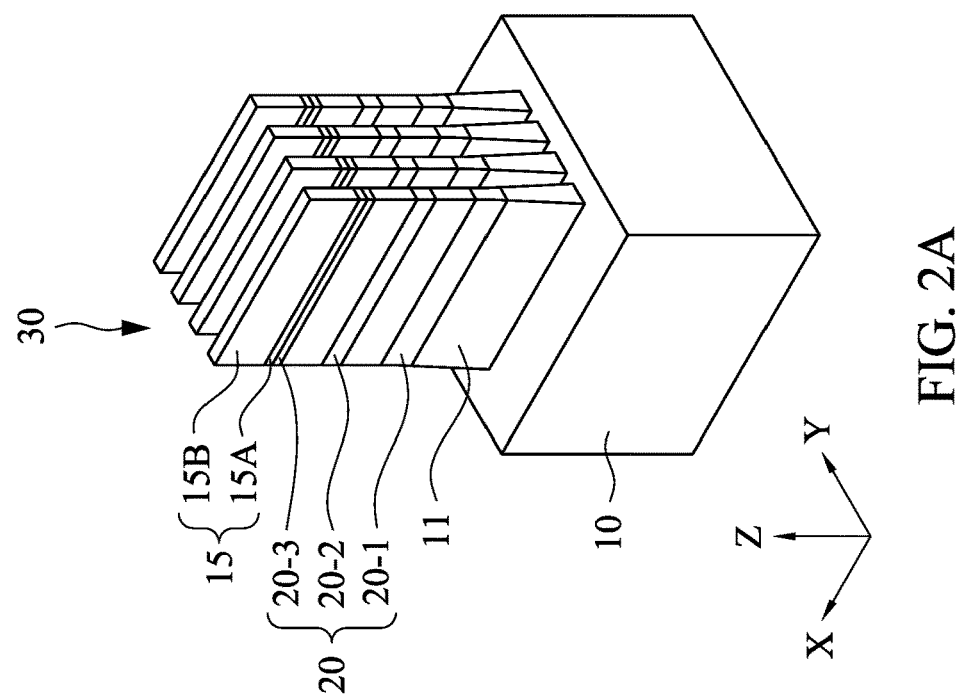

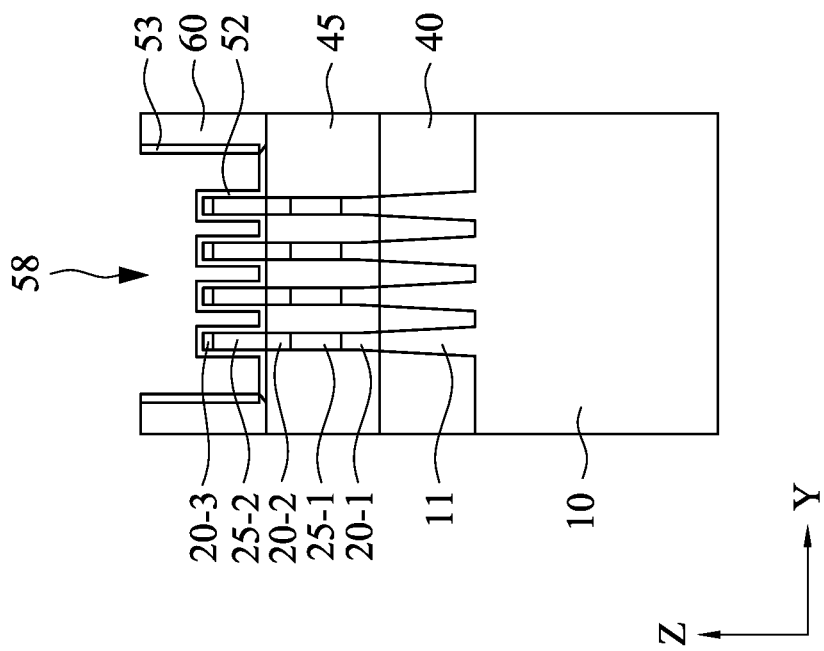
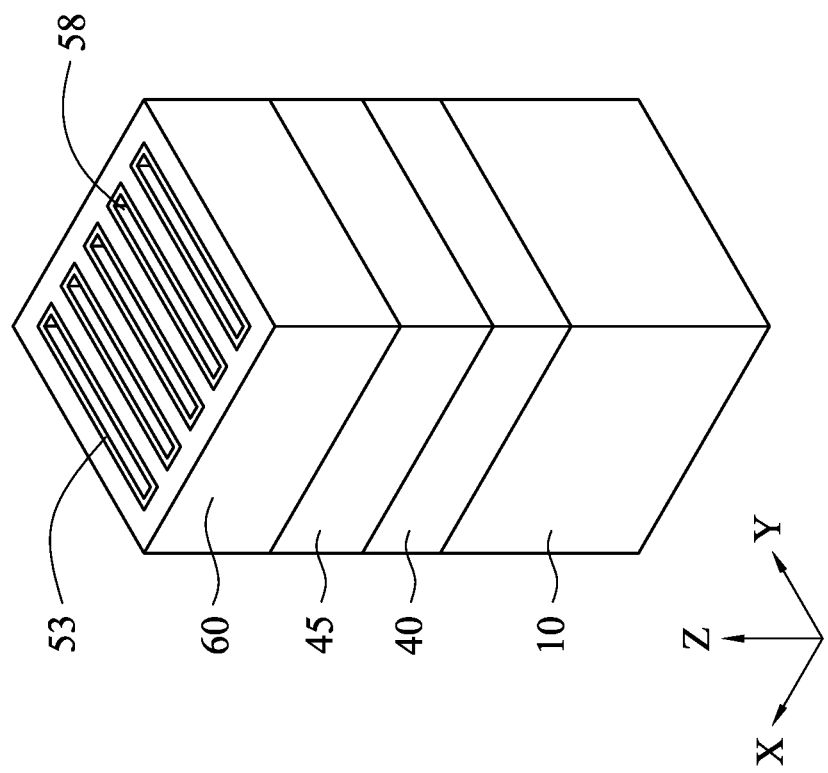
FIG. 7B
FIG. 7A

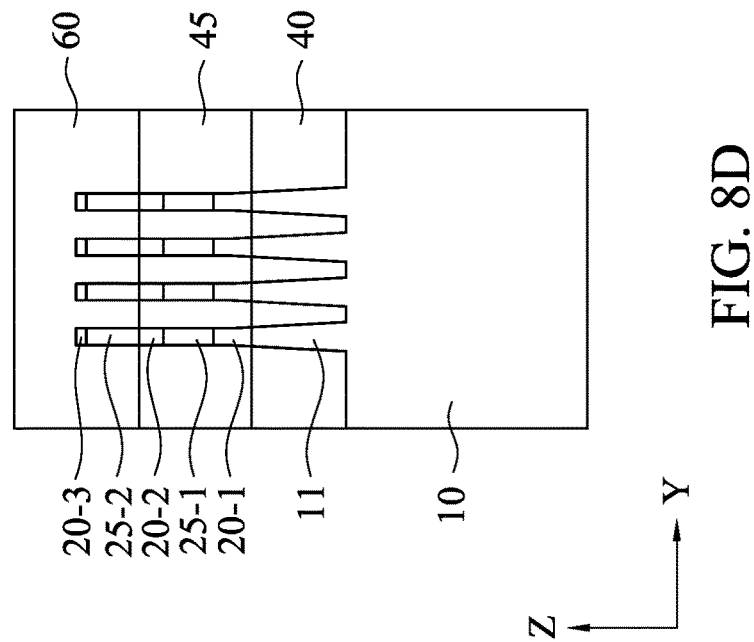
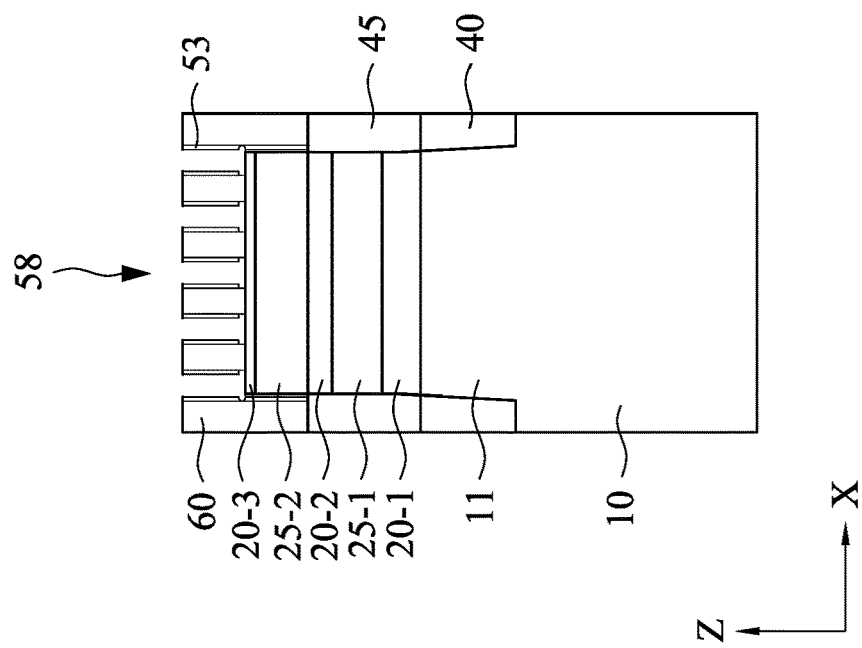
FIG. 8D
FIG. 8C

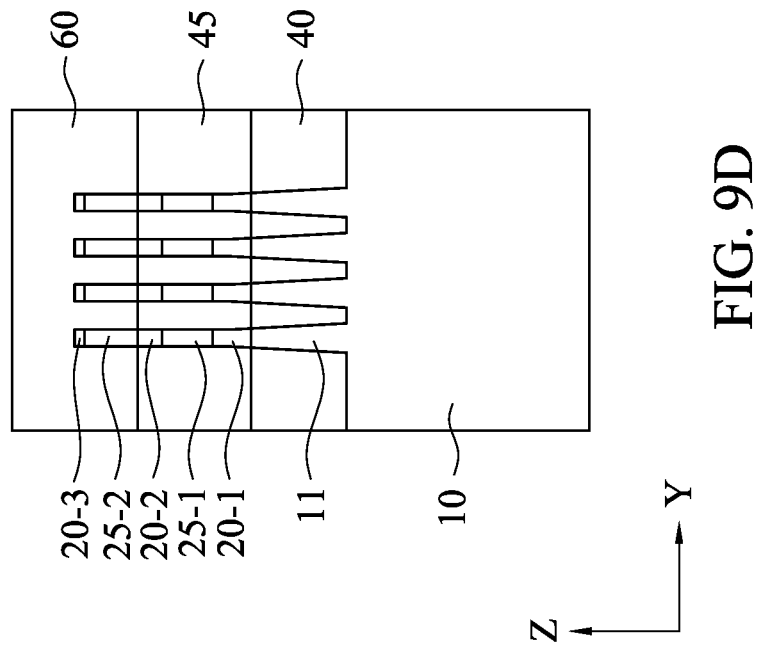
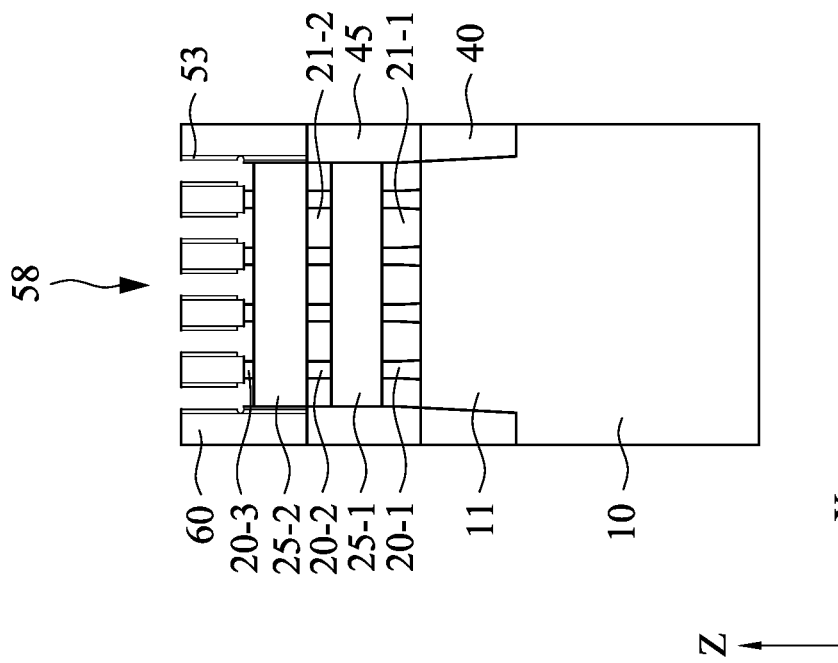
FIG. 9D
FIG. 9C

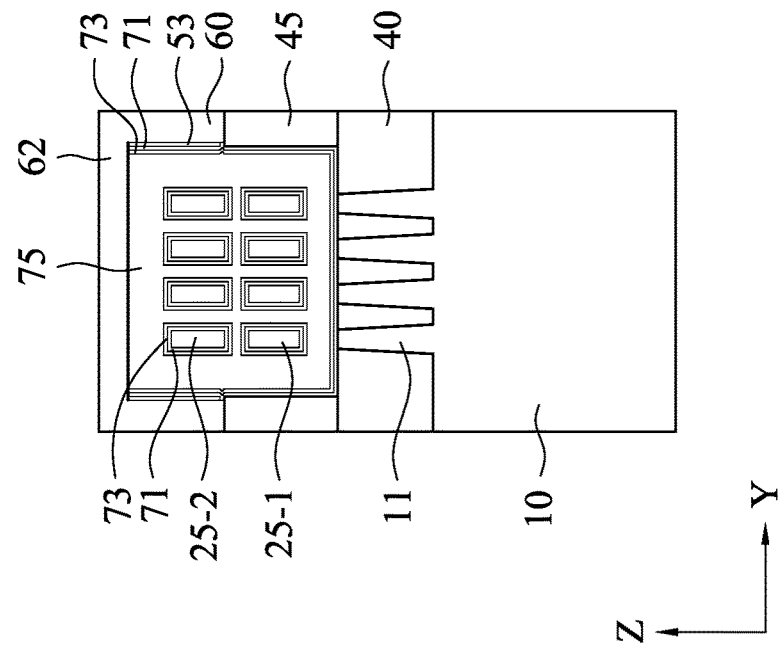
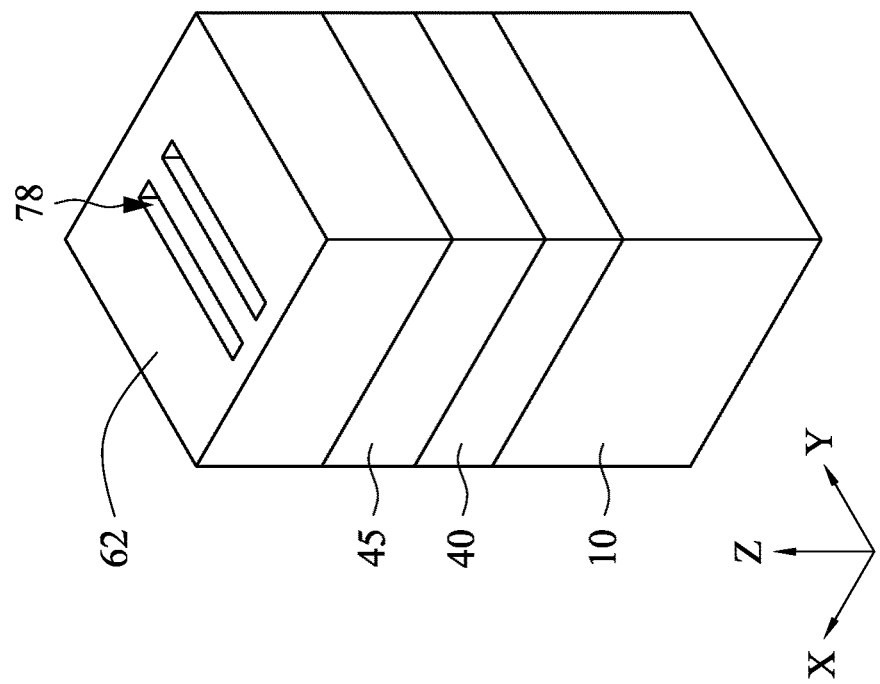
FIG. 12B
FIG. 12A

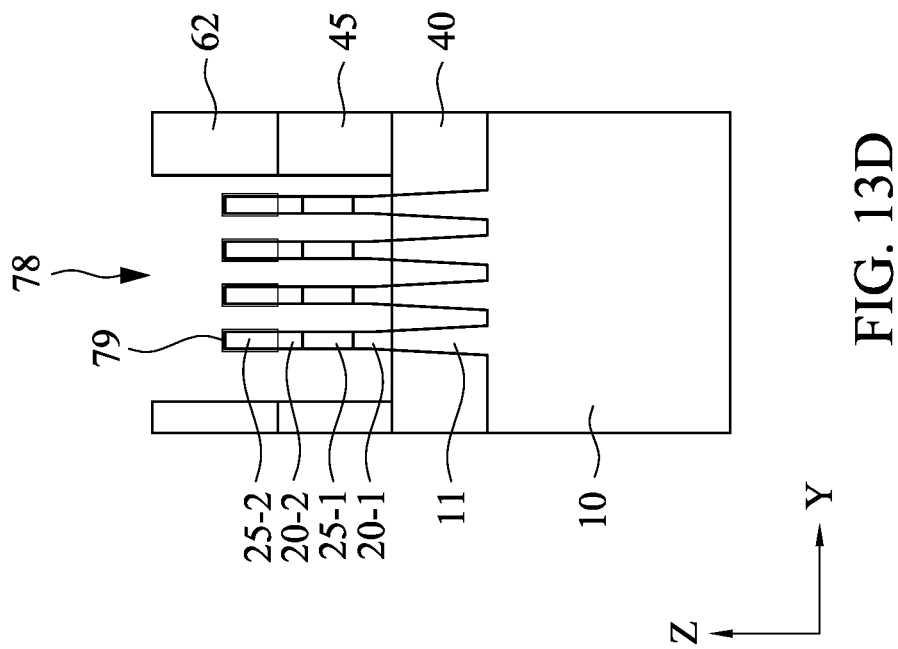
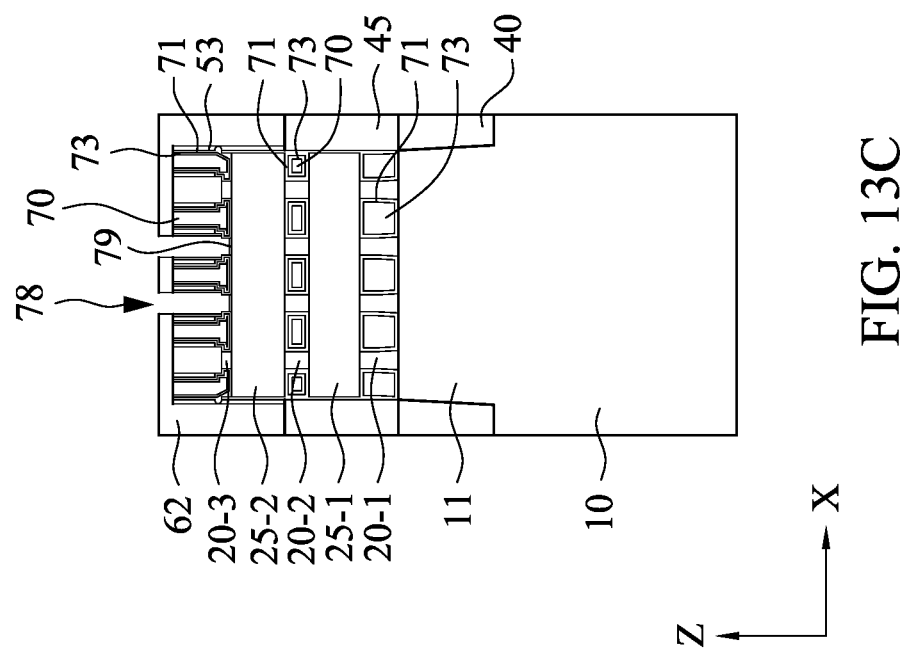

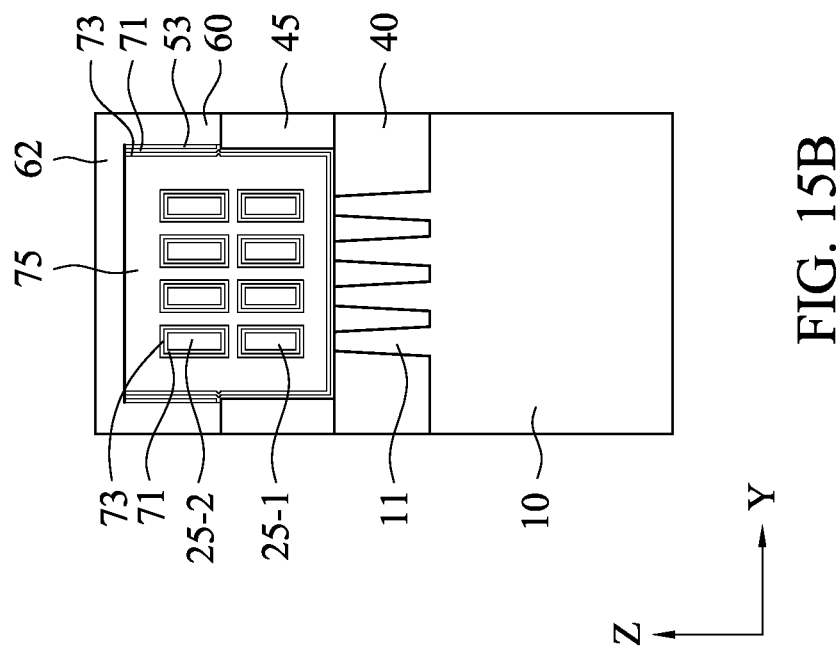
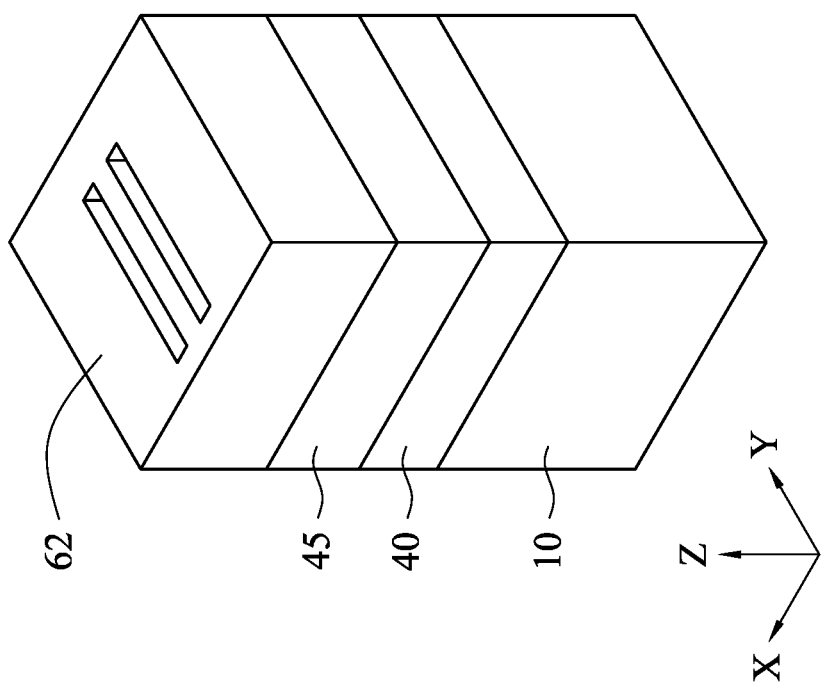
FIG. 15B
FIG. 15A

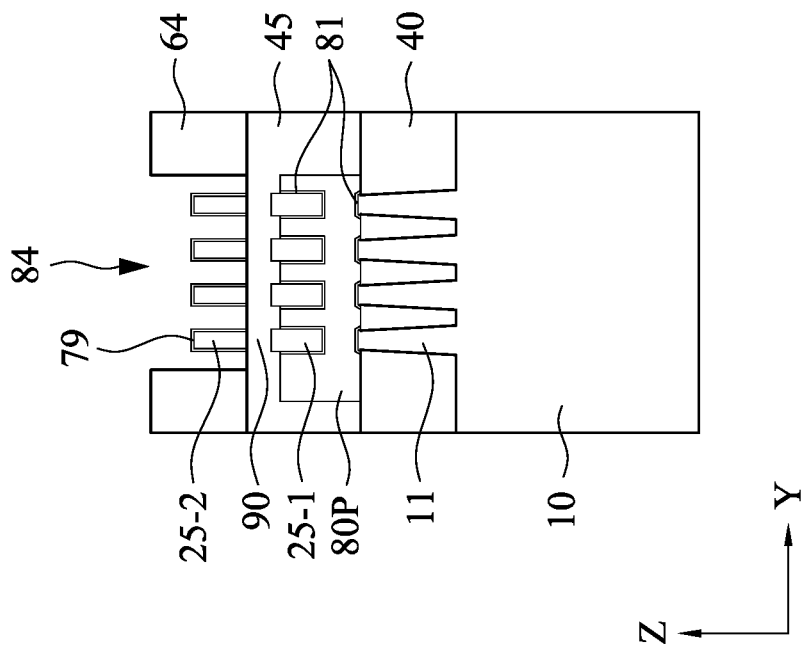
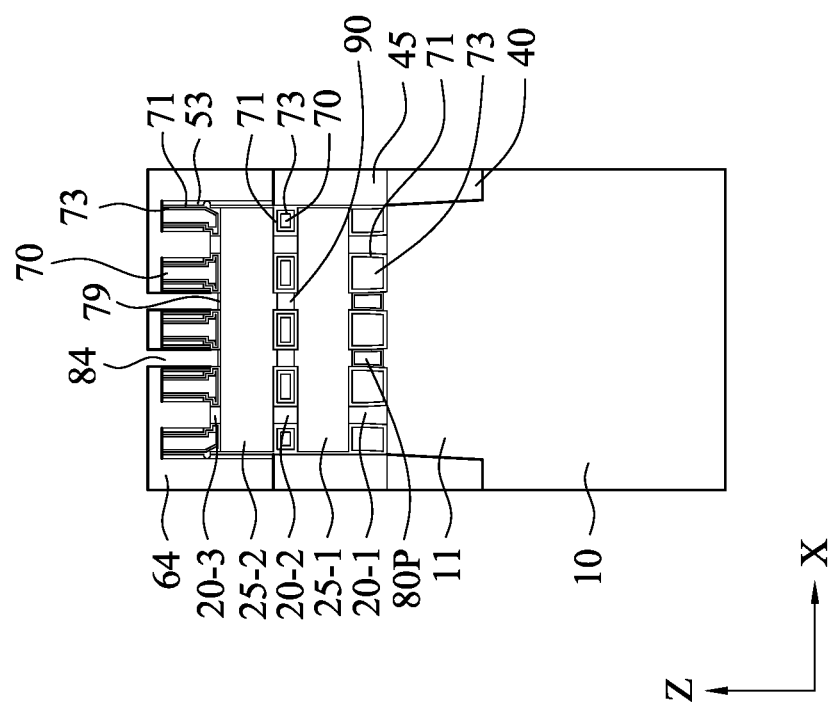

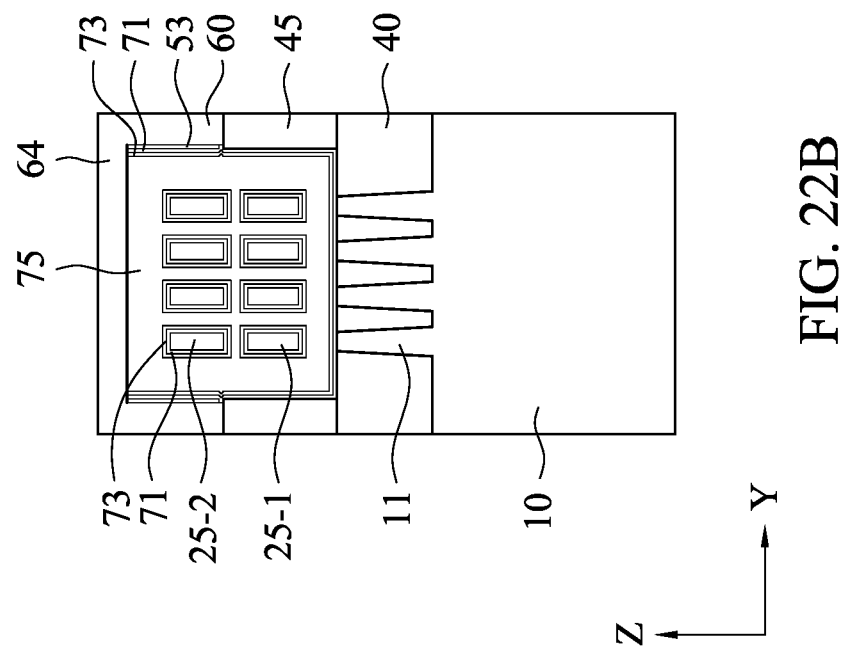
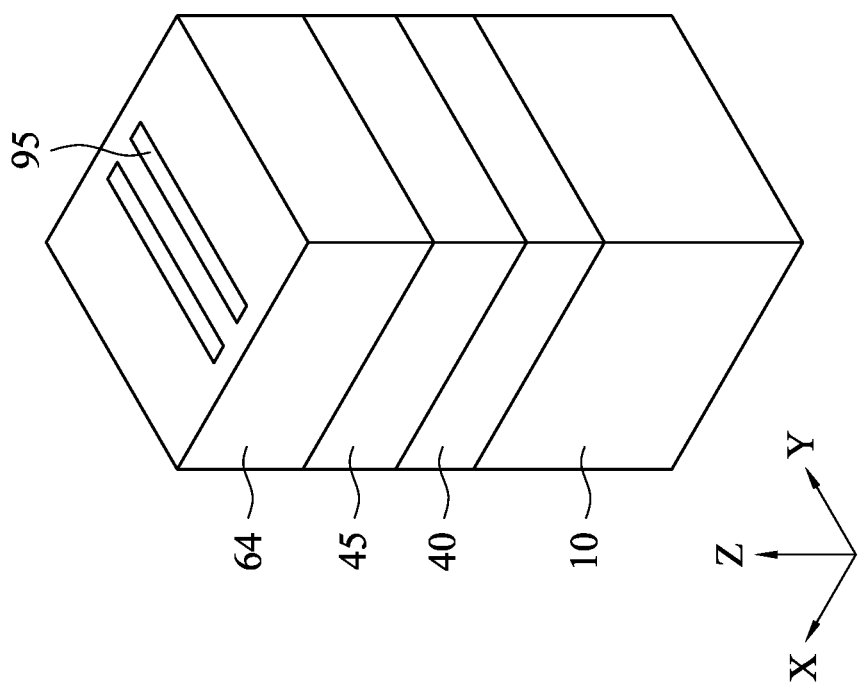
FIG. 22B
FIG. 22A

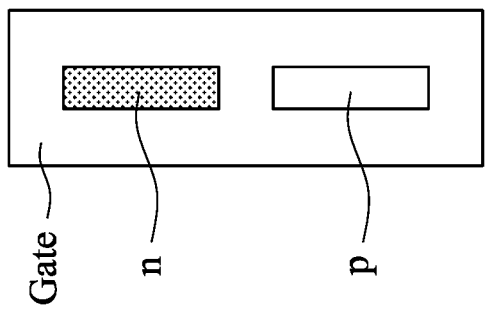
FIG. 26A
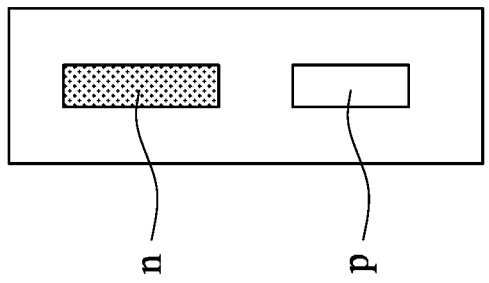
FIG. 26B
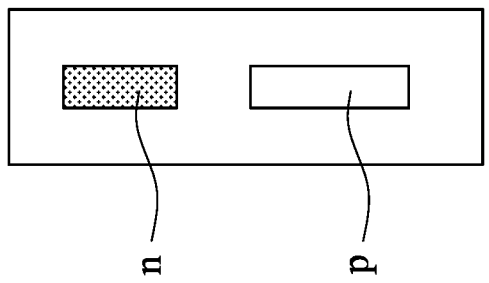
FIG. 26C
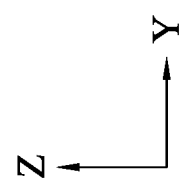

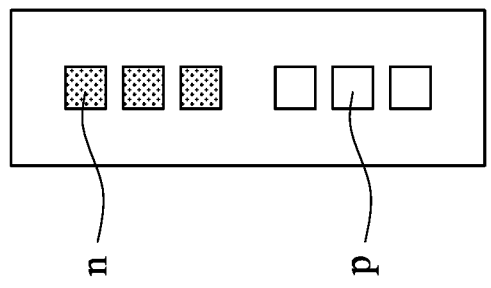
FIG. 27A
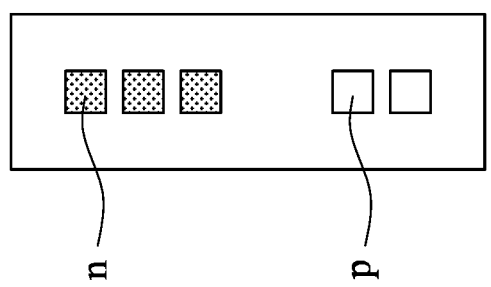
FIG. 27B
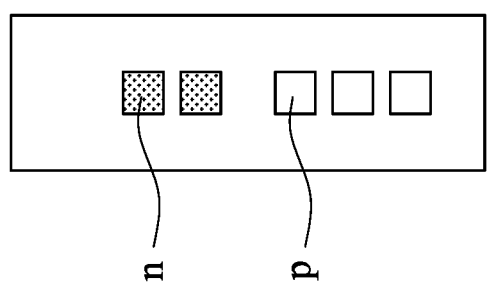
FIG. 27C
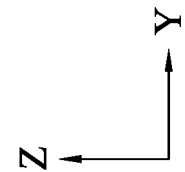

METHOD OF MANUFACTURING A GATE-ALL-AROUND SEMICONDUCTOR DEVICE

TECHNICAL FIELD

The disclosure relates to method of manufacturing semiconductor integrated circuits, and more particularly to method of manufacturing semiconductor devices including fin field effect transistors (FinFETs) and/or gate-all-around FETs vertically stacked, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a FinFET and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C and 2D show one of the various stages of manufacturing a semiconductor FET device according to embodiments of the present disclosure.

FIGS. 7A, 7B, 7C and 7D show one of the various stages of manufacturing a semiconductor FET device according to embodiments of the present disclosure.

FIGS. 8A, 8B, 8C and 8D show one of the various stages of manufacturing a semiconductor FET device according to embodiments of the present disclosure.

FIGS. 9A, 9B, 9C and 9D show one of the various stages of manufacturing a semiconductor FET device according to embodiments of the present disclosure.

FIGS. 12A, 12B, 12C and 12D show one of the various stages of manufacturing a semiconductor FET device according to embodiments of the present disclosure.

FIGS. 13A, 13B, 13C and 13D show one of the various stages of manufacturing a semiconductor FET device according to embodiments of the present disclosure.

FIGS. 15A, 15B, 15C and 15D show one of the various stages of manufacturing a semiconductor FET device according to embodiments of the present disclosure.

FIGS. 20A, 20B, 20C and 20D show one of the various stages of manufacturing a semiconductor FET device according to embodiments of the present disclosure.

FIGS. 22A, 22B, 22C and 22D show one of the various stages of manufacturing a semiconductor FET device according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of."

Figure 24A:
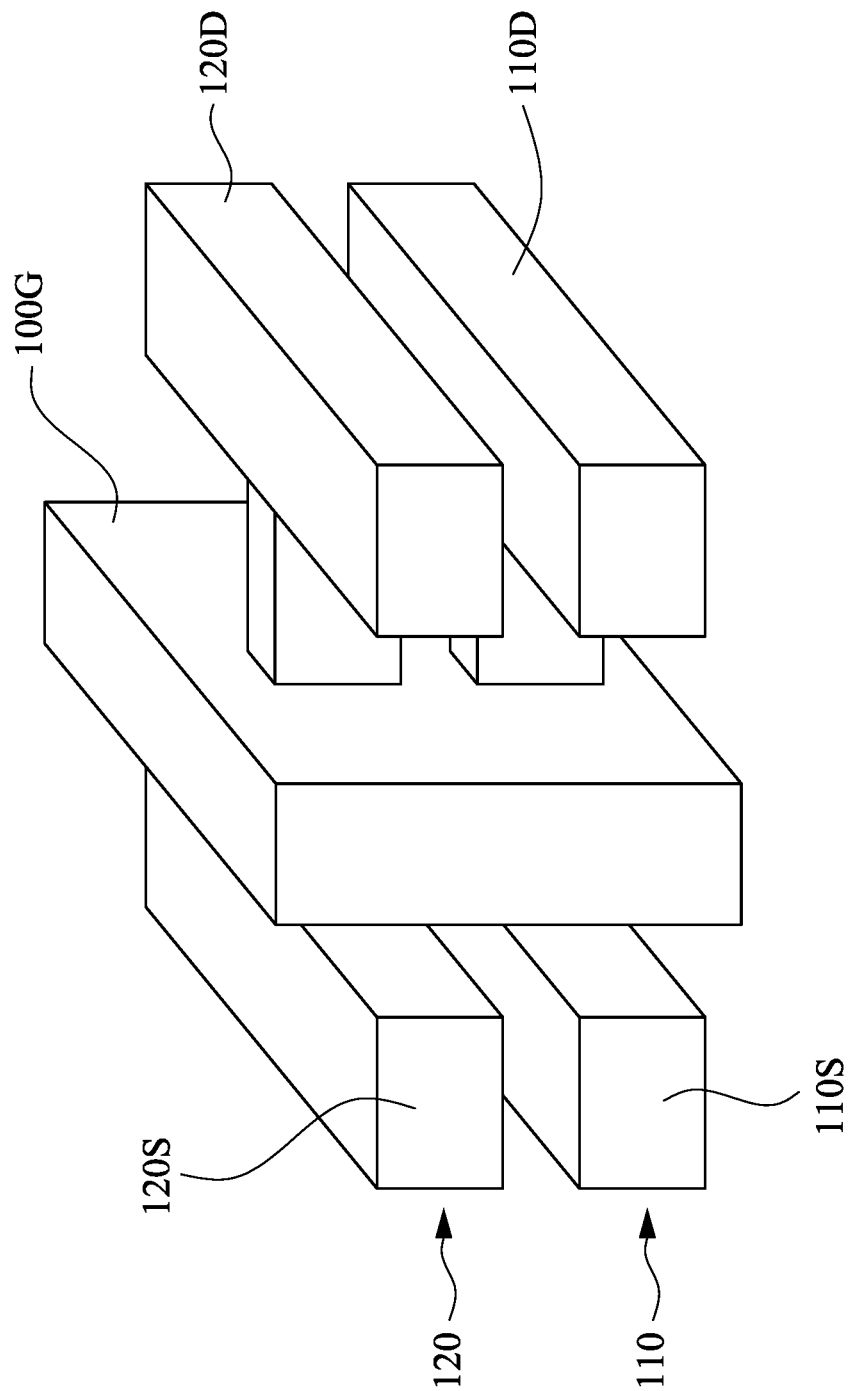
FIG. 24A shows a conceptual view of a vertically arranged complementary FET (CFET).

In the present disclosure, a complementary FET (CFET) as shown in FIG. 24A, and its manufacturing method are disclosed. In a CFET, a first gate-all-around field effect transistor 110 (GAA FET) is disposed over a substrate, and a second GAA FET 120 is disposed above the first GAA FET 110. The first GAA FET 110 includes a first source 110S and a first drain 110D, and the second GAA FET 120 includes a second source 120S and the second drain 120D. The source/drain of the first GAA FET is electrically separated from the source/drain of the second GAA FET in some embodiments. A gate structure 100G including a gate dielectric layer and a gate electrode layer is commonly formed around the channel region of the first and second GAA FETs. In some embodiments, the first GAA FET is a first conductivity type (e.g., n-type) FET and the second GAA FET is a second conductivity type (e.g., p-type) different from the first conductivity type. In other embodiments, the first and second GAA FETs have the same conductivity type.

Figure 1B:
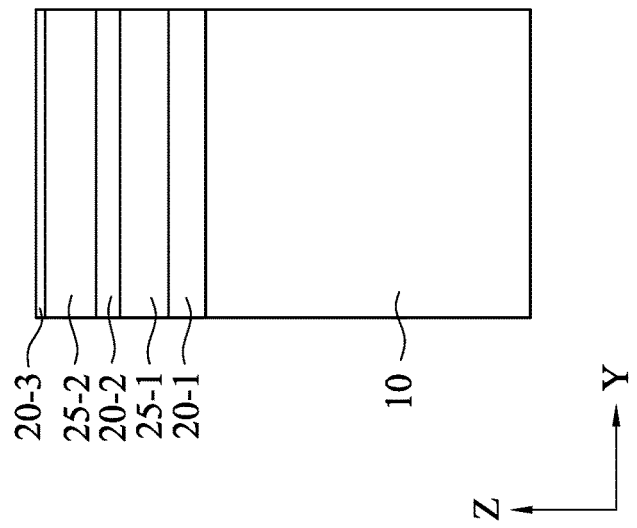
FIGS. 1A, 1B, 1C and 1D show one of the various stages of manufacturing a semiconductor FET device according to embodiments of the present disclosure.
Figure 1A:
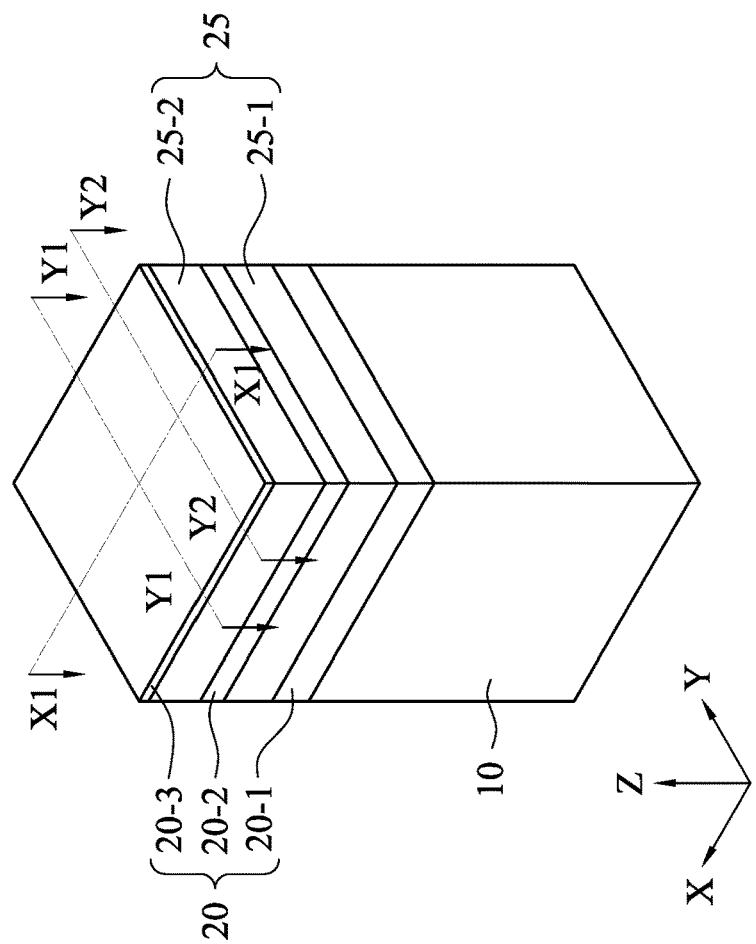
Figure 1D:
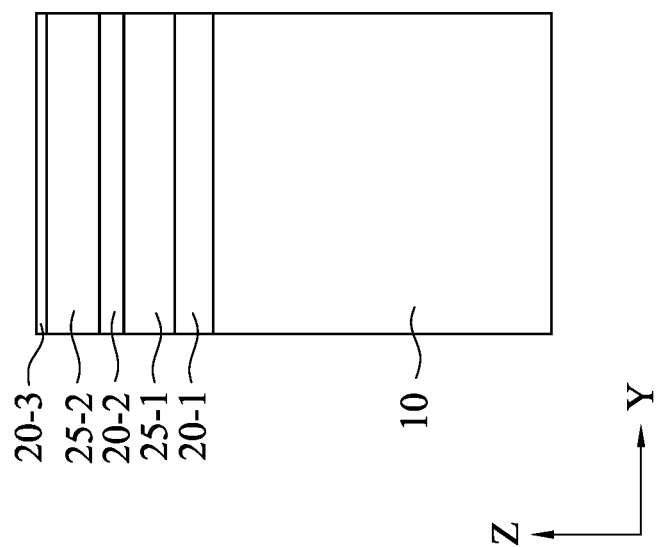
Figure 1C:
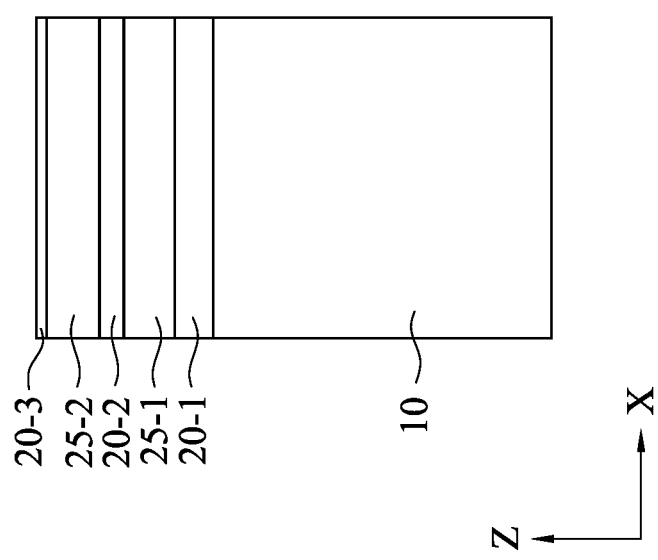
Figure 2D:
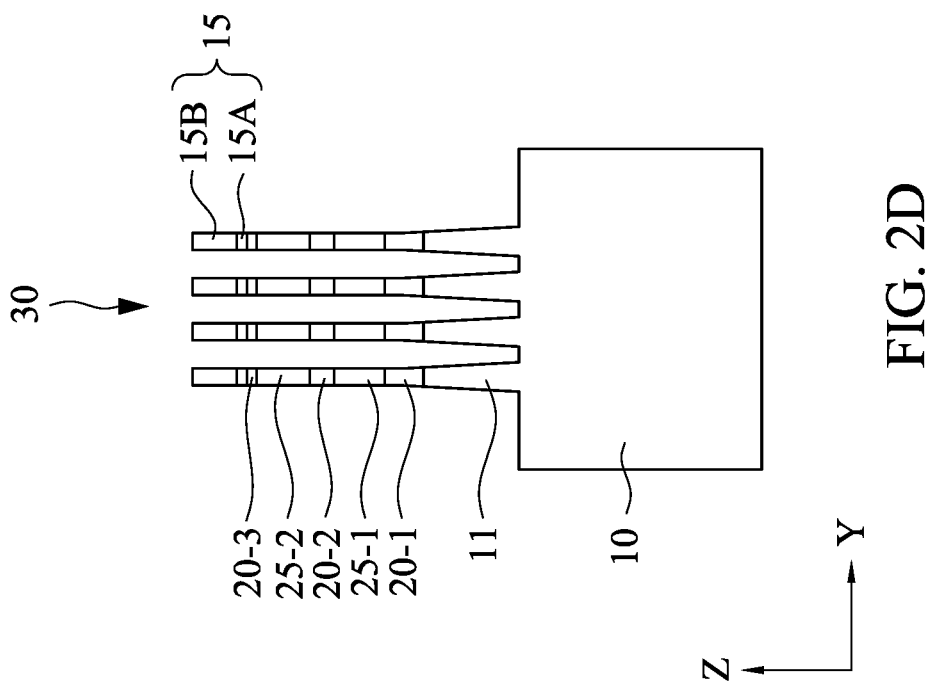
Figure 2C:
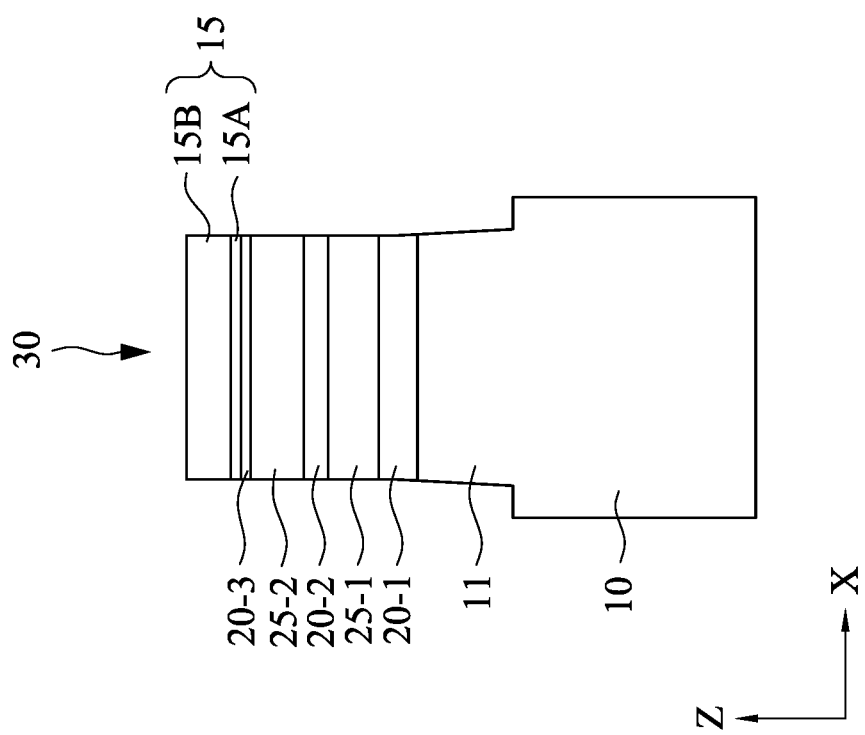
Figure 3B:
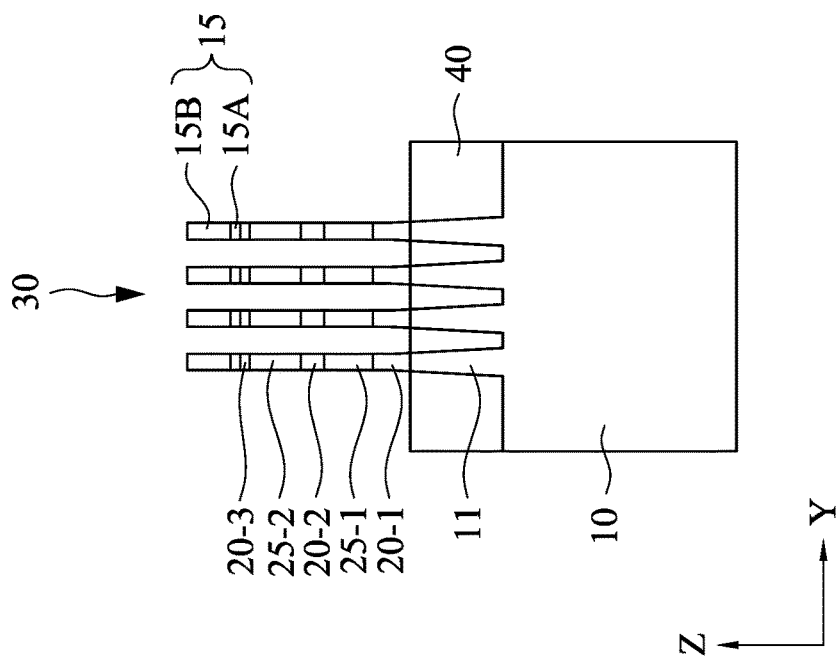
FIGS. 3A, 3B, 3C and 3D show one of the various stages of manufacturing a semiconductor FET device according to embodiments of the present disclosure.
Figure 3A:
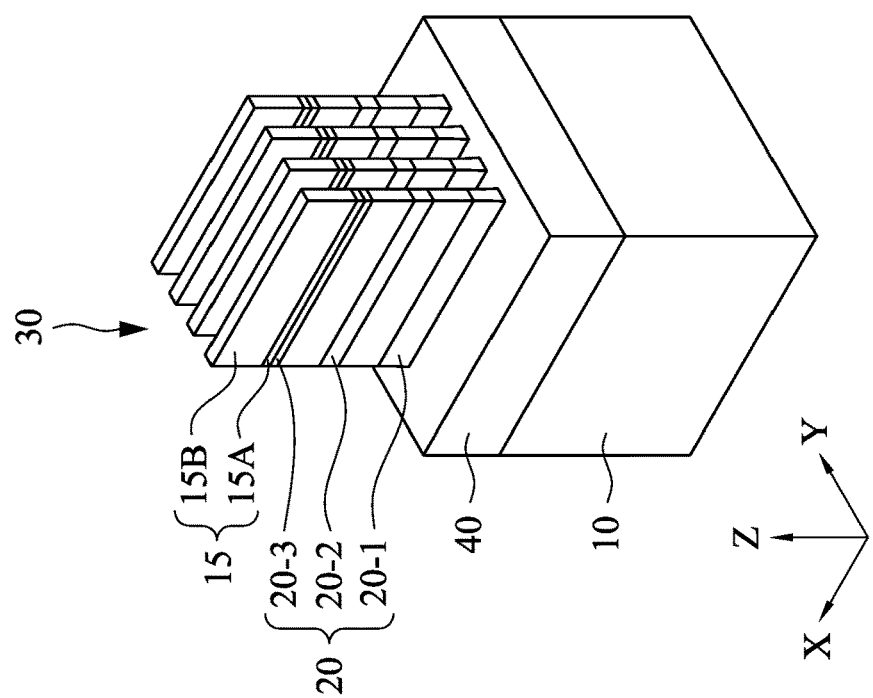
Figure 3D:
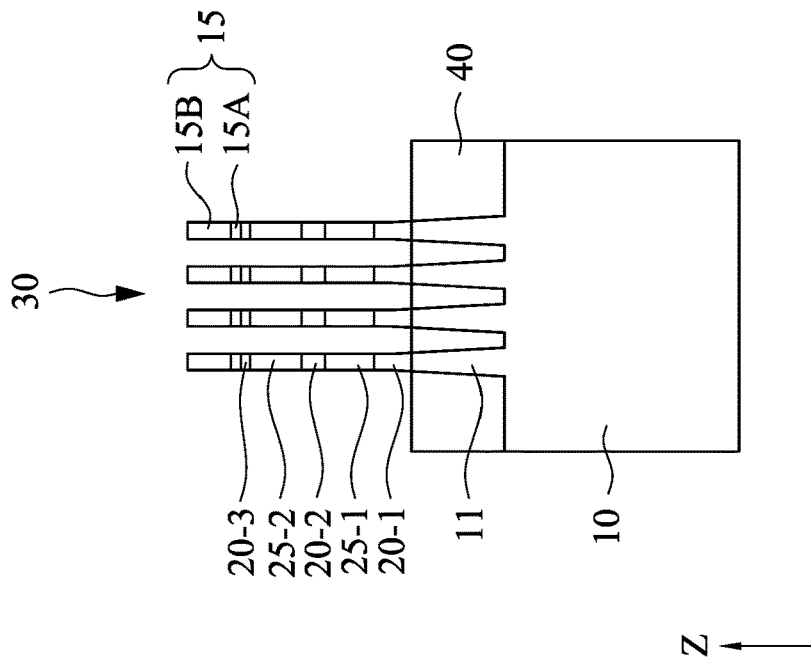
Figure 3C:
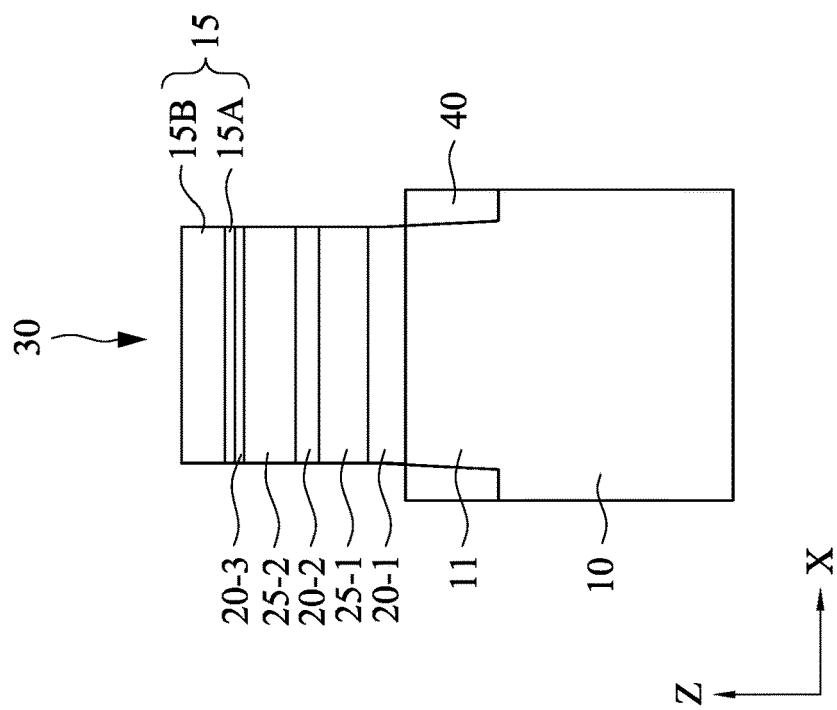
Figure 4B:
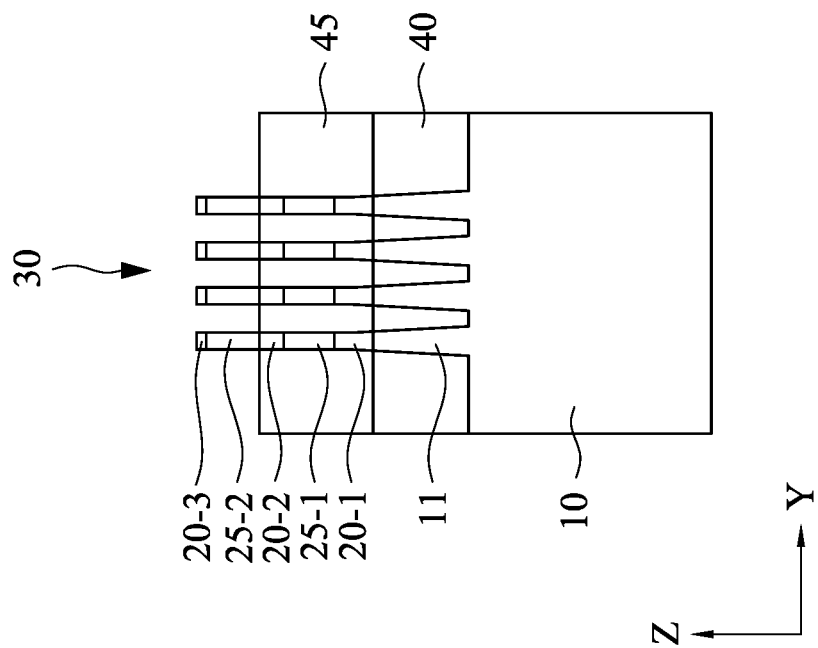
FIGS. 4A, 4B, 4C and 4D show one of the various stages of manufacturing a semiconductor FET device according to embodiments of the present disclosure.
Figure 4A:
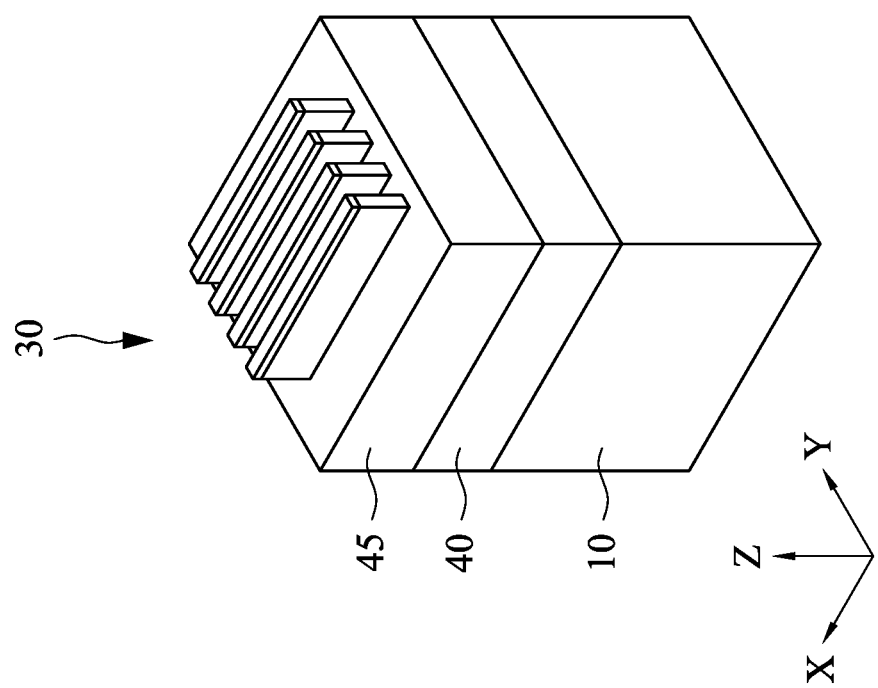
Figure 4D:
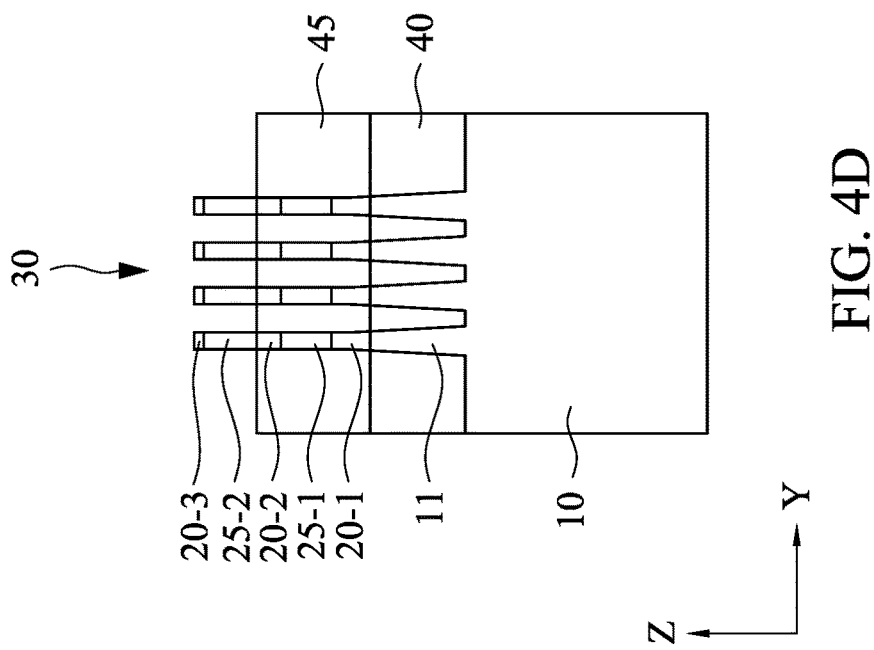
Figure 4C:
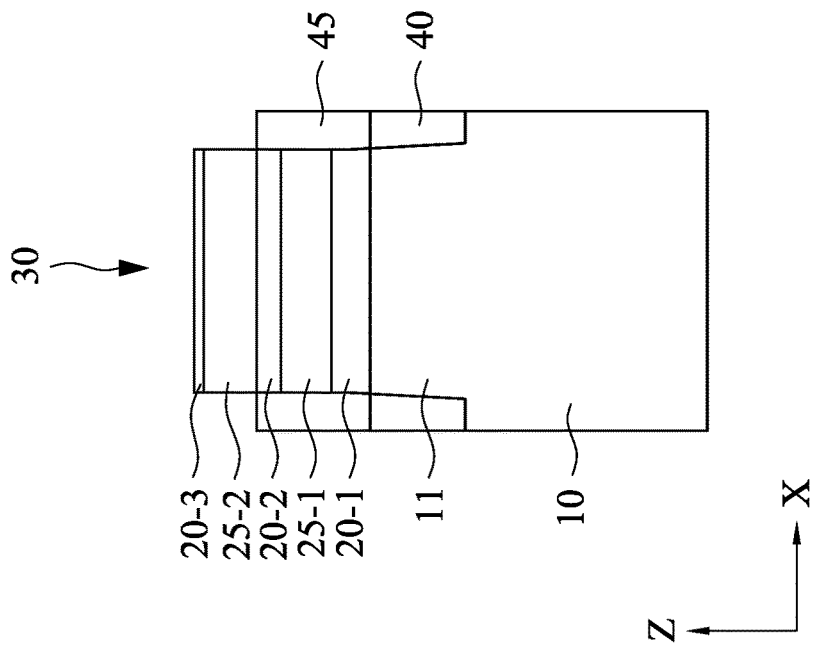
Figure 5B:
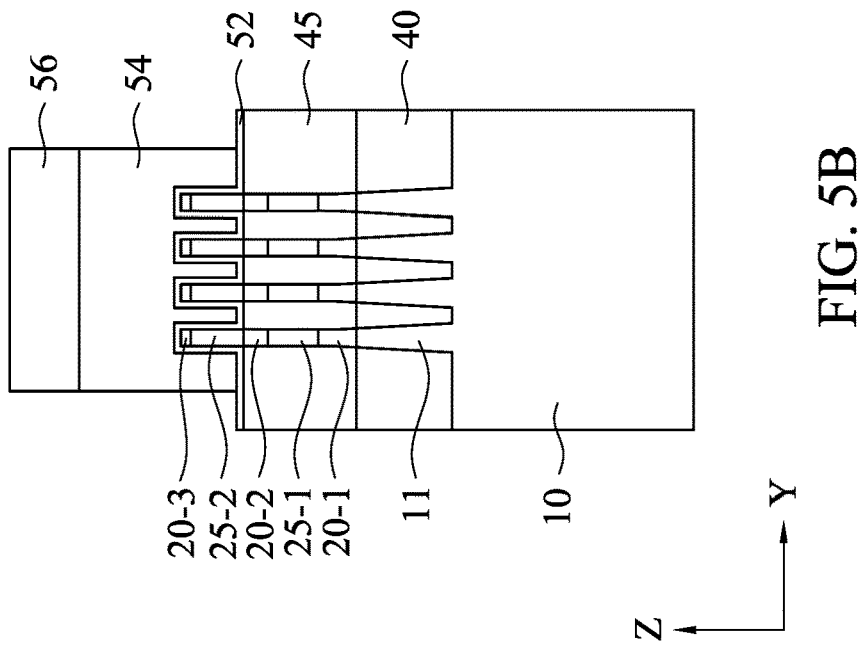
FIGS. 5A, 5B, 5C and 5D show one of the various stages of manufacturing a semiconductor FET device according to embodiments of the present disclosure.
Figure 5A:
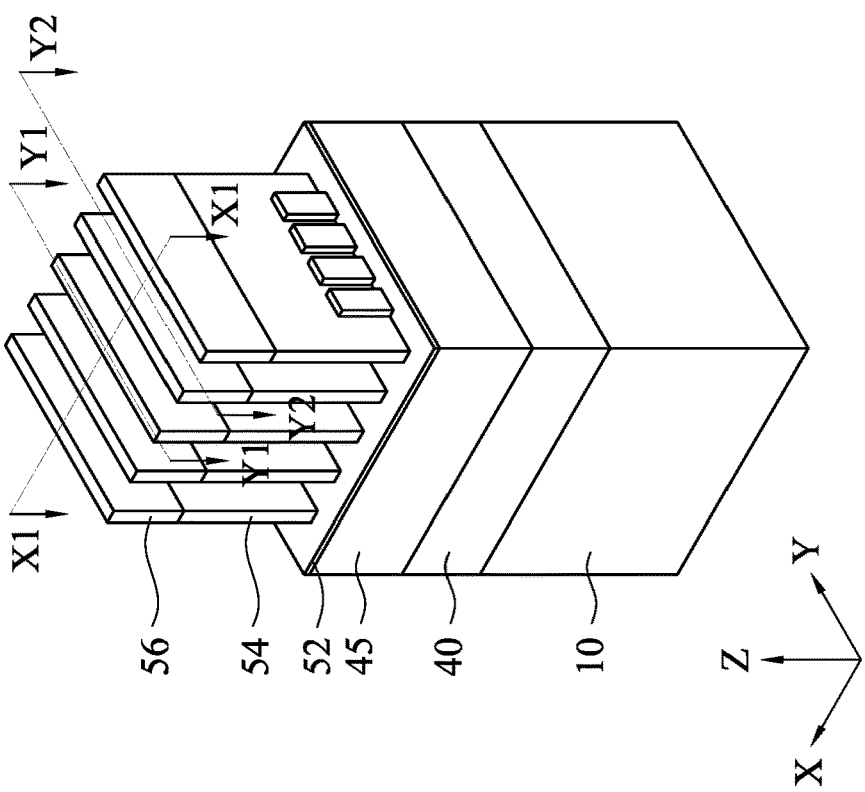
Figure 5D:
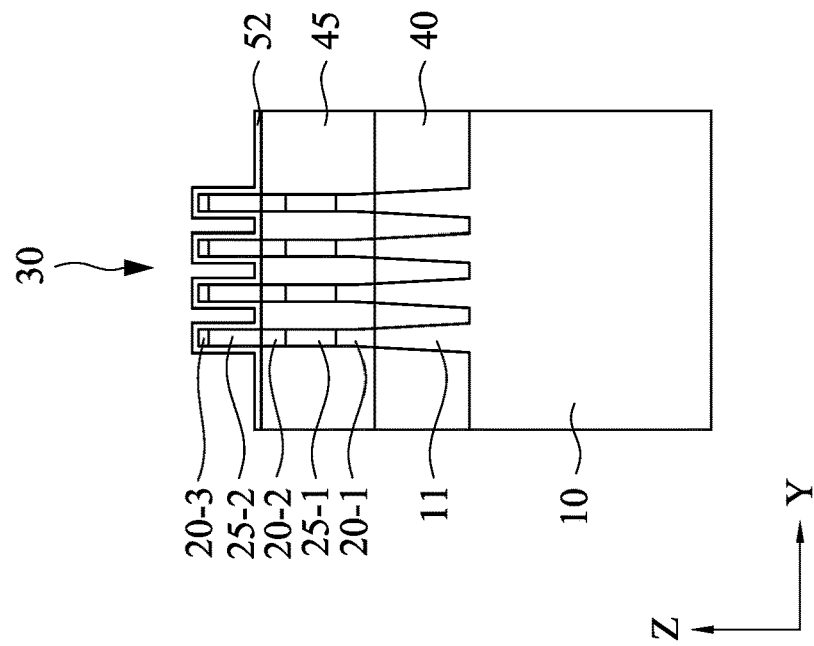
Figure 5C:
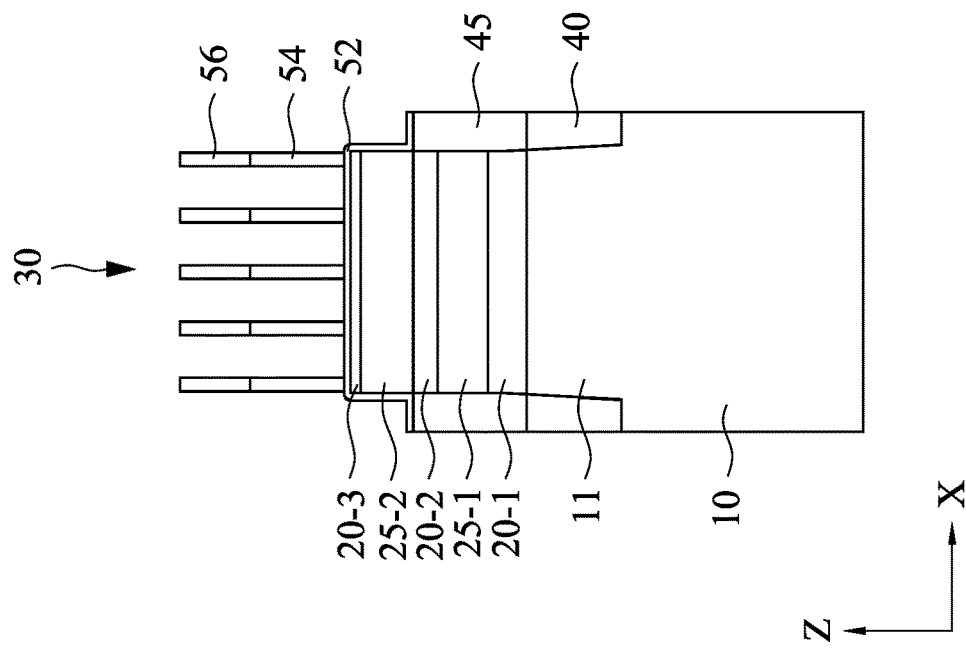
Figure 6B:
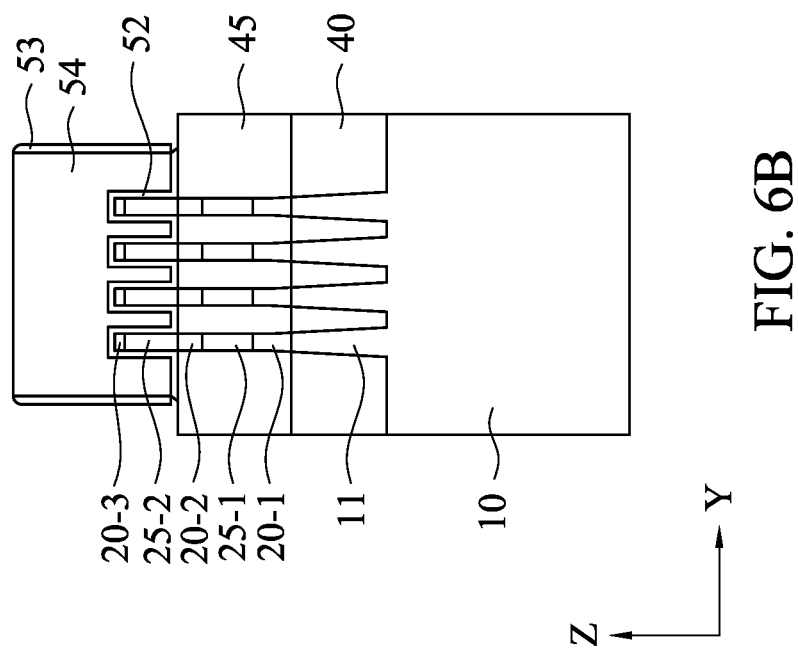
FIGS. 6A, 6B, 6C and 6D show one of the various stages of manufacturing a semiconductor FET device according to embodiments of the present disclosure.
Figure 6A:
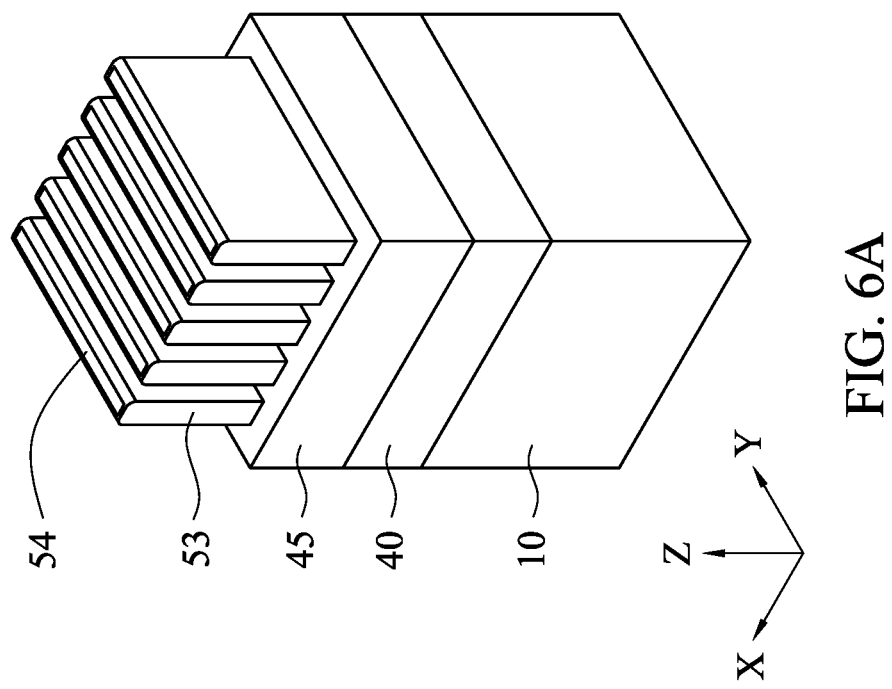
Figure 6D:
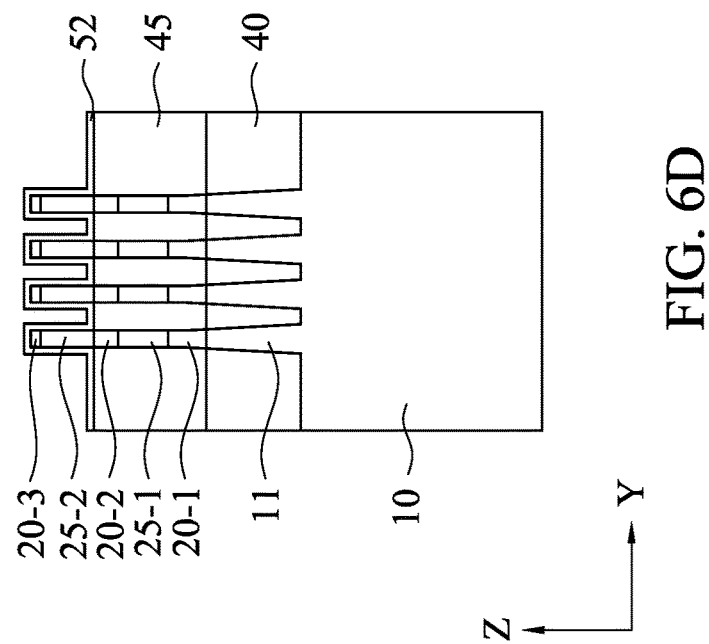
Figure 6C:
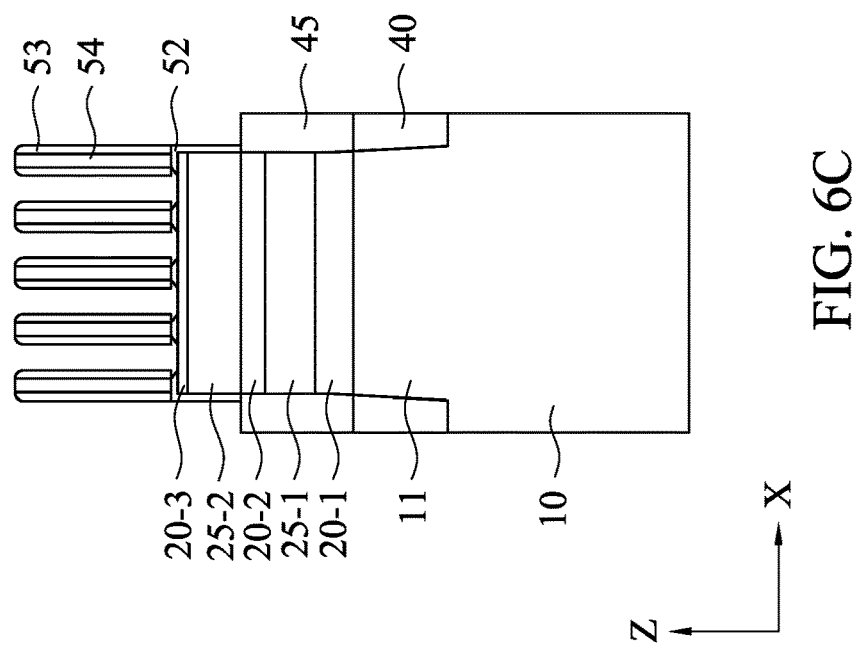
Figure 7D:
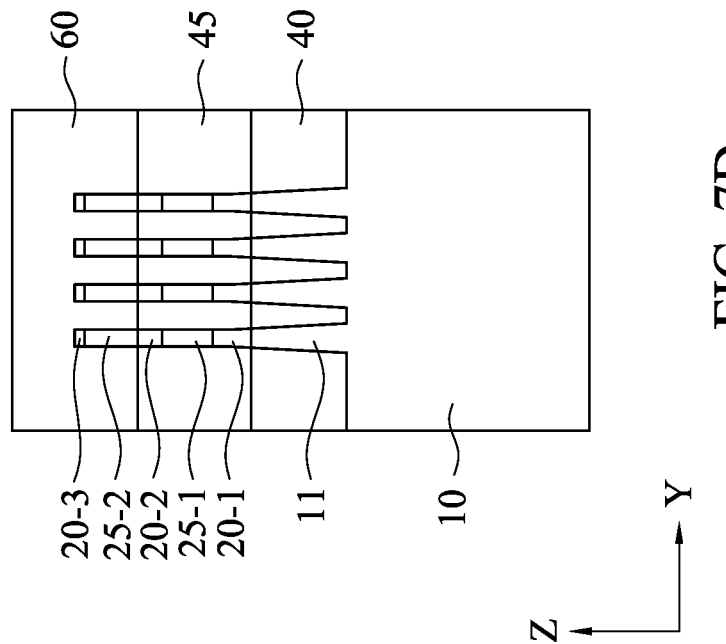
Figure 7C:
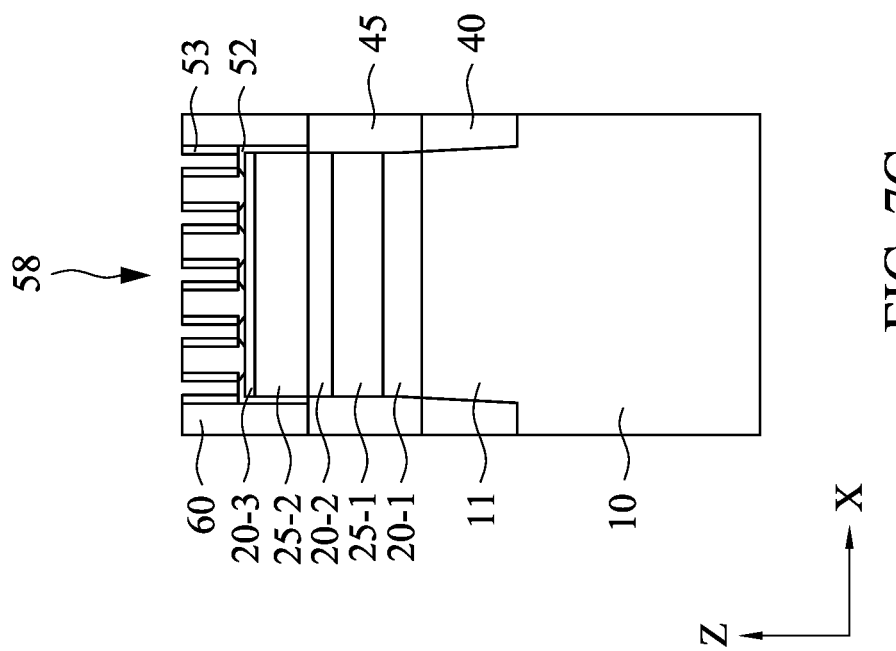
Figure 8B:
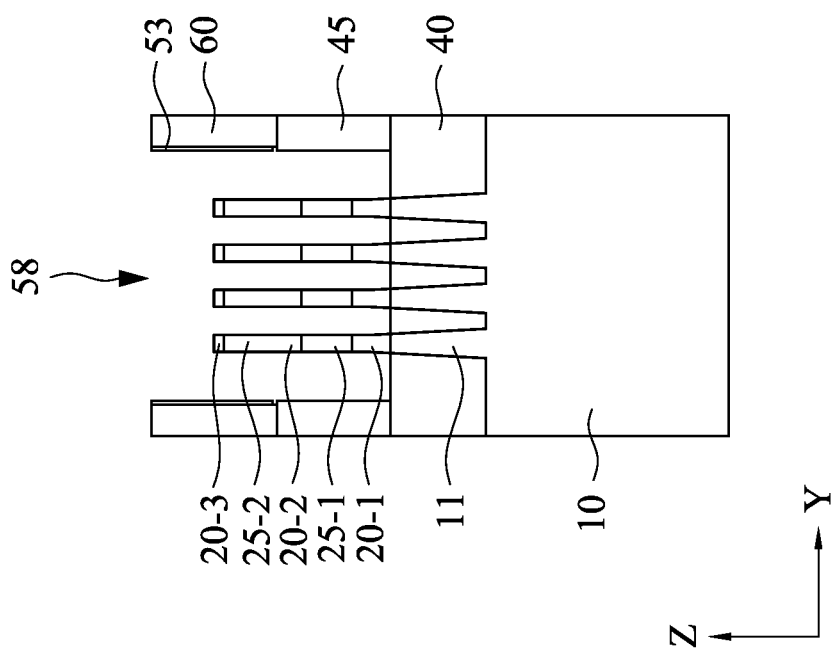
Figure 8A:
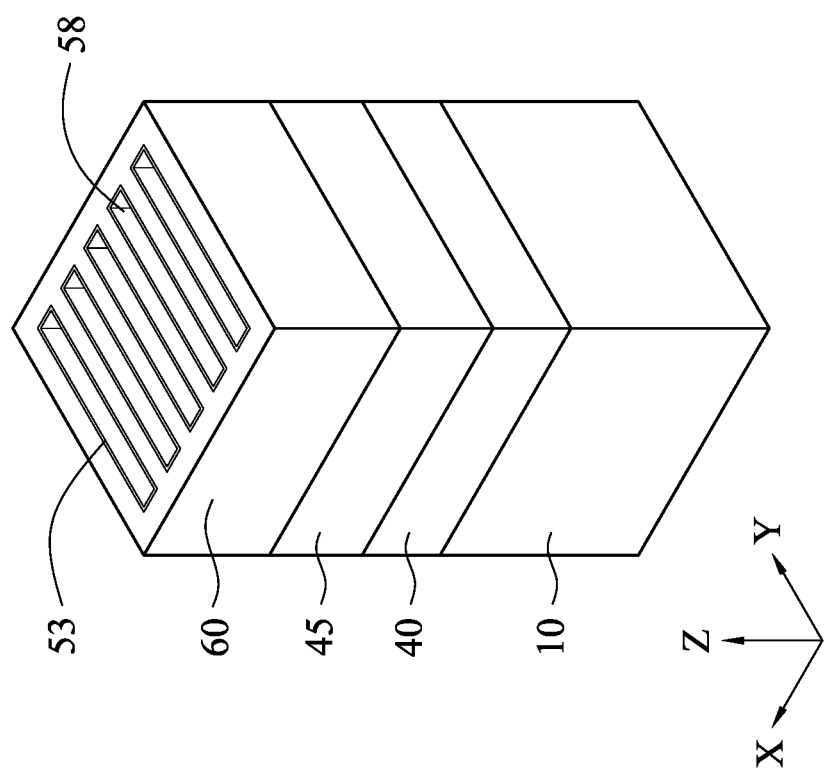
Figure 9B:
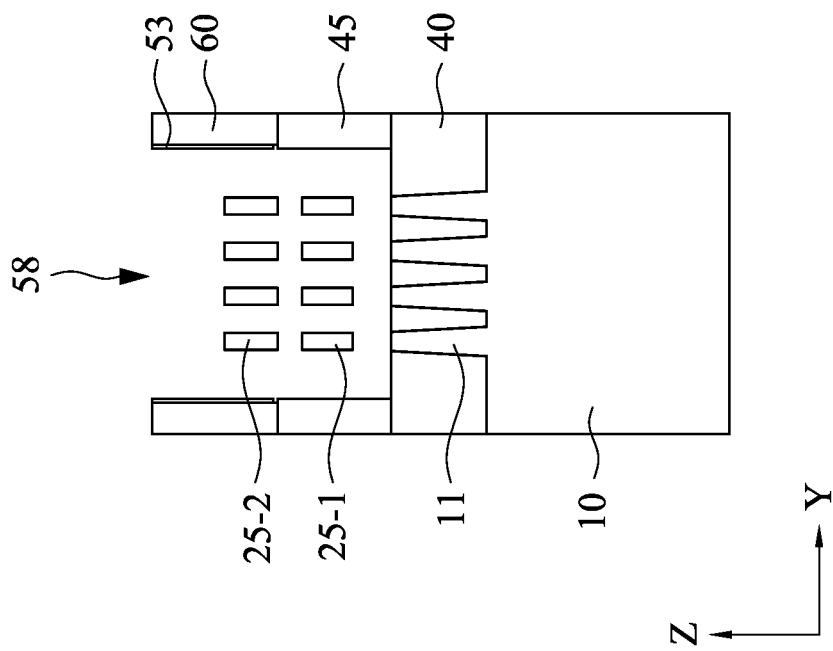
Figure 9A:
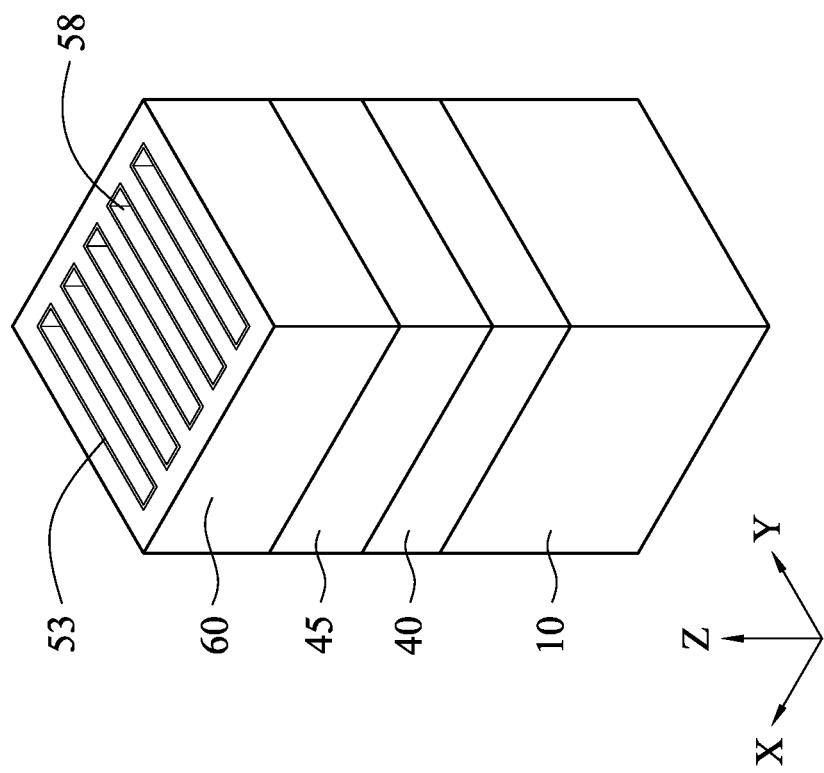
Figure 10B:
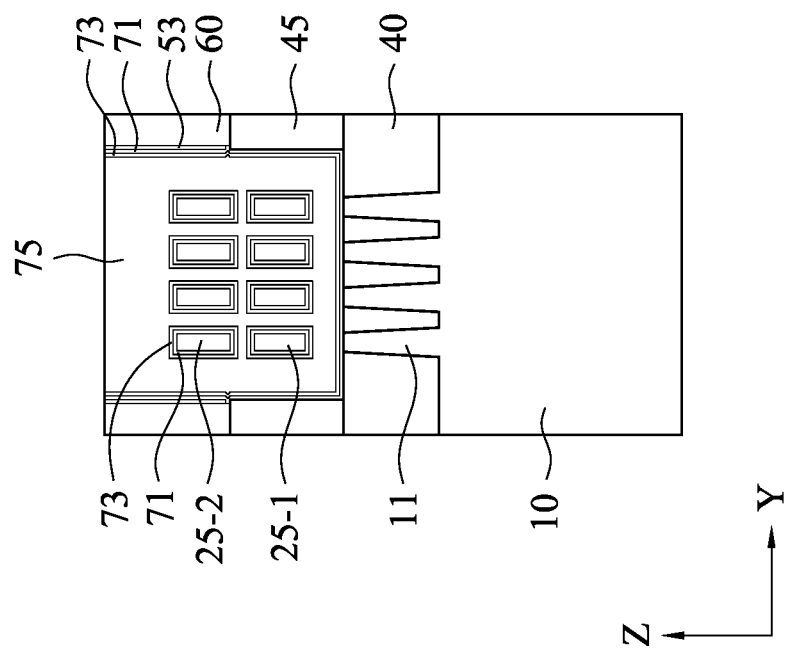
FIGS. 10A, 10B, 10C and 10D show one of the various stages of manufacturing a semiconductor FET device according to embodiments of the present disclosure.
Figure 10A:
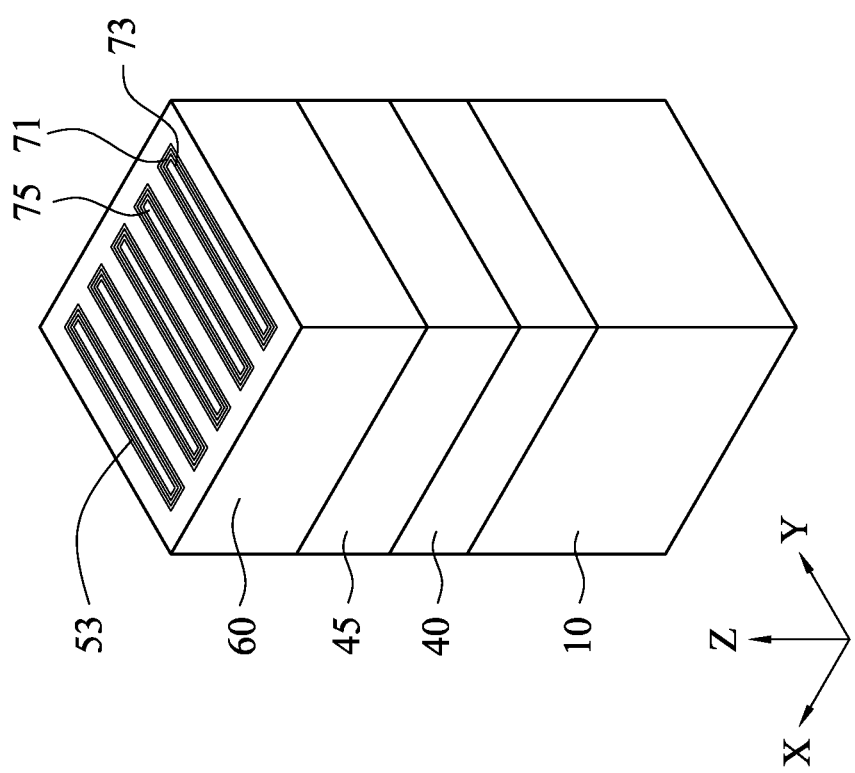
Figure 10D:
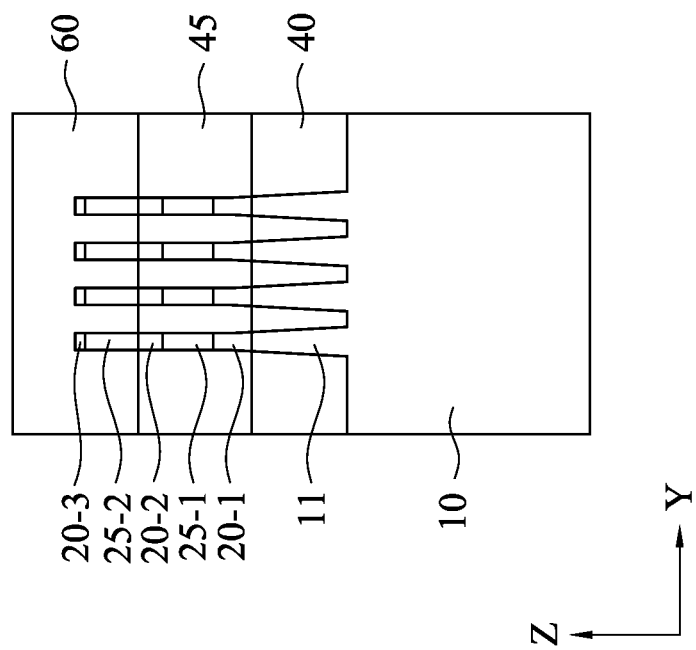
Figure 10C:
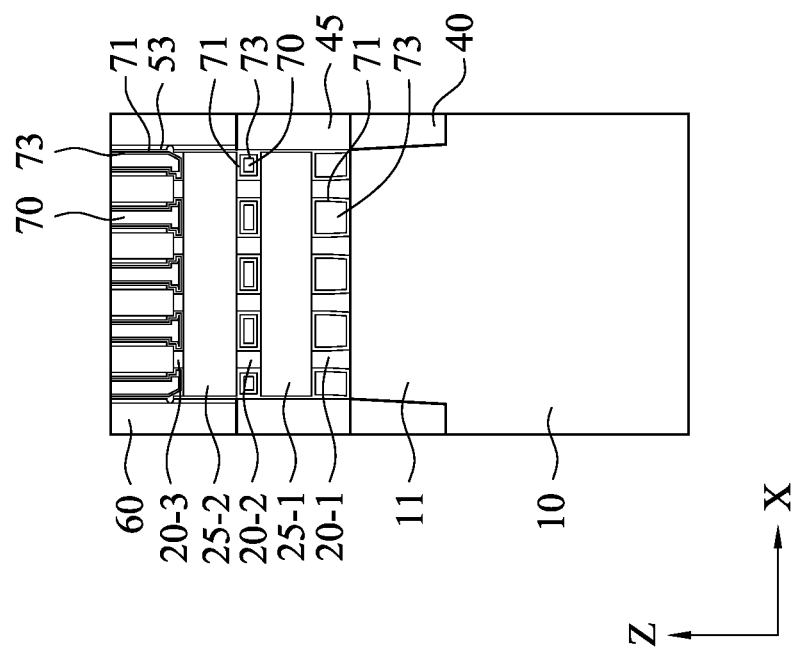

FIGS. 1A-23D show various stages of manufacturing operations for a semiconductor FET device according to an embodiment of the present disclosure. In FIGS. 1A-23D, the "A" figures (FIGS. 1A, 2A, . . . ) are perspective views, the "B" figures (FIGS. 1B, 2B, . . . ) are cross sectional views corresponding to the line Y1-Y1 of FIG. 1A (gate region), the "C" figures (FIGS. 1C, 2C, . . . ) are cross sectional views corresponding to the line X1-X1 of FIG. 1A and the "D" figures (FIGS. 1D, 2D, . . . ) are cross sectional views corresponding to the line Y2-Y2 of FIG. 1A (source/drain region). It is understood that additional operations can be provided before, during, and after processes shown by FIGS. 1A-23D, and some of the operations described below can be replaced or eliminated, for additional embodiments of the method. The order of the operations/processes may be interchangeable.

As shown in FIGS. 1A-1D, a stacked structure of first semiconductor layers and second semiconductor layer is formed over a substrate 10. In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The first semiconductor layers 20 (20-1, 20-2 and 20-3) and the second semiconductor layers 25 (25-1 and 25-2) are alternately formed by an epitaxial growth method over the substrate 10, as shown in FIGS. 1A-1D. In some embodiments, the first semiconductor layers 20 are made of $Si_xGe_{1-x}$, where $0.1<x<0.9$ (hereinafter may be referred as SiGe). The thickness of the first semiconductor layers 20 is in a range from about 5 nm to about 30 nm in some embodiments, and is in a range from about 10 nm to about 20 nm in other embodiments. In some embodiments, the thickness of the first semiconductor layer 20-1 is equal to or greater than the first semiconductor layer 20-2 and the thickness of the first semiconductor layer 20-3 is smaller than those of the first semiconductor layers 20-1 and 20-2. The first semiconductor layers 20 are sacrificial layers to be subsequently removed.

The second semiconductor layers 25 include a semiconductor material different from the first semiconductor layers 20. In some embodiments, the second semiconductor layers 25 are made of epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In some embodiments, the second semiconductor layer is made of $Si_yGe_{1-y}$, where $x<y$. In certain embodiments, the second semiconductor layer is made of Si. The thickness of the second semiconductor layers is in a range from about 10 nm to about 50 nm in some embodiments, and is in a range from about 15 nm to about 30 nm in other embodiments. In some embodiments, the thickness of the second semiconductor layer 25-1 is equal to or different from the thickness of the second semiconductor layer 25-2.

In the following embodiment, the lower second semiconductor layer 25-1 is for a p-type GAA FET and the upper second semiconductor layer 25-2 is for an n-type GAA FET.

Then, as shown in FIGS. 2A-2D, fin structures 30 are formed. The fin structures 30 are formed by one or more photolithography and etching operations. The fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures 30 can be patterned by using a hard mask pattern 15 as an etching mask. In some embodiments, the hard mask pattern 15 includes a first mask layer 15A and a second mask layer 15B disposed on the first mask layer 15A. In some embodiments, the first mask layer 15A is a pad oxide layer made of a silicon oxide, which can be formed by a thermal oxidation, and the second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 15 by using patterning operations including photo-lithography and etching. Then, the second semiconductor layers 25, the first semiconductor layers 20 and the substrate 10 are patterned by using the hard mask pattern 15 as an etching mask into fin structures 30, extending in the X direction. In FIGS. 2A-2D, four fin structures 30 are arranged in the Y direction. But the number of the fin structures is not limited to, and may one, two three or five or more. In some embodiments, one or more dummy fin structures are formed on both sides of the fin structures 30 to improve pattern fidelity in the patterning operations.

The width of the upper portion of the fin structure 30 along the Y direction is in a range from about 5 nm to about 40 nm in some embodiments, and is in a range from about 10 nm to about 20 nm in other embodiments.

After the fin structures 30 are formed, a first isolation insulating layer 40, such as shallow trench isolations (STI), is formed over the substrate 10, as shown in FIGS. 3A-3D. One or more insulating material layers are formed such that the fin structures 30 are fully embedded in the insulating material layers, and then etch-back operation is performed to reduce the thickness of the insulating material layers, thereby the first isolation insulating layer 40 is formed. The insulating material for the first isolation insulating layer 40 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first isolation insulating layer 40 is made of silicon oxide. An anneal operation may be performed after the formation of the first isolation insulating layer 40. In some embodiments, one or more fin liner layers (not shown) are formed over the fin structures before forming the first isolation insulating layer 40. The fin liner layer may be made of SiN or a silicon nitride-based material (e.g., SiON or SiCN).

After the first isolation insulating layer 40 is formed, the first and second semiconductor layers in the fin structures 30 are exposed from the first isolation insulating layer 40, and the bottom part 11 of the fin structures 30, which is a part of the substrate 10, is embedded in the first isolation insulating layer 40, as shown in FIGS. 3A-3D, in some embodiments. In other embodiments, a part of the bottom part 11 is exposed from the first isolation insulating layer 40, or a part of the first semiconductor layer 20-1 is embedded in the first isolation insulating layer 40.

Then, as shown in FIGS. 4A-4D, a second isolation insulating layer 45 is formed over the first isolation insulating layer 40. One or more layers for the second isolation insulating layer 45 is formed over the first isolation insulating layer 40 so that the fin structures 30 are fully embedded, and then a planarization operation including a chemical mechanical polishing (CMP) and an etch-back operation is performed to reduce the thickness of the second isolation insulating layer. In some embodiments, during the planarization operation, the hard mask pattern 15 is removed. In other embodiments, the hard mask layer 15 is removed during the formation of the first isolation insulating layer 30.

The insulating material for the second isolation insulating layer 45 is different from that of the first isolation insulating layer 40, and may include silicon oxide, silicon nitride, silicon oxynitride (SiON), SiCON, SiCO, SiCN, fluorine-doped silicate glass (FSG), or a low-k dielectric material, formed by LPCVD (low pressure chemical vapor deposition), plasma-CVD, atomic layer deposition (ALD) or flowable CVD, or any other suitable film formation methods. In some embodiments, the second isolation insulating layer 45 includes SiCO or SiCON. An anneal operation may be performed after the formation of the second isolation insulating layer 45. After the etch-back operation, the second semiconductor layer 25-2 and the first semiconductor layer 20-3 are exposed from the second isolation insulating layer 45. In some embodiments, a part of the first semiconductor layer 25-2 is exposed from the second isolation insulating layer, and in other embodiments, the first semiconductor layer 25-2 is embedded in the second isolation insulating layer 45.

FIGS. 5A-5D show the structures after one or more dummy gate structures are formed. Each of the dummy gate structures includes a dummy gate dielectric layer 52, a dummy gate electrode 54 and a hard mask layer 56. A blanket layer of the dummy gate dielectric layer 52 is formed over the exposed fin structures. The dummy gate dielectric layer 52 includes one or more layers of silicon oxide, silicon nitride and/or silicon oxynitride. The thickness of the dummy gate dielectric layer 52 is in a range from about 1 nm to about 5 nm in some embodiments. A dummy gate electrode layer is then deposited on the dummy gate dielectric layer 52, such that the fin structures are fully embedded in the dummy gate electrode layer. The dummy gate electrode layer includes silicon such as poly crystalline silicon or amorphous silicon. The thickness of the dummy gate electrode layer is in a range from about 100 nm to about 200 nm in some embodiments. In some embodiments, the dummy gate electrode layer is subjected to a planarization operation. The dummy gate dielectric layer 52 and the dummy gate electrode layer are deposited using CVD, including LPCVD and PECVD, PVD, ALD, or other suitable process. Subsequently, a mask layer is formed over the dummy gate electrode layer. The mask layer includes a pad SiN layer and a silicon oxide mask layer in some embodiments. Next, a patterning operation is performed on the mask layer, thereby forming the hard mask pattern 56, and the dummy gate electrode layer is patterned into the dummy gate electrodes 54, as shown in FIGS. 5A-5D. The dummy gate structures are formed over a portion of the fin structures, which is to be a channel region. The dummy gate structures define the channel region of the GAA FET. In this disclosure, a source and a drain are interchangeably used and the structures thereof are substantially the same.

In one embodiment shown in FIGS. 5A-5D, four dummy gate structures are formed over the fin structures. The number of the dummy gate structures is not limited to four. The width of the dummy gate electrode 54 is in a range from about 5 nm to about 25 nm in some embodiments.

Further, as shown in FIGS. 6A-6D, side wall spacers 53 are formed on side faces of the dummy gate electrodes 54.

After a blanket layer of an insulating material is formed over the dummy gate structures, anisotropic etching is performed on the blanket layer using, for example, reactive ion etching (RIE). During the anisotropic etching process, most of the insulating material is removed from horizontal surfaces, leaving the dielectric spacer layer on the vertical surfaces such as the sidewalls of the dummy gate structures and the sidewalls of the exposed fin structures. The mask layer may be removed during the etching. In one embodiment, the sidewall spacers 53 is a silicon nitride-based material, such as SiN, SiON, SiCON or SiCN and combinations thereof, or any other suitable insulating material.

Subsequently, a first interlayer dielectric (ILD) layer 60 is formed, and the dummy gate electrodes 54 are removed, as shown in FIGS. 7A-7D. The materials for the first ILD layer 60 include compounds comprising Si, O, C and/or H, such as silicon oxide, SiCOH and SiCO. Organic materials, such as polymers, may be used for the first ILD layer 60. After the first ILD layer 60 is formed, a planarization operation, such as CMP, is performed, so that the top portions of the dummy gate electrodes are exposed. Then, the dummy gate electrodes 54 are removed, thereby forming gate spaces 58. The dummy gate structures 54 can be removed using plasma dry etching and/or wet etching. When the dummy gate electrodes 54 are polysilicon and the ILD layer 60 is silicon oxide, a wet etchant such as a TMAH solution can be used to selectively remove the dummy gate electrodes 54. The dummy gate dielectric layer 52 is not removed at this stage in some embodiments. In other embodiments, the dummy gate dielectric layer 52 is removed subsequent to the removal of the dummy gate electrodes 54.

In some embodiments, an ion implantation operation is performed to introduce dopants (impurities) into the second semiconductor layer 25-2 exposed in the gate openings 58.

Subsequently, as shown in FIGS. 8A-8D, the second isolation insulating layer 45 is etched within the gate spaces 58, thereby exposing the fin structures including the first semiconductor layer 20-1, 20-2 and 20-3 and the second semiconductor layers 25-1 and 25-2. Since the second isolation insulating layer 54 is made of a different material than the first ILD layer 60 and the first isolation insulating layer 40, the second isolation insulating layer 45 can be electively etched without a resist pattern. By using anisotropic etching, the second isolation insulating layer 45 is substantially vertically etched.

After the fin structures are exposed in the gate spaces 58, the first semiconductor layers 20 are removed, thereby forming semiconductor wire structures (second semiconductor layers 25-1, 25-2), as shown in FIGS. 9A-9D.

When the first semiconductor layers 20 are Ge or SiGe and the second semiconductor layers 25 are Si, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), potassium hydroxide (KOH) solutions, a hydrochloric acid (HCl) solution, or a hot ammonia solution. As shown in FIGS. 9C and 9D, the first semiconductor layers 20-1, 20-2 and 20-3 remain in the source/drain regions.

Then, as shown in FIGS. 10A-10D, a metal gate structure is formed. After the semiconductor wires of the second semiconductor layers 25 are formed, a gate dielectric layer 71 is formed around each channel layers (wires of the second semiconductor layers 25-1, 25-2), and a gate electrode layer 75 is formed on the gate dielectric layer 71.

In certain embodiments, the gate dielectric layer 71 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 71 includes an interfacial layer (not shown) formed between the channel layers and the dielectric material.

The gate dielectric layer 71 may be formed by CVD, ALD or any suitable method. In one embodiment, the gate dielectric layer 71 is formed using a highly conformal deposition process such as ALD in order to ensure the formation of a gate dielectric layer having a uniform thickness around each channel layers. The thickness of the gate dielectric layer 71 is in a range from about 1 nm to about 6 nm in one embodiment.

The gate electrode layer 75 is formed on the gate dielectric layer 71 to surround each channel layer. The gate electrode layer 75 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 75 may be formed by CVD, ALD, electro-plating, or other suitable method. The gate electrode layer 75 is also deposited over the upper surface of the first ILD layer 60, and the gate dielectric layer 71 and the gate electrode layer 75 formed over the first ILD layer 60 are then planarized by using, for example, CMP, until the top surface of the first ILD layer 60 is revealed.

In certain embodiments of the present disclosure, one or more work function adjustment layers 73 are interposed between the gate dielectric layer 71 and the gate electrode 75. The work function adjustment layer 73 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer 73, and for the p-channel FET, one or more of TiAlC, Al, TiAl, TaN, TaAlC, TiN, TiC and Co is used as the work function adjustment layer 73. The work function adjustment layer 73 may be formed by ALD, PVD, CVD, e-beam evaporation, or other suitable process.

In certain embodiments, the work function adjustment layer 73 includes TiN.

After the metal gate structures are formed, a second ILD layer 62 is formed by CVD or other suitable methods over the first ILD layer 60 as shown in FIGS. 11A-11D. The material of the second ILD layer 62 can be the same as or different from the first ILD layer 60.

Figure 11B:
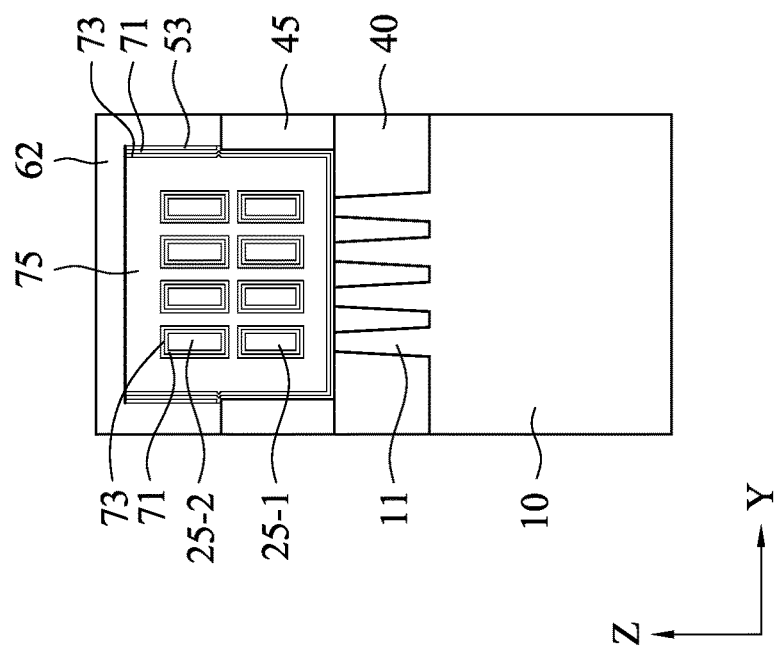
FIGS. 11A, 11B, 11C and 11D show one of the various stages of manufacturing a semiconductor FET device according to embodiments of the present disclosure.
Figure 11A:
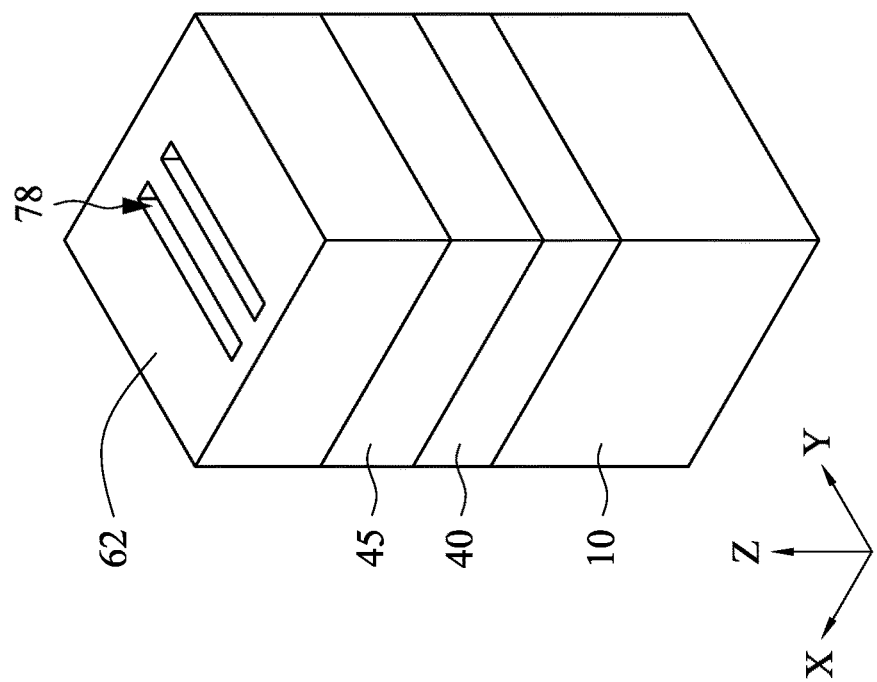
Figure 11D:
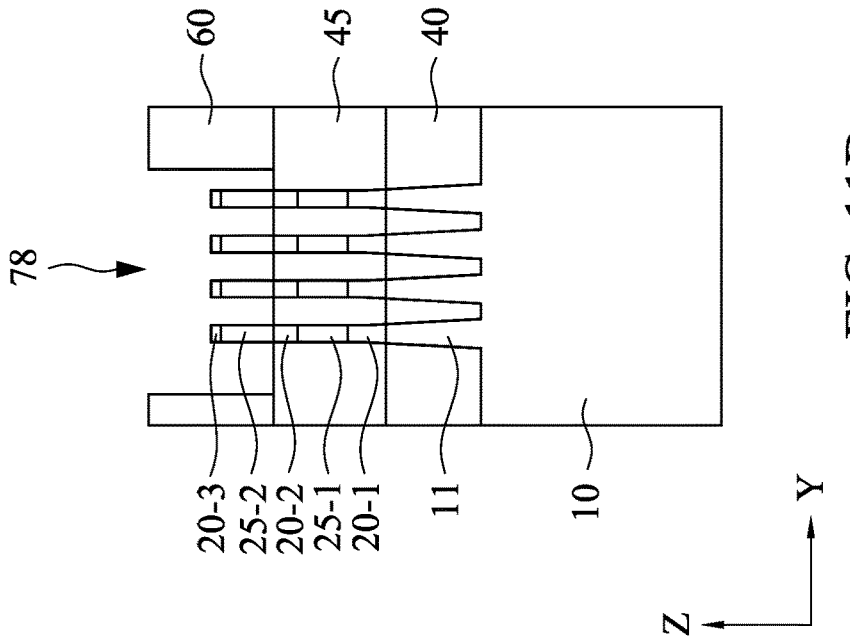
Figure 11C:
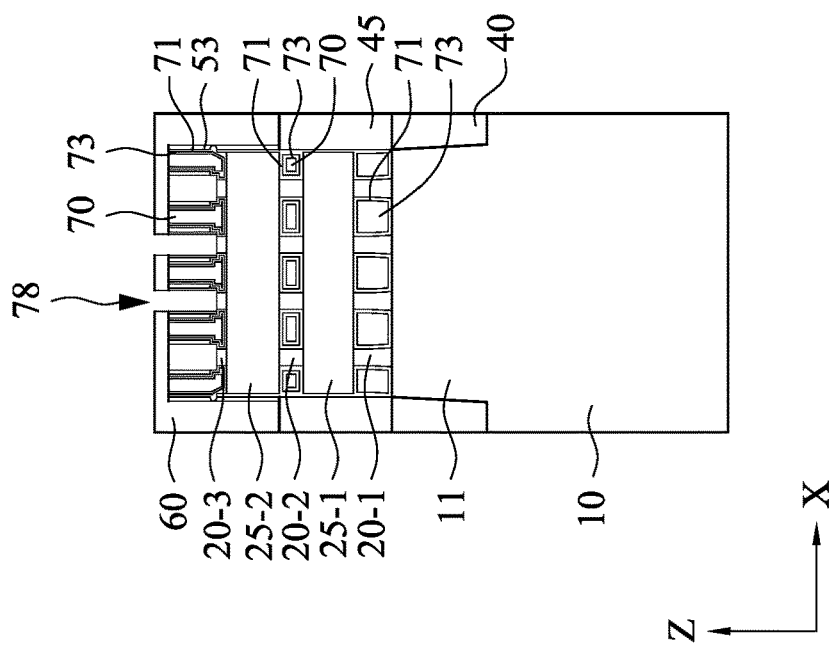
Figure 12C:
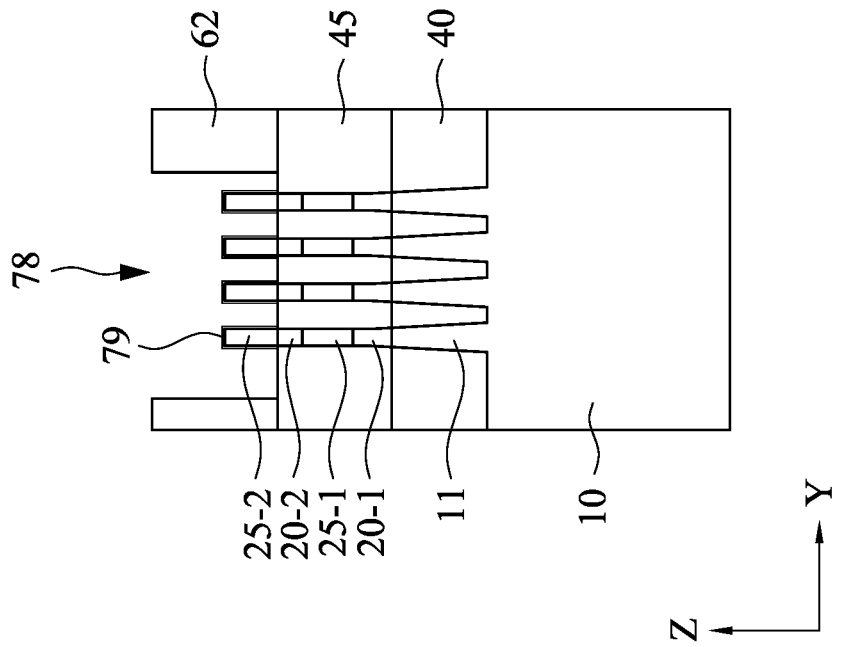
Figure 12D:
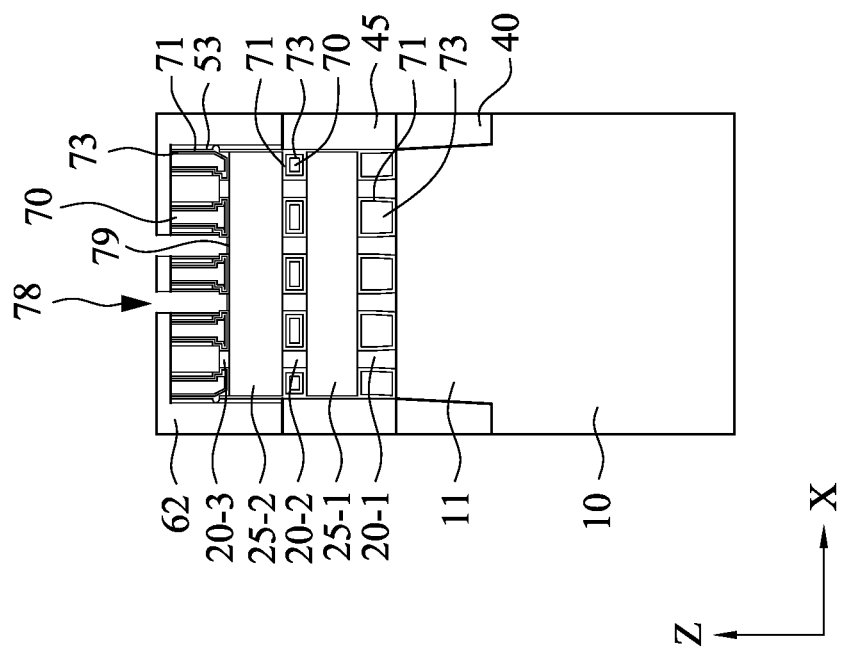
Figure 13B:
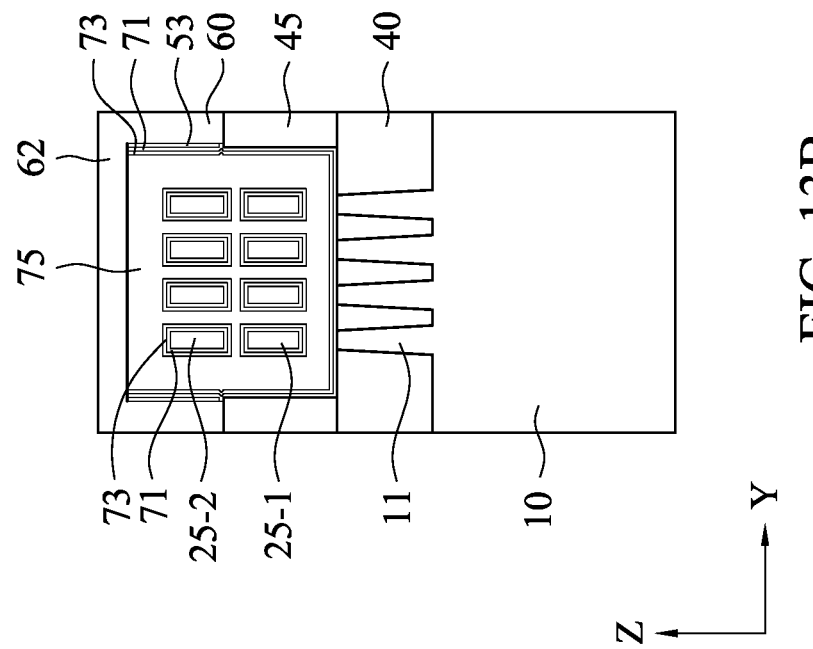
Figure 13A:
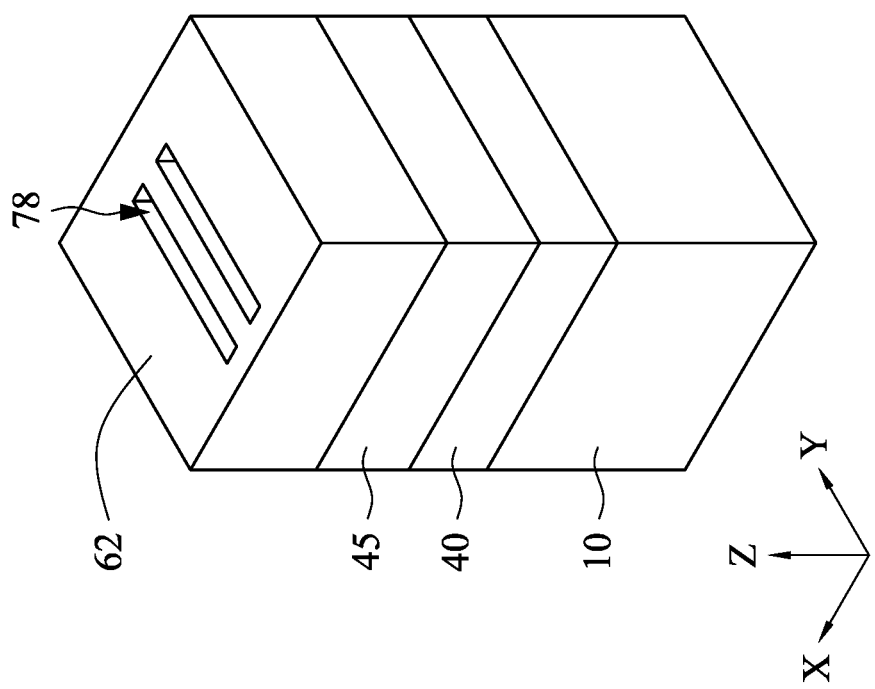
Figure 14B:
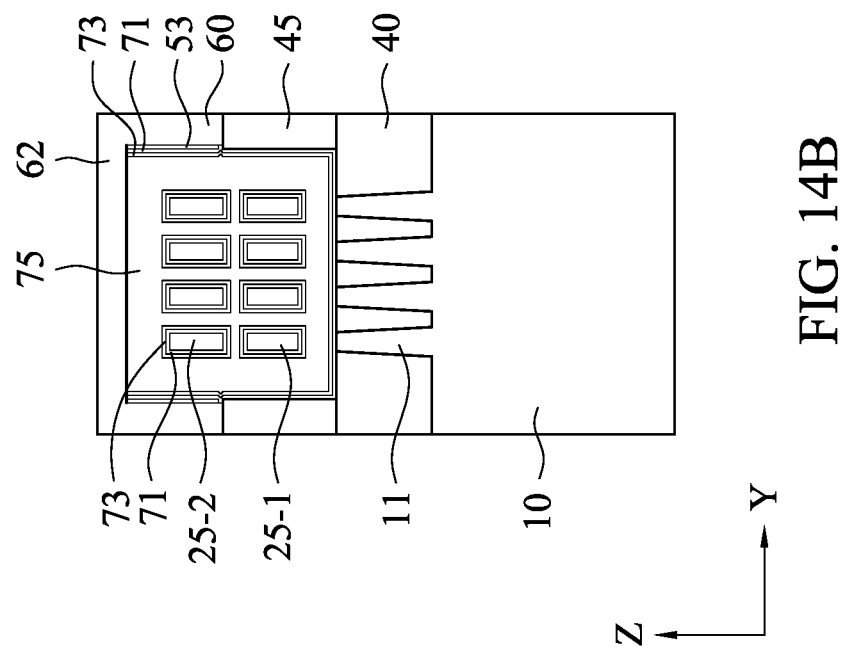
FIGS. 14A, 14B, 14C and 14D show one of the various stages of manufacturing a semiconductor FET device according to embodiments of the present disclosure.
Figure 14A:
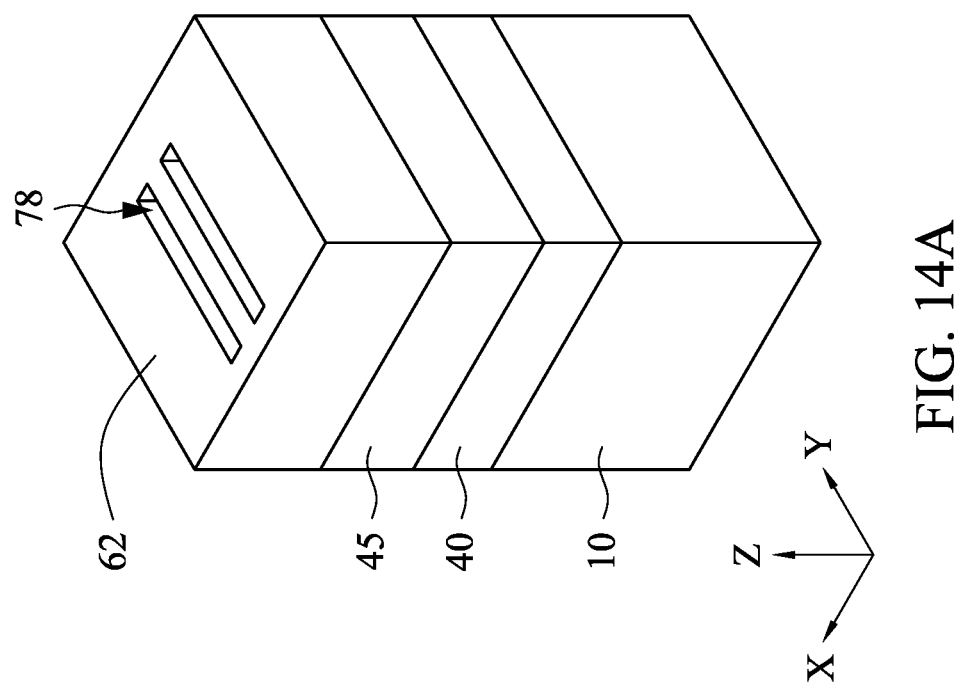
Figure 14D:
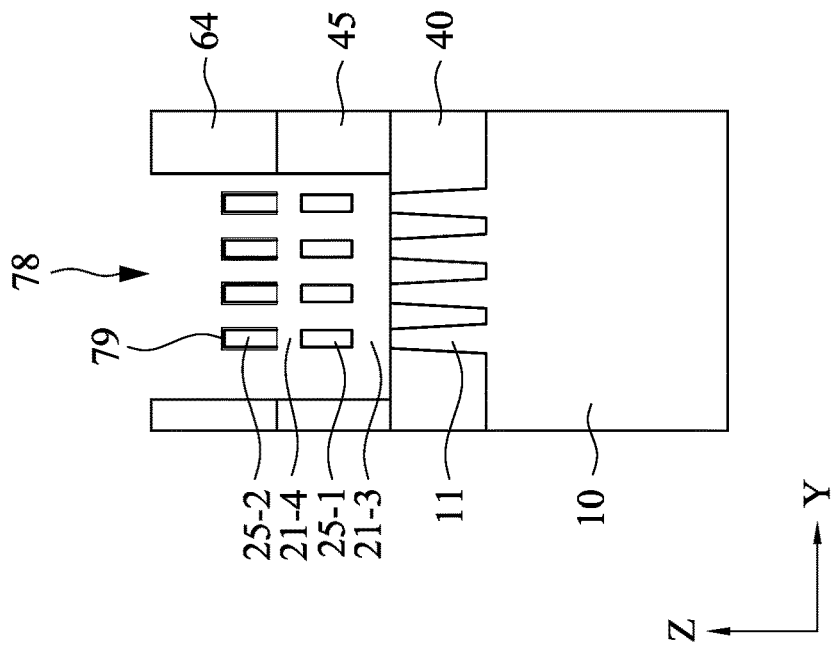
Figure 14C:
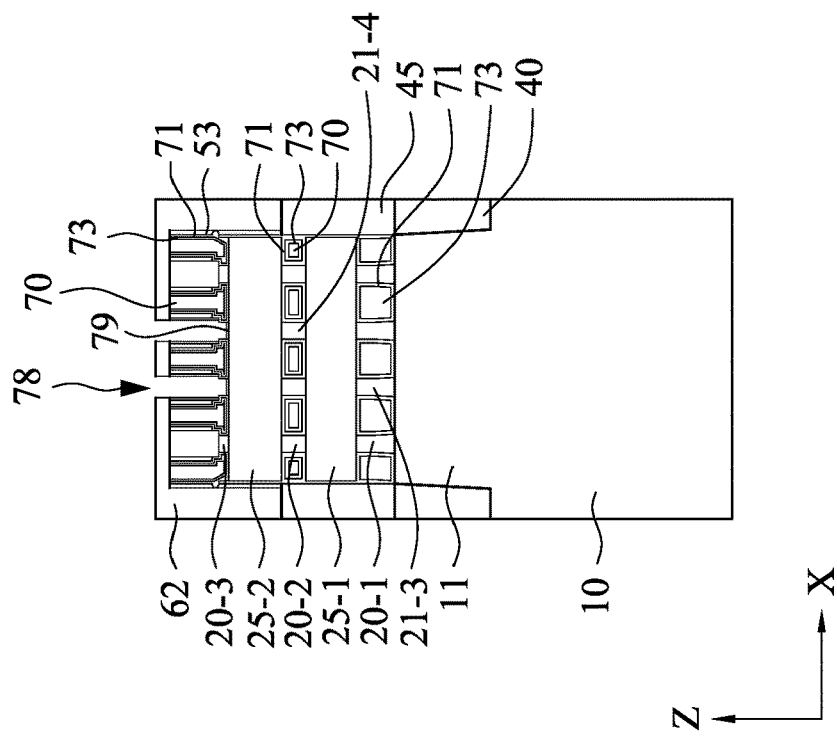
Figure 15D:
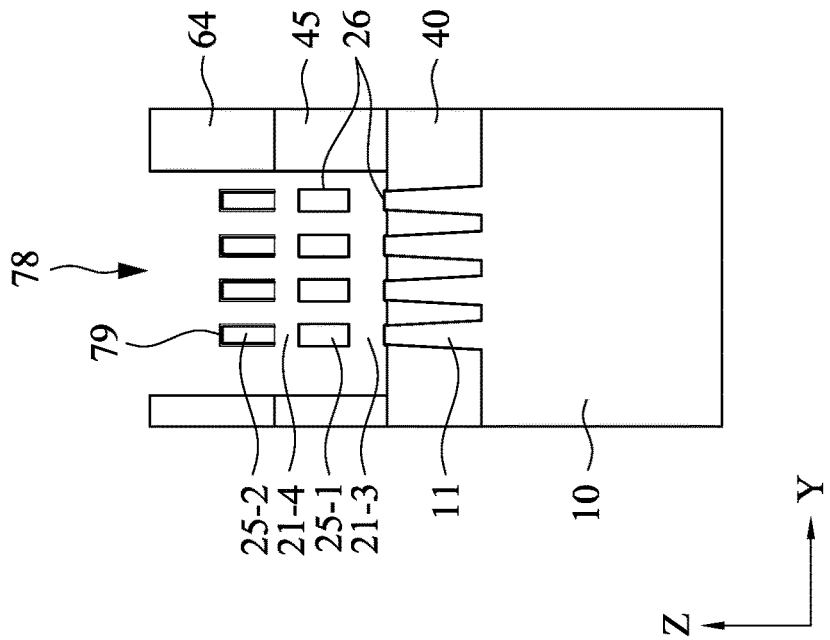
Figure 15C:
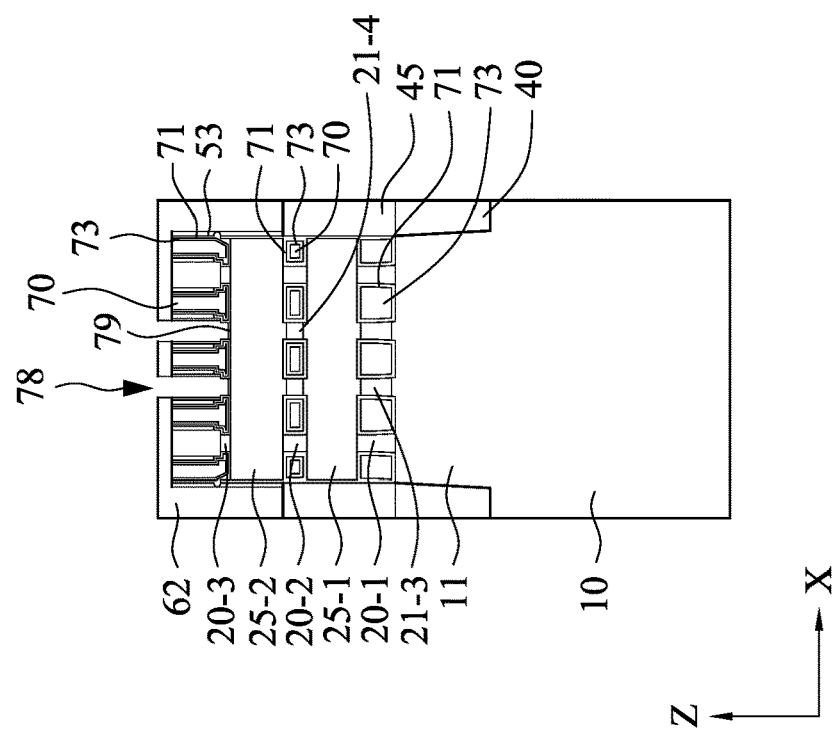

Then, first source/drain openings 78 are formed as shown in FIGS. 11A-11D. By using one or more lithography and etching operations, the first and second ILD layers 60 and 62 are etched to expose the first semiconductor layer 20-3, the second semiconductor layer 25-2 and a part of the first semiconductor layer 20-2, as shown in FIG. 11D. Since the first and second ILD layers 60 and 62 are made of a different material than the second isolation insulating layer 45, the etching substantially stops on the surface of the second isolation insulating layer 45. As shown in FIG. 11D, the first source/drain opening 78 is offset to the left in the Y direction with respect to the fin structures.

Subsequently, as shown in FIGS. 12A-12D, a protection layer 79 that protects at least the second semiconductor layer 25-2 is formed. In some embodiments, the protection layer 79 is thermally or chemically formed silicon oxide and/or silicon-germanium oxides. In some embodiments, the first semiconductor layer 20-3 is fully consumed to form the protection layer 79. In other embodiments, a silicon oxide or silicon nitride is selectively formed over the exposed fin structures by using selective CVD and/or ALD, as the protection layer 79.

Then, as shown in FIGS. 13A-13D, the second isolation insulating layer 45 is selectively etched in the first source/drain openings 78, thereby exposing the fin structures including the first semiconductor layer 20-1 and 20-2 and the second semiconductor layers 25-1 and 25-2. Since the second isolation insulating layer 45 is made of a different material than the first and second ILD layers 60 and 62 and the first isolation insulating layer 40, the second isolation insulating layer 45 can be selectively etching without a resist pattern, and the etching stops on the surface of the first isolation insulating layer 40. Further, since the second semiconductor layer 25-2 is protected by the protection layer 79, etching damage to the second semiconductor layer 25-2 can be avoided. By using anisotropic etching, the second isolation insulating layer 45 is substantially vertically etched. In certain embodiments, the protection layer 79 is not formed.

Next, as shown in FIGS. 14A-14D, the first semiconductor layers 20-1 and 20-2 are removed, thereby forming source/drain regions of the semiconductor wire structures (second semiconductor layers 25-1, 25-2), separated by spaces 21-3 and 21-4.

When the first semiconductor layers 20-1 and 20-2 are Ge or SiGe and the second semiconductor layers 25-1 and 25-2 are Si, the first semiconductor layers 20-1 and 20-2 can be selectively removed using a wet etchant such as, but not limited to, ammonium hydroxide ($NH_4OH$), tetramethylammonium hydroxide (TMAH), ethylenediamine pyrocatechol (EDP), potassium hydroxide (KOH) solutions, a hydrochloric acid (HCl) solution, or a hot ammonia solution.

In some embodiments, an epitaxial layer 26 is formed over the second semiconductor layer 25-1, as shown in FIGS. 15A-15D. The epitaxial layer 26 includes SiGe doped with B for a p-type GAA FET. The epitaxial layer is also formed on the upper surface of the bottom portions 11 of the fin structures.

Figure 16B:
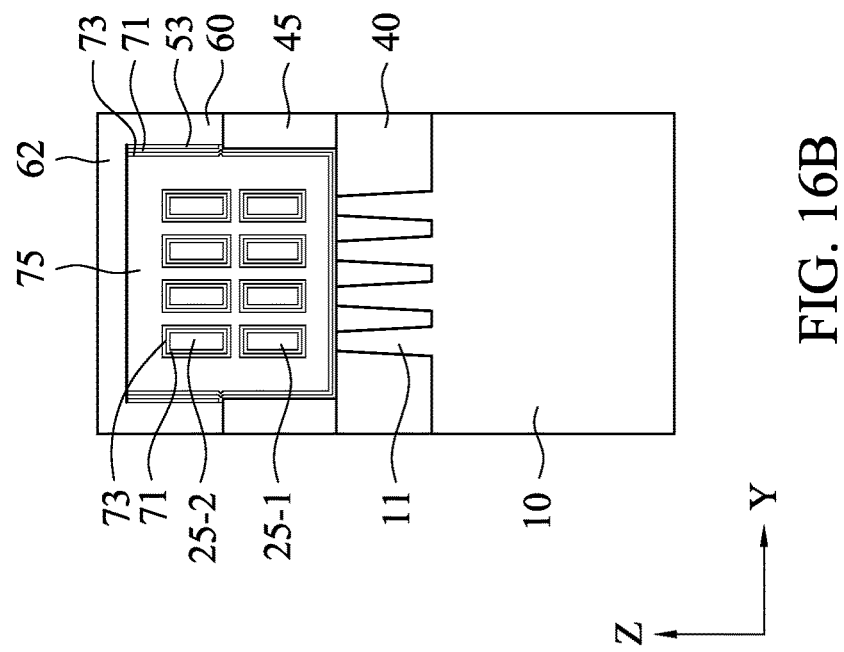
FIGS. 16A, 16B, 16C and 16D show one of the various stages of manufacturing a semiconductor FET device according to embodiments of the present disclosure.
Figure 16A:
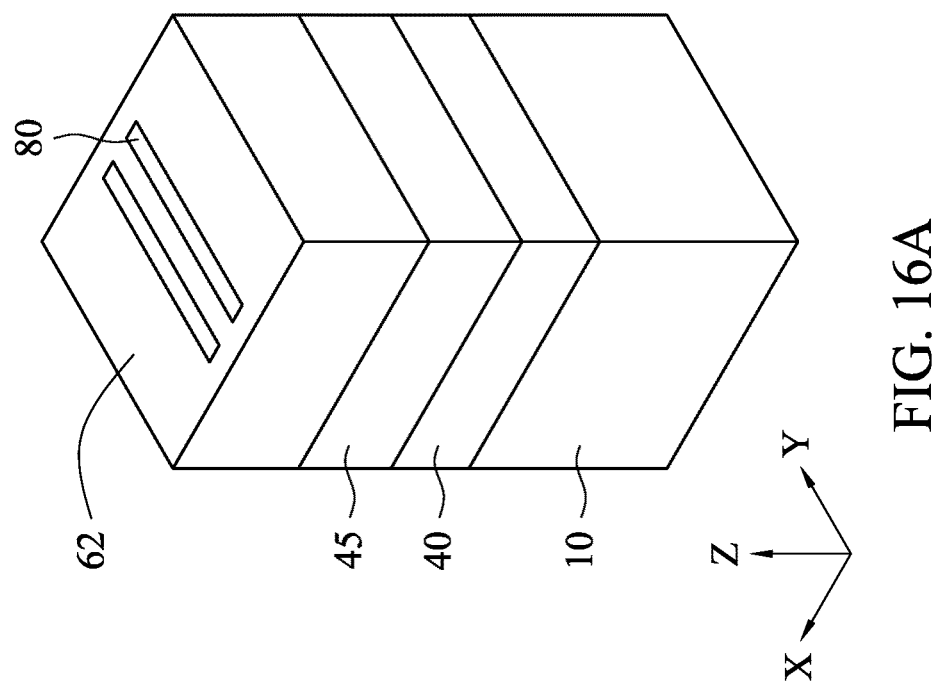
Figure 16D:
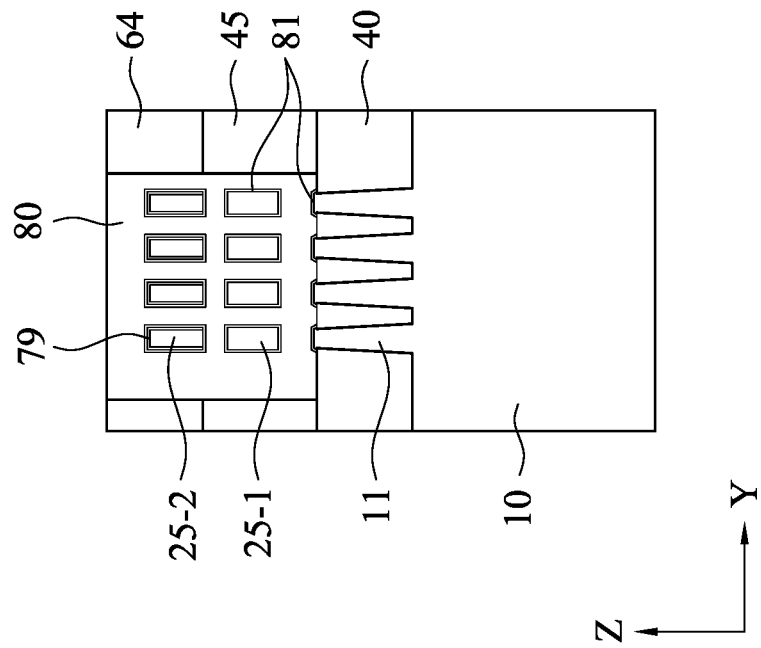
Figure 16C:
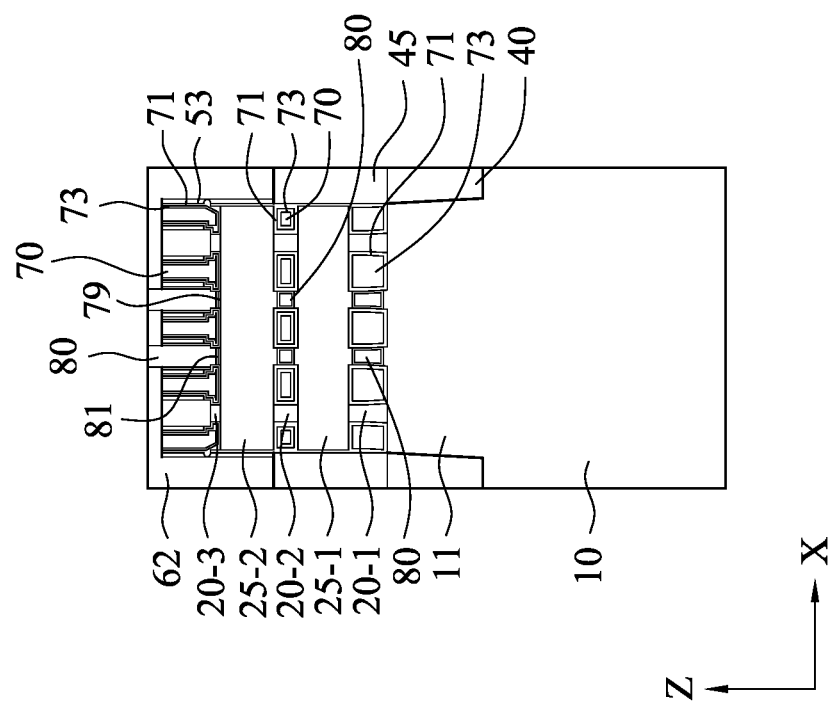

Next, as shown in FIGS. 16A-16D, a first conductive layer 80 is formed in the first source/drain opening 78. The conductive material is formed in and over the first source/drain openings 78 and then a planarization operation, such as a CMP operation, is performed to form the conductive layer 80, as shown in FIG. 16D. The conductive material includes one or more layers of Co, Ni, W, Ti, Ta, Cu, Al, TiN and TaN, or any other suitable material. In some embodiments, a silicide layer 81 is formed over the epitaxial layers 26 before forming the conductive material. The silicide layer 81 includes one or more of WSi, CoSi, NiSi, TiSi, MoSi and TaSi. When the epitaxial layer includes Ge, an alloy of Ge and metal (e.g., TiGe, NiGe, or CoGe) is formed, and when the epitaxial layer includes Si and Ge, an alloy of Si, Ge and metal (e.g., NiSiGe or TiSiGe) is formed. When the epitaxial layer includes a Group III-V semiconductor, an alloy such as Ni—InAlAs is formed.

Then, the conductive layer 80 is recessed to expose the second semiconductor layer 25-2 with the protection layer 79, as shown in FIGS. 17A-17D. By the recessing operation, a source/drain contact 80P for a p-type GAA FET is formed.

Figure 17B:
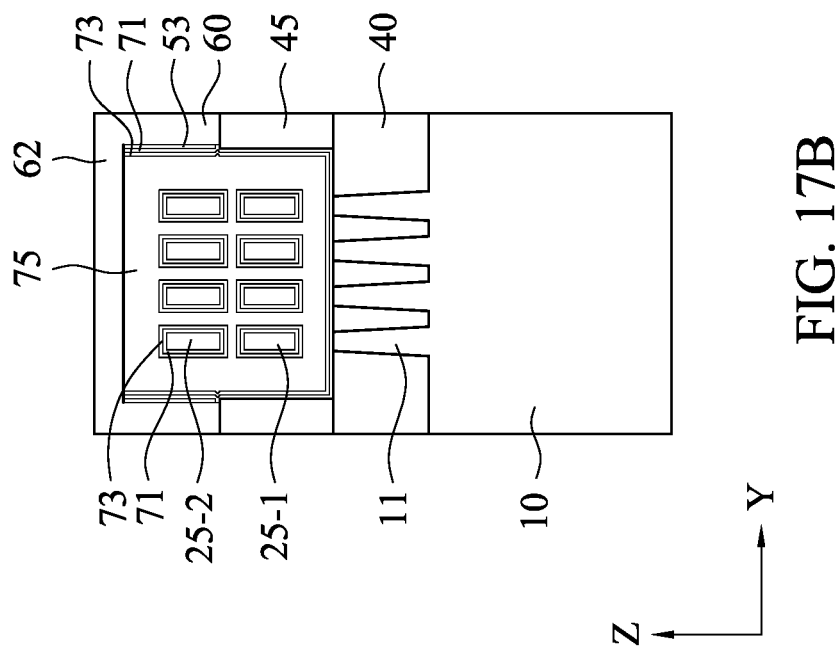
FIGS. 17A, 17B, 17C and 17D show one of the various stages of manufacturing a semiconductor FET device according to embodiments of the present disclosure.
Figure 17A:
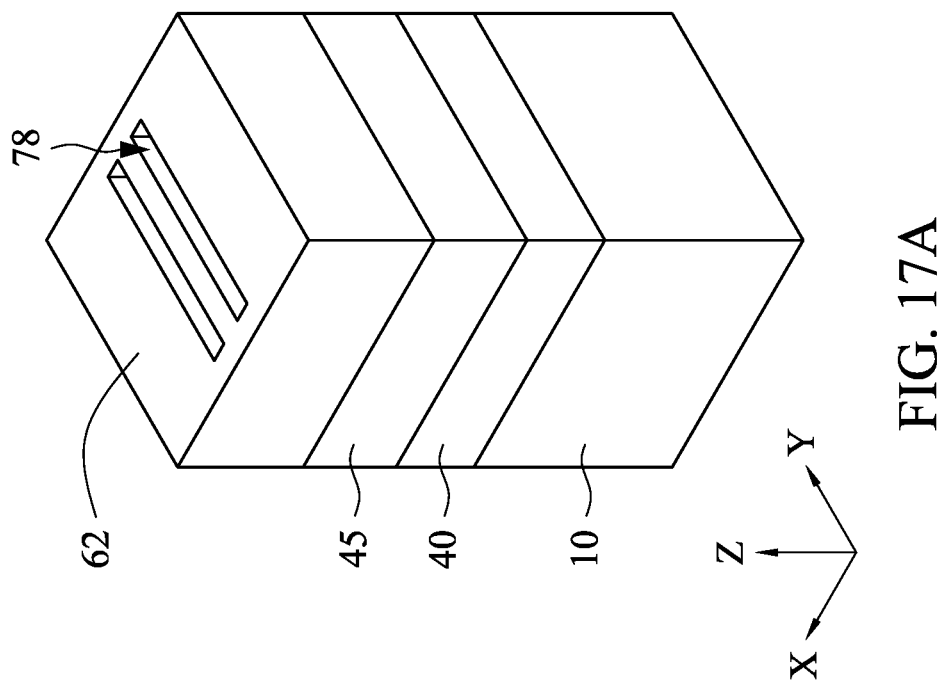
Figure 17D:
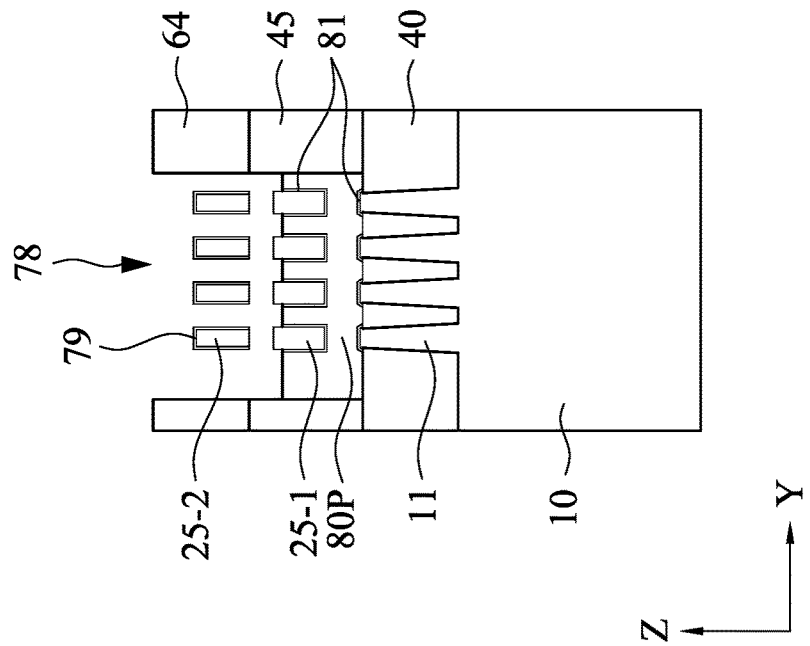
Figure 17C:
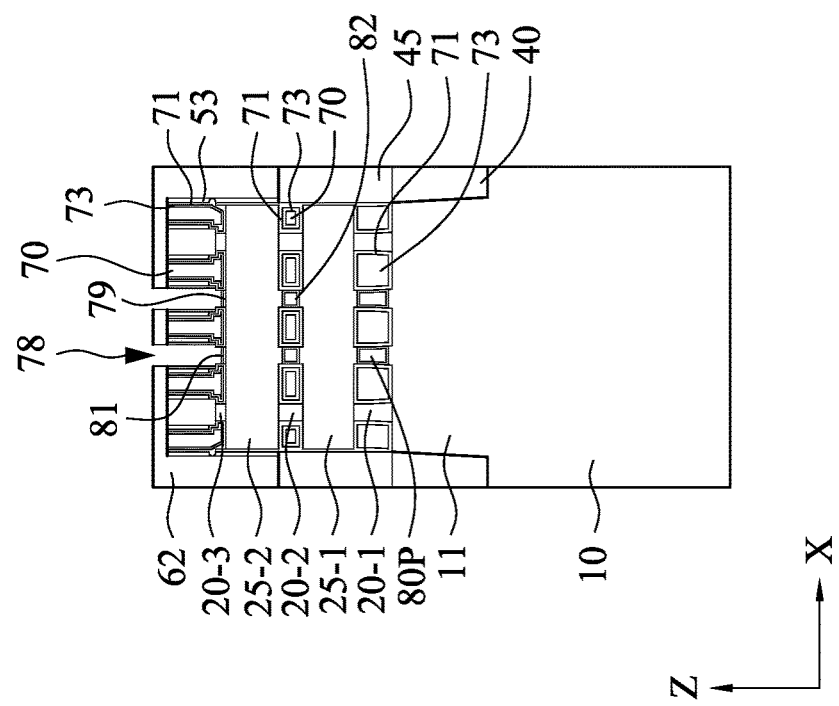

In some embodiments, upper portions of the second semiconductor layers 25-1 are protrude from the source/drain contact 80P as shown in FIG. 17D. In other embodiments, the second semiconductor layer 25-1 is filly wrapped by the source/drain contact layer 80P.

Figure 18B:
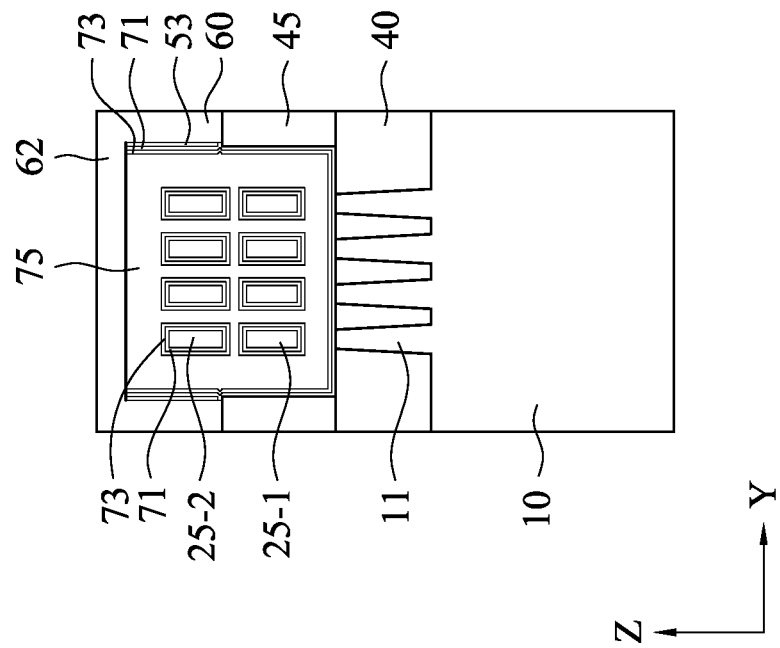
FIGS. 18A, 18B, 18C and 18D show one of the various stages of manufacturing a semiconductor FET device according to embodiments of the present disclosure.
Figure 18A:
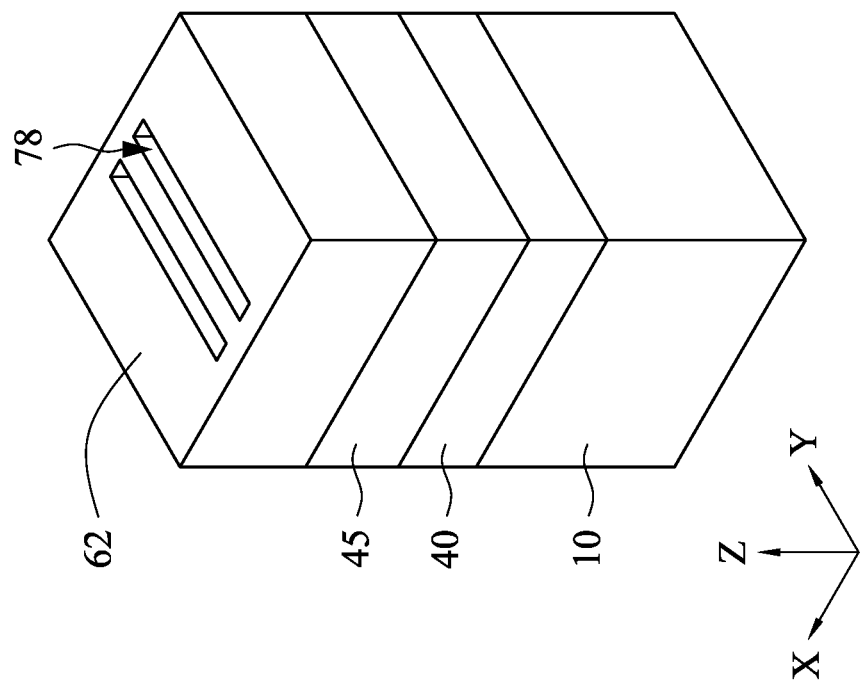
Figure 18D:
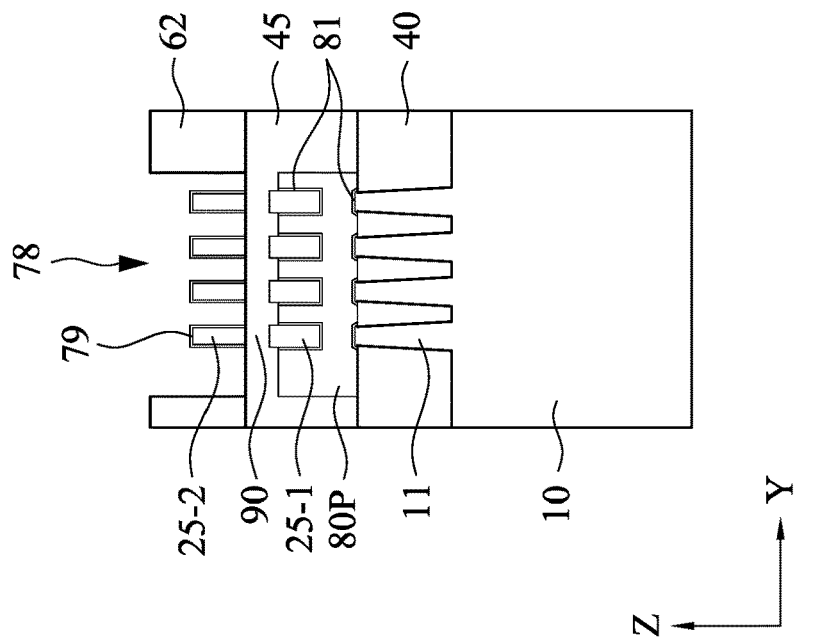
Figure 18C:
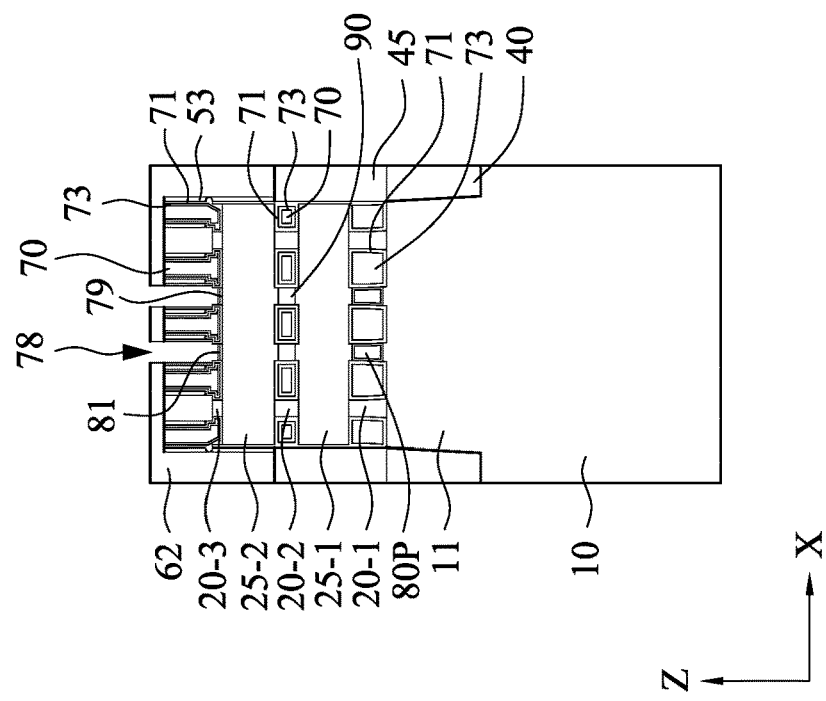
Figure 19B:
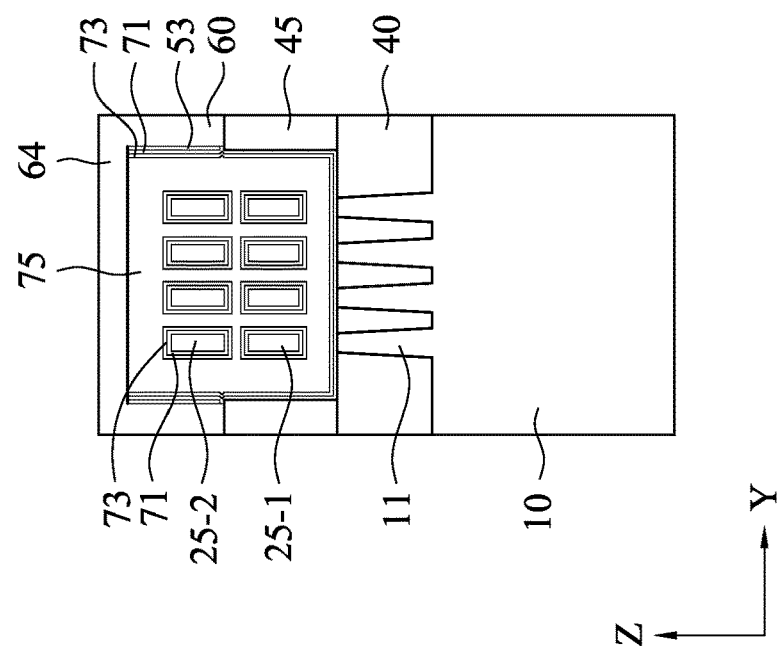
FIGS. 19A, 19B, 19C and 19D show one of the various stages of manufacturing a semiconductor FET device according to embodiments of the present disclosure.
Figure 19A:
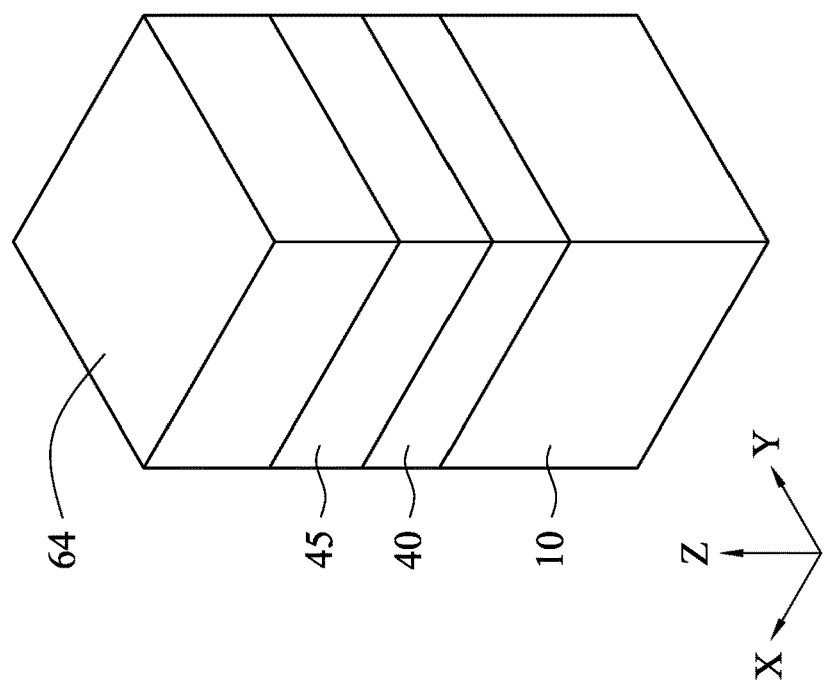
Figure 19D:
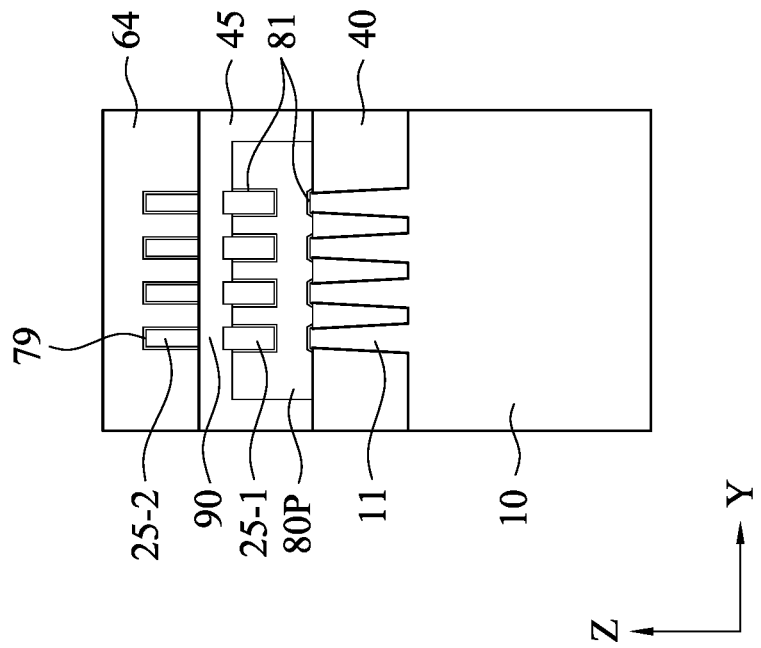
Figure 19C:
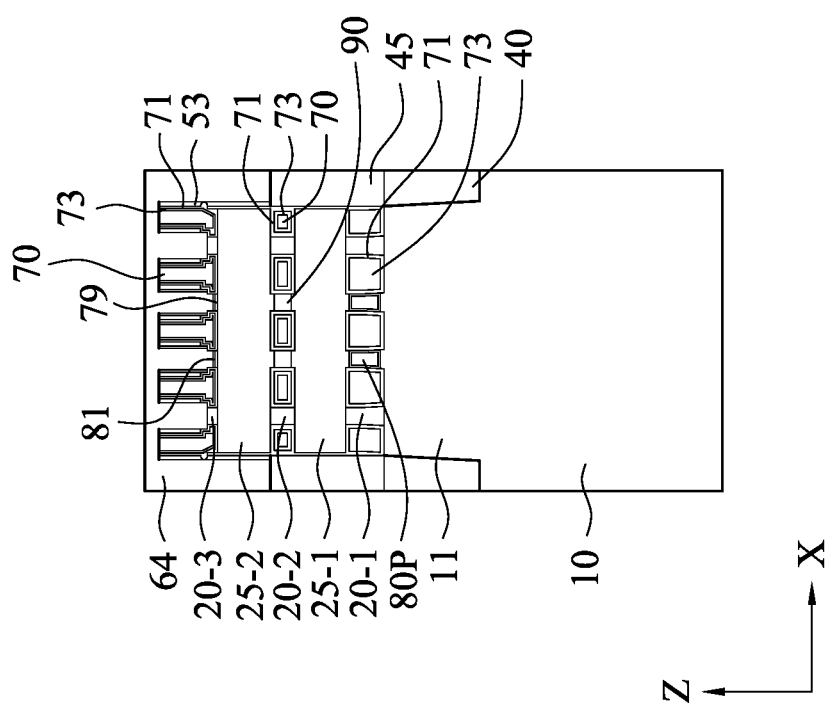

Subsequently, a third isolation insulating layer 90 is formed over the source/drain contact 80P in the first source/drain opening 78, as shown in FIGS. 18A-18D. The third isolation insulating layer 90 is made of the same material as the second isolation insulating layer 45 in some embodiments. The third isolation insulating layer 90 is formed by depositing an insulating material in and over the first source/drain opening 78 using CVD and/or ALD methods and by performing an etch-back operation so that the second semiconductor layer 25-2 with the protection layer 79 are exposed, as shown in FIG. 18D.

After the third isolation insulating layer 90 is formed, a third ILD layer 64 is formed by CVD or other suitable methods to fill the first source/drain opening 78, as shown in FIGS. 19A-19D. The material of the third ILD layer 64 can be the same as or different from the first and/or second ILD layers.

Figure 20B:
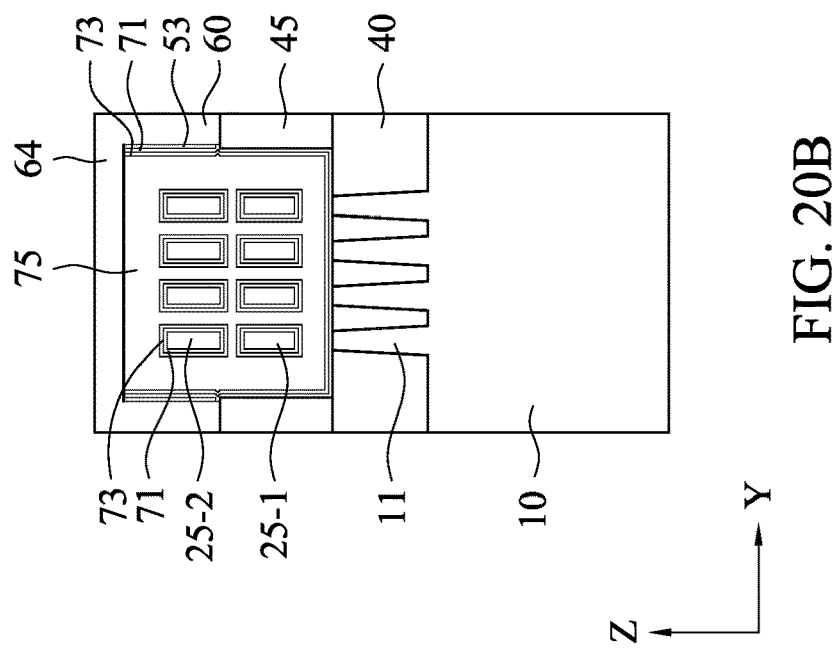
Figure 20A:
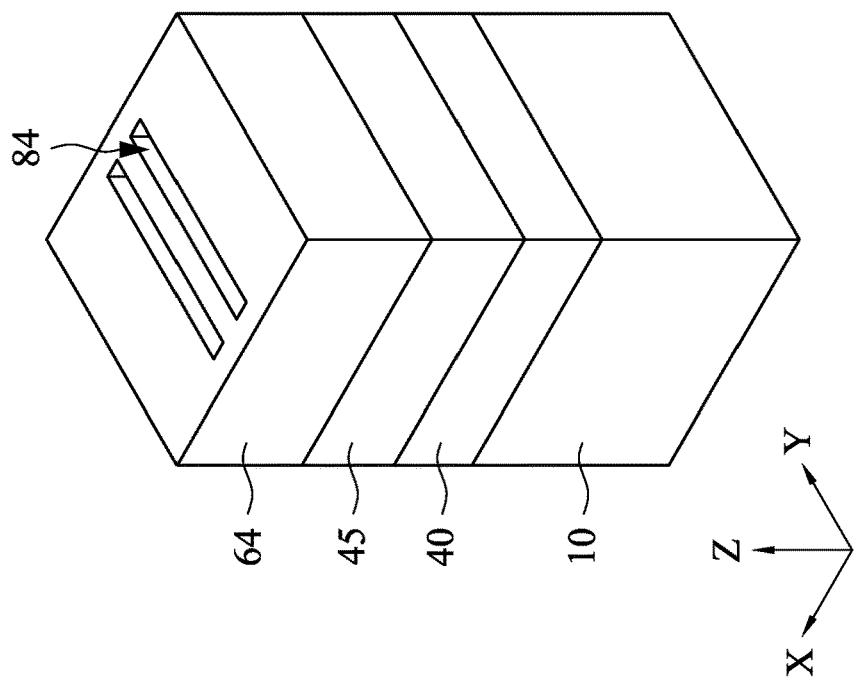
Figure 21B:
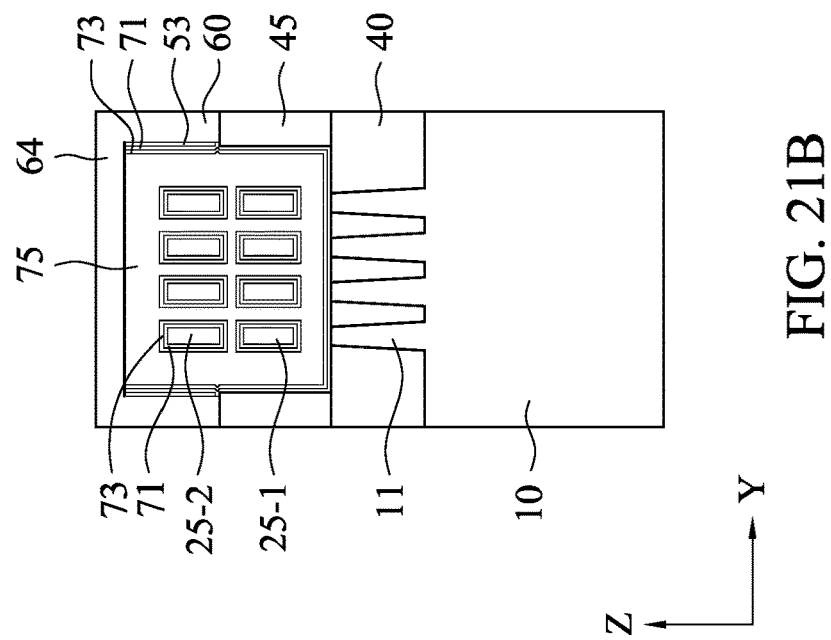
FIGS. 21A, 21B, 21C and 21D show one of the various stages of manufacturing a semiconductor FET device according to embodiments of the present disclosure.
Figure 21A:
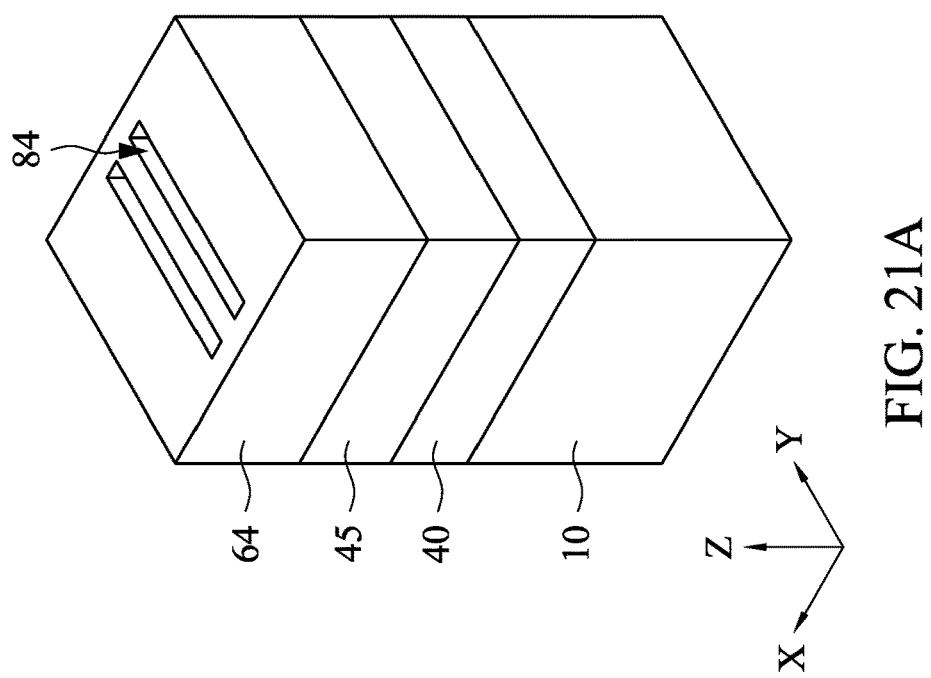
Figure 21D:
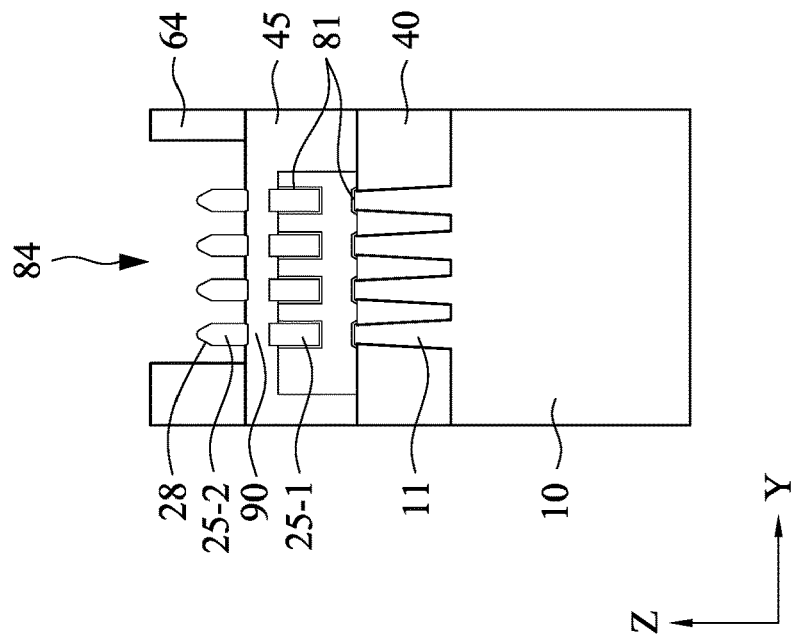
Figure 21C:
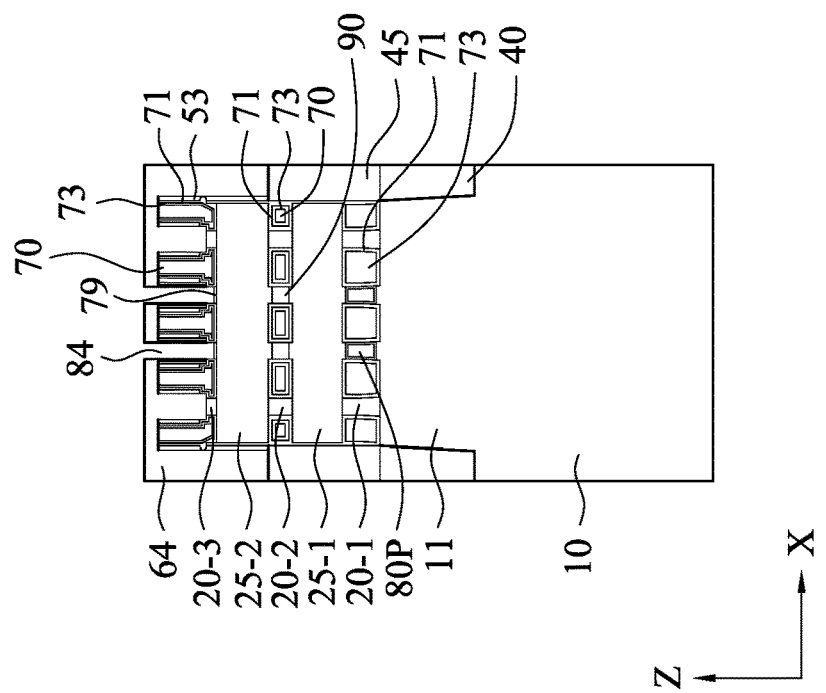

Then, as shown in FIGS. 20A-20D, second source/drain openings 84 are formed by etching the third to first ILD layers. By using one or more lithography and etching operations, the third to first ILD layers 64, 62 and 60 are etched to expose the second semiconductor layer 25-2 with the protection layer 79, as shown in FIG. 20D. Since the first to third ILD layers are made of a different material than the second isolation insulating layer 45, the etching substantially stops on the surface of the second isolation insulating layer 45. As shown in FIG. 20D, the second source/drain opening 84 is offset to the right in the Y direction with respect to the fin structures.

In some embodiments, an epitaxial layer 28 is formed over the second semiconductor layer 25-2, after the protection layer 79 is removed, as shown in FIGS. 21A-21D. The epitaxial layer 28 includes SiP (Si doped with P) for an n-type GAA FET.

Figure 22D:
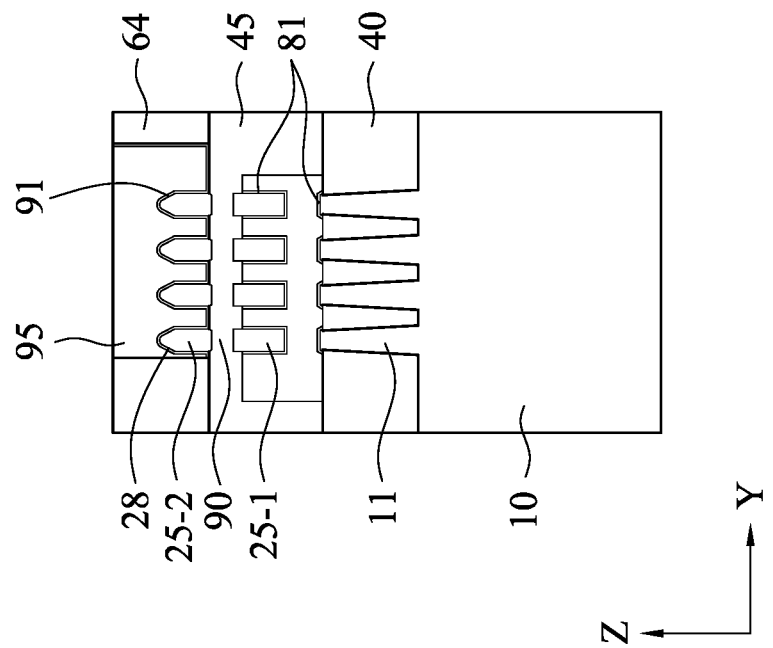
Figure 22C:
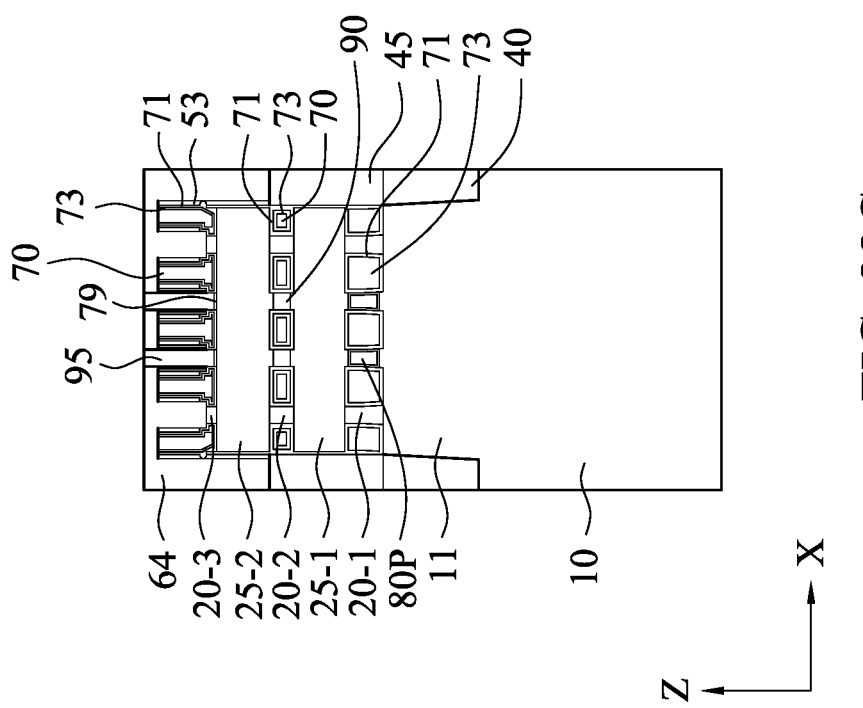
Figure 23B:
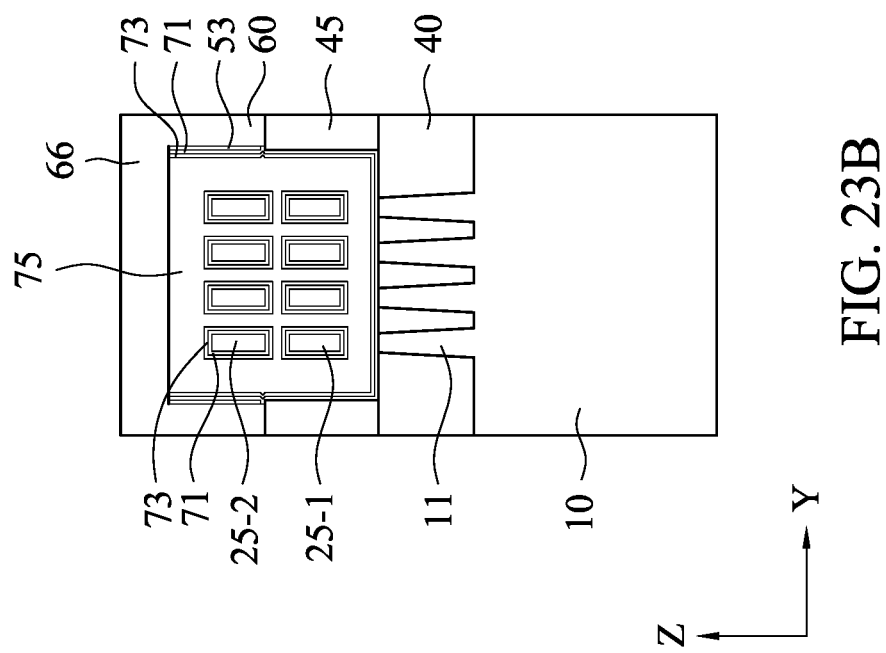
FIGS. 23A, 23B, 23C and 23D show one of the various stages of manufacturing a semiconductor FET device according to embodiments of the present disclosure.
Figure 23A:
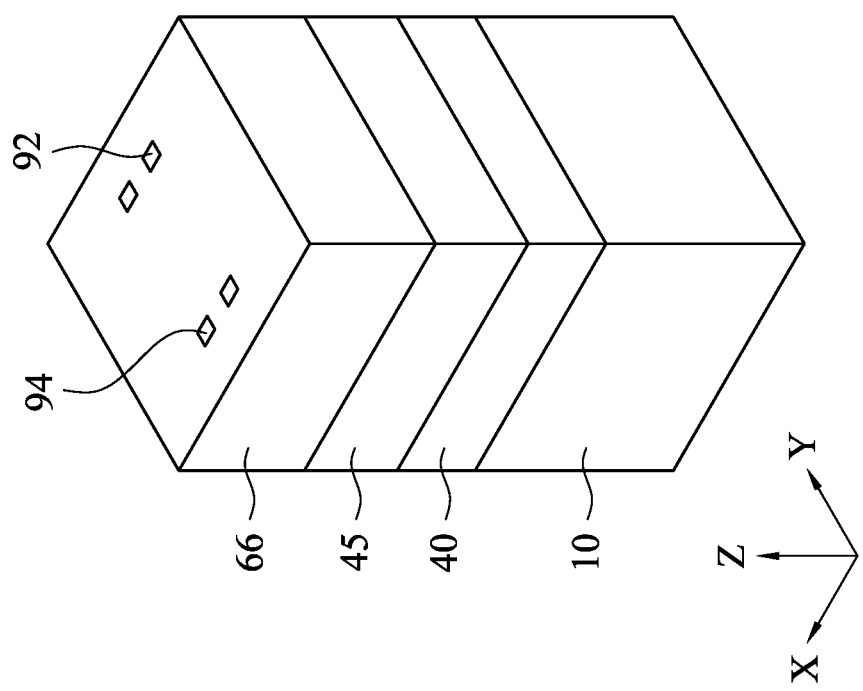
Figure 23D:
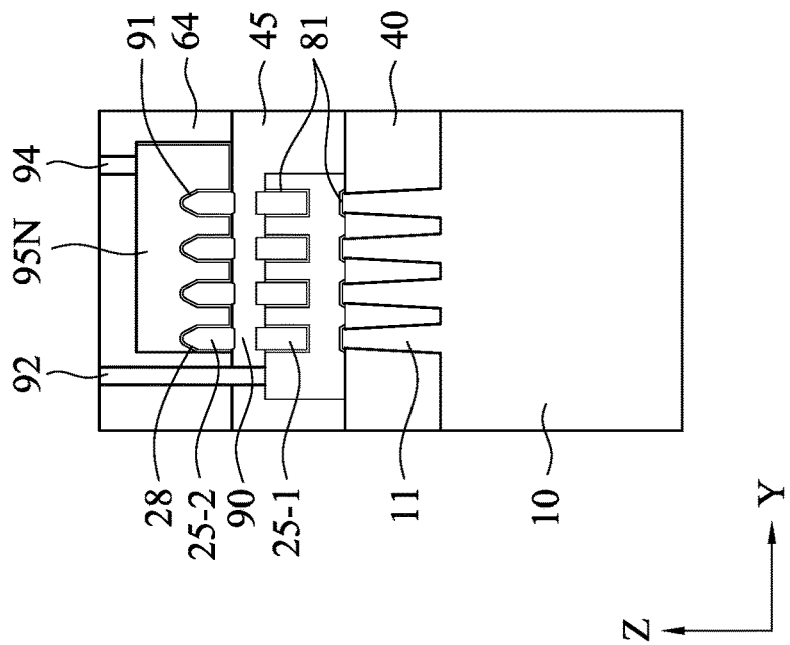
Figure 23C:
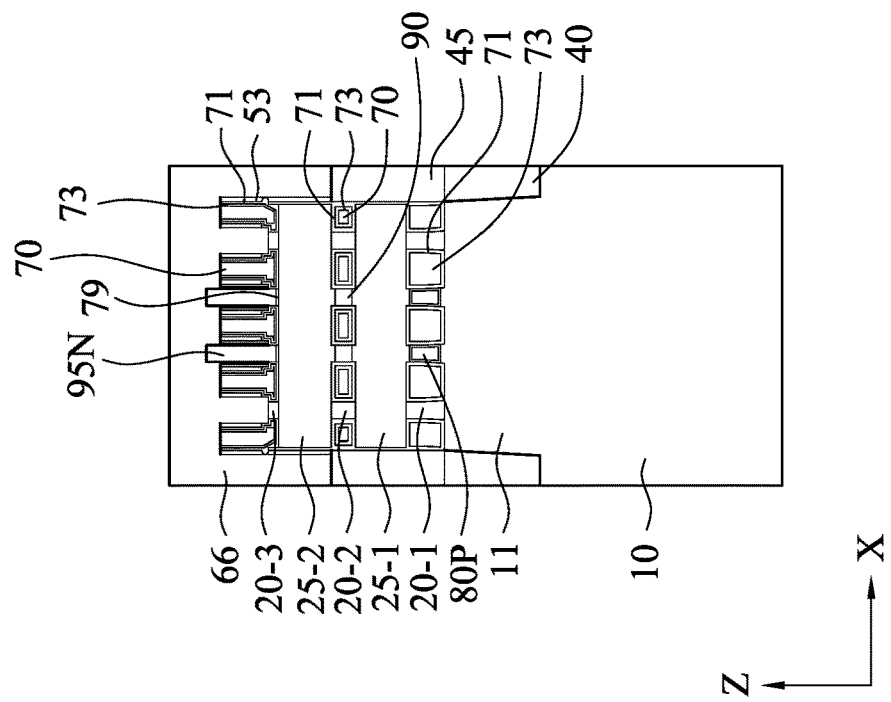

Next, as shown in FIGS. 22A-22D, a second conductive layer 95 is formed in the second source/drain opening 84. The conductive material is formed in and over the second source/drain openings 84 and then a planarization operation, such as a CMP operation, is performed to form the second conductive layer 95, as shown in FIG. 22D. The conductive material includes one or more layers of Co, Ni, W, Ti, Ta, Cu, Al, TiN and TaN, or any other suitable material. In some embodiments, a silicide layer 91 is formed over the epitaxial layers 28 before forming the conductive material. The silicide layer 91 includes one or more of WSi, CoSi, NiSi, TiSi, MoSi and TaSi. The second conductive layer 95 is a source/drain contact 95N for an n-type GAA FET.

Then, the fourth ILD layer 66 is formed by CVD or other suitable methods over the second conductive layer 95, as shown in FIGS. 23A-23D. The material of the fourth ILD layer 66 can be the same as or different from the first, second and/or third ILD layers.

Subsequently, by using one or more lithography and etching operations, a first source/drain contact hole is formed to reach the source/drain contact 80P, and a second source/drain contact hole is formed to reach the source/drain contact 95N. Then, the first and second source/drain contact holes are filled with a conductive material, thereby forming a first contact plug 92 and a second contact plug 94, as shown in FIGS. 23A-23D.

As shown in FIGS. 23A-23D, a p-type GAA FET with multiple channel regions horizontally arranged and an n-type GAA FET with multiple channel regions horizontally arranged are vertically arranged. The gate electrode is common to the p-type GAA FET and the n-type GAA FET, and the source/drains of the p-type GAA FET and the n-type GAA FET are separated.

Figure 24B:
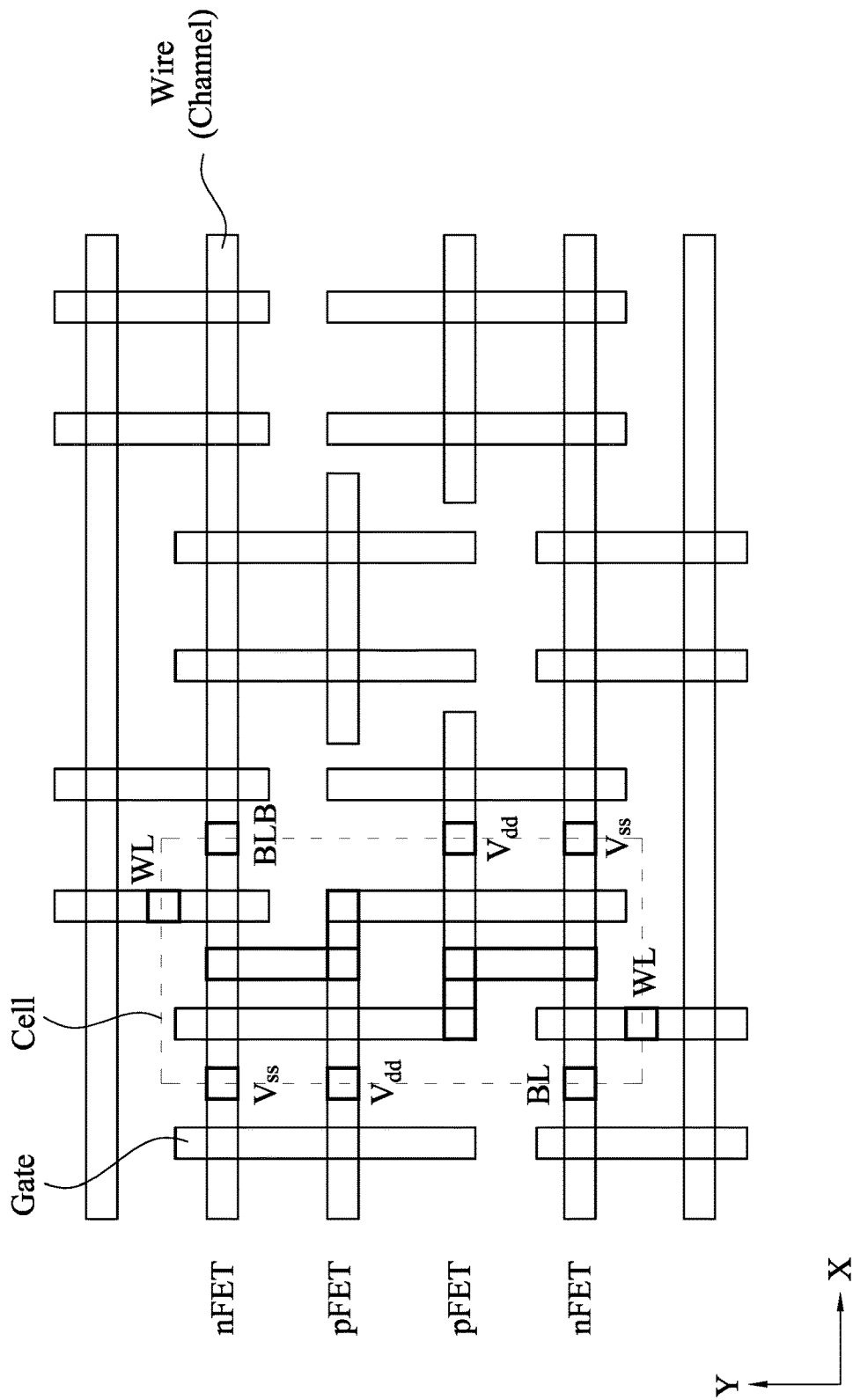
FIGS. 24B and 24C show pattern layouts of a semiconductor static random access memory (SRAM).
Figure 24C:
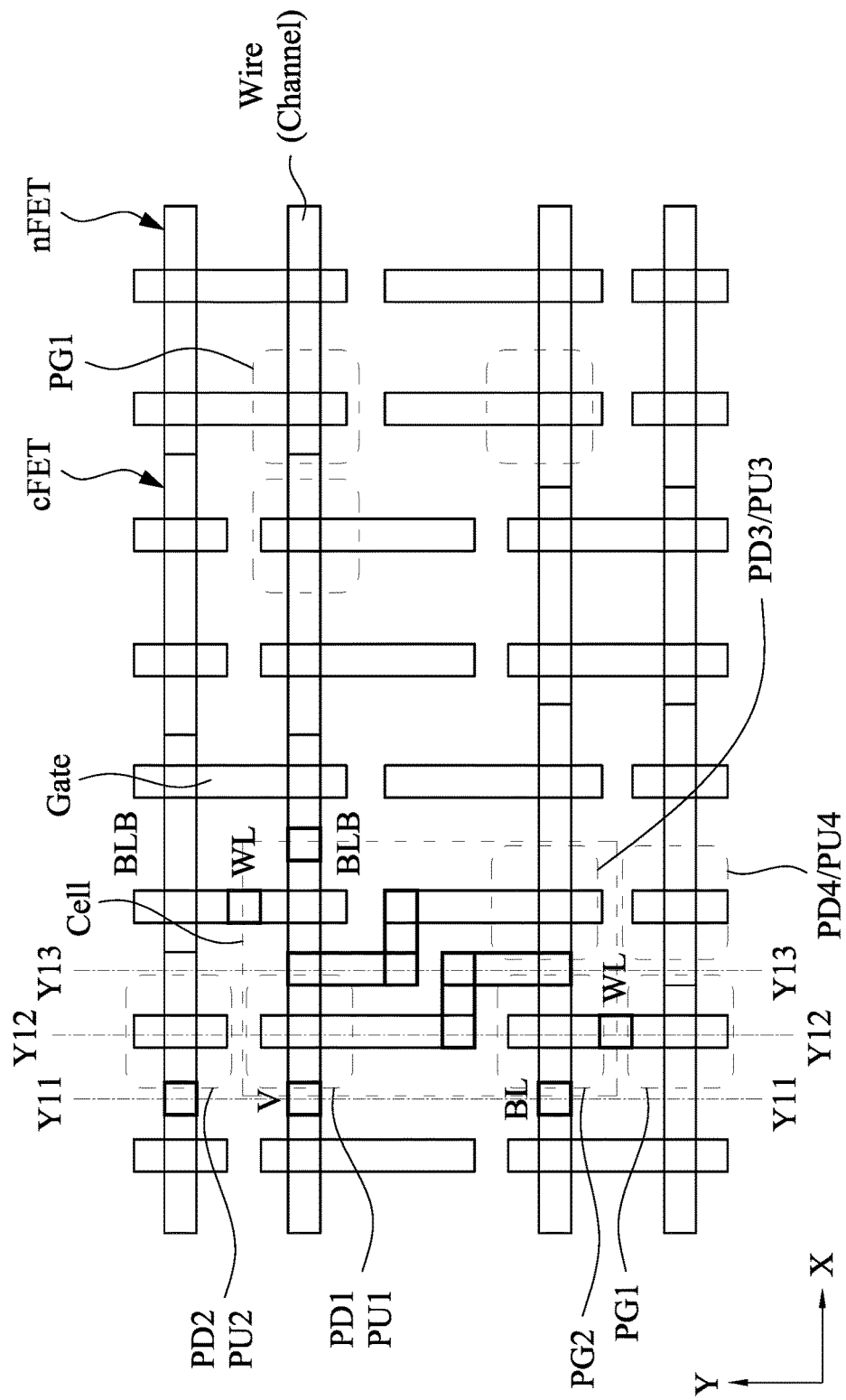

FIGS. 24B and 24C show pattern layouts of a semiconductor static random access memory (SRAM). Material, configuration, dimensions and/or processes the same as or similar to the foregoing embodiments described with respect to FIGS. 1A-23B may be employed in the following embodiments, and detailed explanation thereof may be omitted.

FIG. 24B shows a layout of an SRAM using FinFETs. In this layout, n-type FinFETs, p-type FinFETs, other n-type FinFET and other p-type FinFETs are arranged along the Y direction. In FIG. 24C, the p-type FETs are arranged below the n-type FETs.

As shown in FIG. 24C, an SRAM cell includes a first pull-up transistor PU1, a first pull-down transistor PD1, and a first pass-gate transistor PG1. Source electrodes of the first pull-up transistor PU1, the first pull-down transistor PD1, and the first pass-gate transistor PG1 are electrically connected at a first data storage node. The SRAM cell further includes a second pull-up transistor PU2, a second pull-down transistor PD2, and a second pass-gate transistor PG2. Source electrodes of the second pull-up transistor PU2, the second pull-down transistor PD2, and the second pass-gate transistor PG2 are electrically connected at a second data storage node. Gate electrode layers of the second pull-up transistor PU2 and the second pull-down transistor PD2 are electrically connected to the source electrodes of the first pull-down transistor PD1, the first pass-gate transistor PG1 and the first pull-up transistor PU1 through the first data storage node. Gate electrode layers of the first pull-up transistor PU1 and the first pull-down transistor PD1 are electrically connected to the source electrodes of the second pull-down transistor PD2, the second pass-gate transistor PG2 and the second pull-up transistor PU2 through the second data storage node. Drain electrodes of the first and second pull-up transistors PU1 and PU2 are connected to a first power supply node (e.g., Vdd), while drain electrodes of the first and second pull-down transistors PD1 and PD2 are connected to a second power supply node (e.g., Vss). According to some embodiments, in the SRAM cell, the first and second pass-gate transistors PG1 and PG2 and the first and second pull-down transistors PD1 and PD2 are n-type transistors, and the first and second pull-up transistors PU1 and PU2 are p-type transistors.

In the present embodiments, the first pull-up transistors PU1 is disposed below the first pull-down transistor PD1 forming a CFET, and the second pull-up transistor PU2 is disposed below the second pull-down transistor PD2 forming another CFET. Similarly, a third first pull-up transistors PU3 is disposed below a third pull-down transistor PD3 forming a CFET, and a fourth pull-up transistor PU4 is disposed below a fourth pull-down transistor PD4 forming a CFET. Accordingly, the cell height in the Y direction can be reduced compared with the layout shown by FIG. 24B.

Figure 25A:
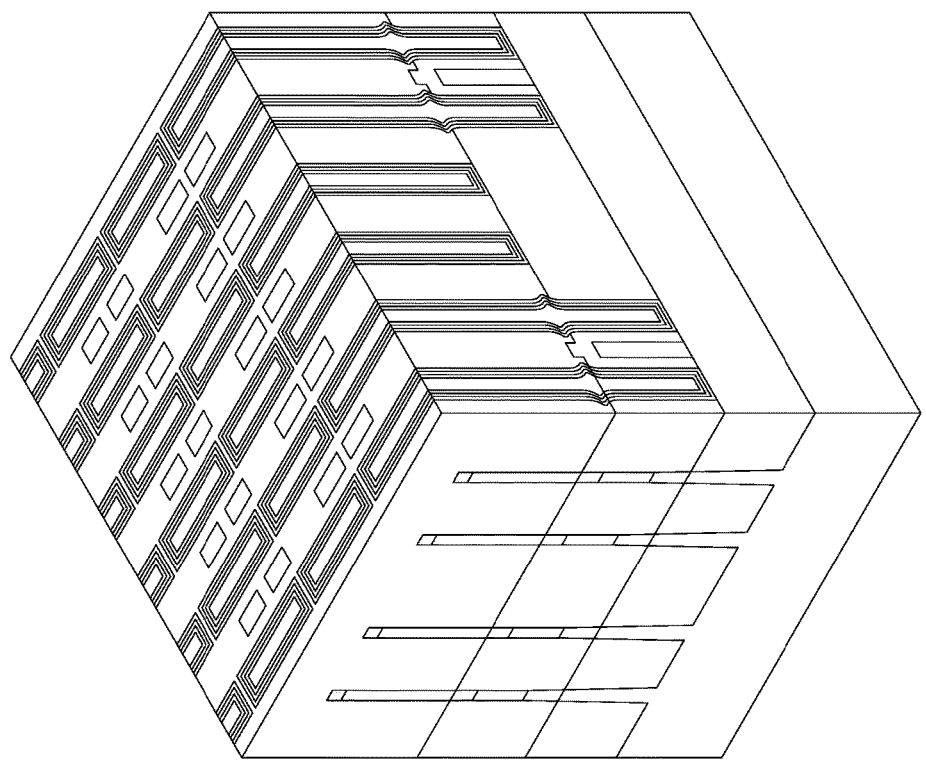
FIGS. 25A, 25B, 25C and 25D show various views of an SRAM employing a CFET.
Figure 25B:
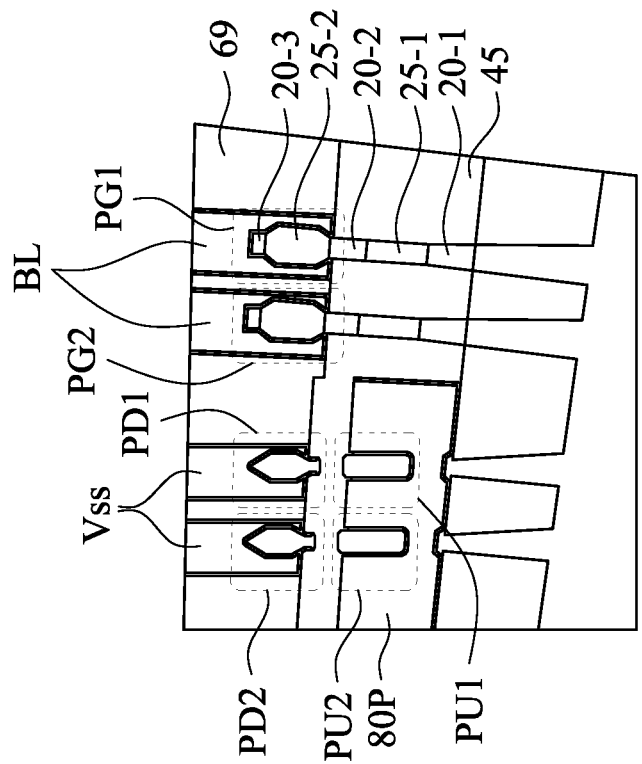
Figure 25D:
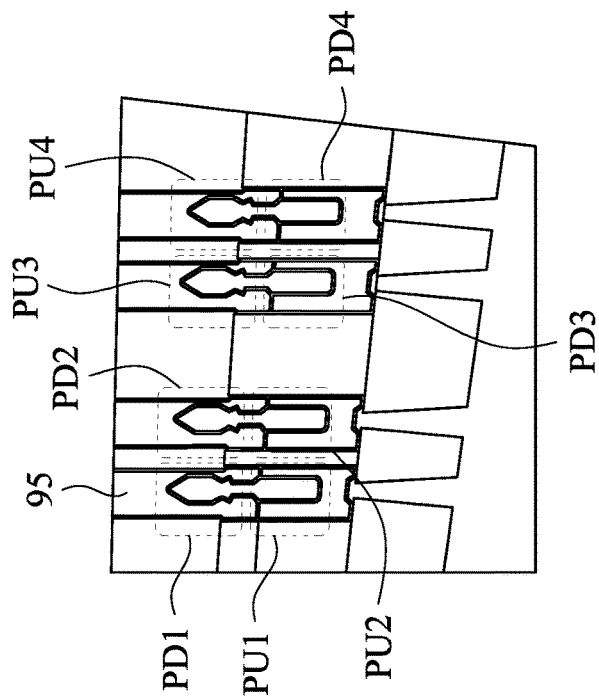
Figure 25C:
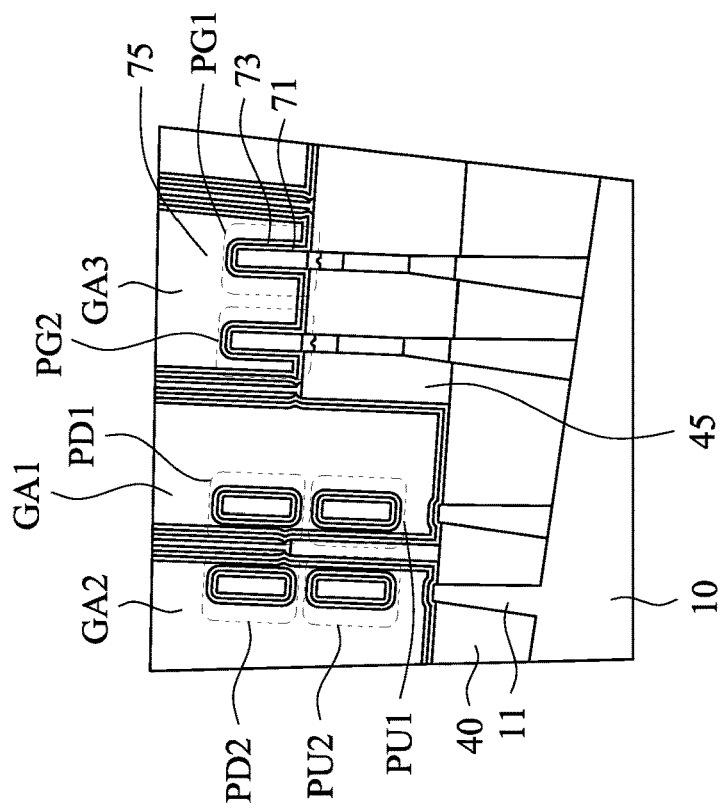

FIGS. 25A, 25B, 25C and 25D show various views of an SRAM employing a CFET corresponding to the layout shown by FIG. 24C. FIG. 25A is a perspective view of the SRAM, FIG. 25B is a cross sectional view of source/drain regions corresponding to line Y11-Y11 of FIG. 24C, FIG. 25C is a cross sectional view of gate regions corresponding to line Y12-Y12 of FIG. 24C, and FIG. 25D is a cross sectional view of source/drain regions corresponding to line Y13-Y13 of FIG. 24C.

As shown in FIG. 25B, source/drain regions of transistors PD1 and PD2 are formed in the level of an ILD layer 69 including the first to fourth ILD layers, and connected to the potential Vss. Source/drain regions of transistors PG1 and PG2 are formed in the level of an ILD layer 69, and connected to bit lines BL, respectively. A source/drain region of transistor PU1 and a source/drain region of transistor PU2 are formed in the level of the second isolation insulating layer 45 and electrically connected to each other by a source/drain contact 80P. The source/drain regions of transistors PD1 and PD2 are separated by the second isolation insulating layer 45 from the source/drain regions of transistors PU1 and PU2.

In some embodiments, transistors PU1, PU2, PD1 and PD2 in the SRAM cells are formed by a GAA FET, respectively, and transistors PG1 and PG2 in the SRAM cells are formed by a FinFET. In other embodiments, all of the transistors in the SRAM cell are formed by a GAA FET, respectively.

As shown in FIG. 25C, a common gate electrode GA1 is provided for the transistors PU1 and PD1, and a common gate electrode GA2 is provided for the transistors PU2 and PD2. Another common gate GA3 is provided for the transistors PG1 and PG2, which belongs to adjacent SRAM unit cells, respectively.

Further as shown in FIG. 25D, source/drain regions of transistors PD1 and PD2 are connected to source/drain regions of transistors PU1 and PU2, respectively, by a source/drain contact 95, and source/drain regions of transistors PU3 and PU4 are connected to source/drain regions of transistors PD3 and PD4, respectively.

Figure 26F:
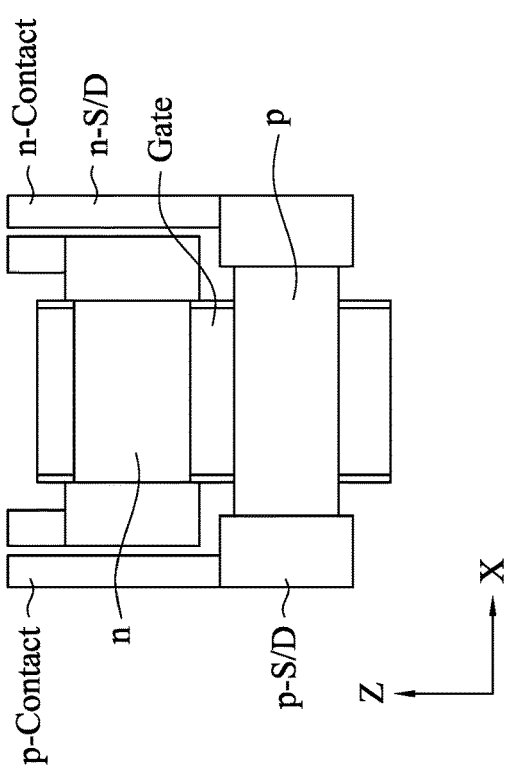
FIGS. 26A, 26B, 26C. 26D, 26E and 27F show various channel arrangement according to embodiments of the present disclosure.

FIGS. 26A-26E show various channel arrangements according to embodiments of the present disclosure. FIG. 26F shows a cross sectional view along the X direction corresponding to the structure of FIG. 26A. FIG. 26A shows the case where a channel of an n-type GAA FET is disposed above a channel of a p-type GAA FET and the channel height (a vertical dimension of the channel region (semiconductor wire) is the same for the p-type GAA FET and the n-type GAA FET. The channel height of the channel region affects a current that flows through the channel (driving capacity). The channel height can be adjusted by adjusting the thickness of the second semiconductor layer 25. As shown in FIG. 26B, bar shaped channels are stacked and wrapped around by a gate structure. Ends of the channels are coupled to source/drain epitaxial layers, respectively, which are connected to contact layers, respectively. In FIG. 26B, the channel height of the n-type GAA FET is greater than that of the p-type GAA FET, and in FIG. 26C, the channel height of the n-type GAA FET is smaller than that of the p-type GAA FET.

Figure 26E:
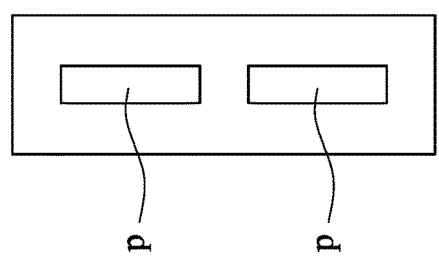
Figure 26D:
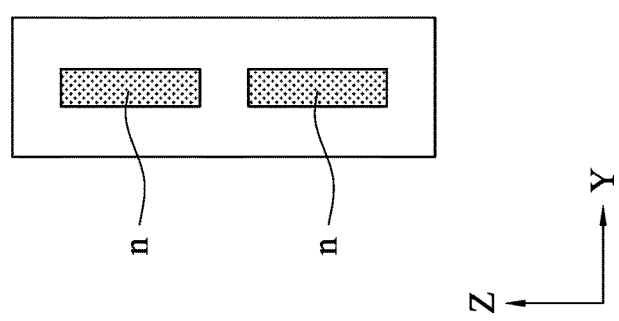

Further, as shown in FIGS. 26D and 26E, the same conductivity type GAA FETs can be stacked as a CFET. In such cases, a gate electrode is common to two GAA FETs and at least ones of the sources and the drains of two GAA FETs are electrically separated.

Figure 27E:
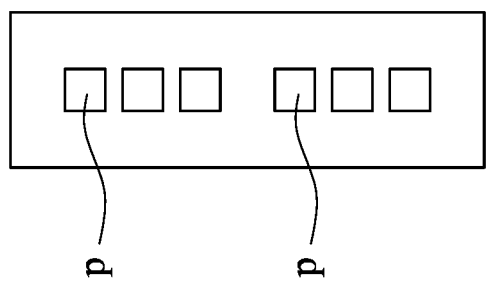
FIGS. 27A, 27B, 27C. 27D, 27E, 27F and 27G show various channel arrangement according to embodiments of the present disclosure.
Figure 27D:
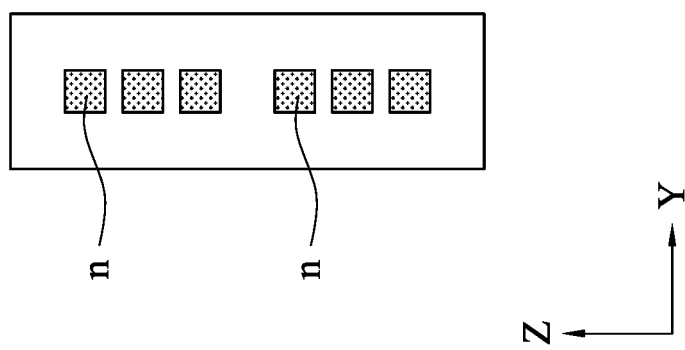
Figure 27G:
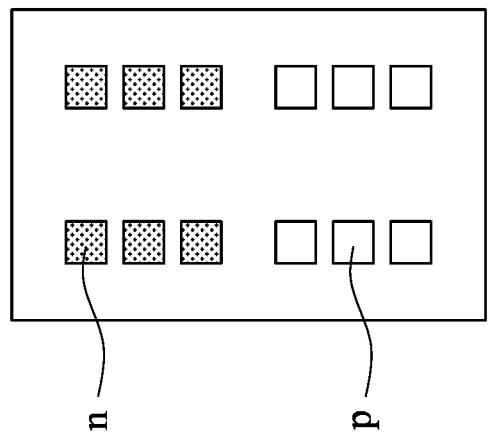
Figure 27F:
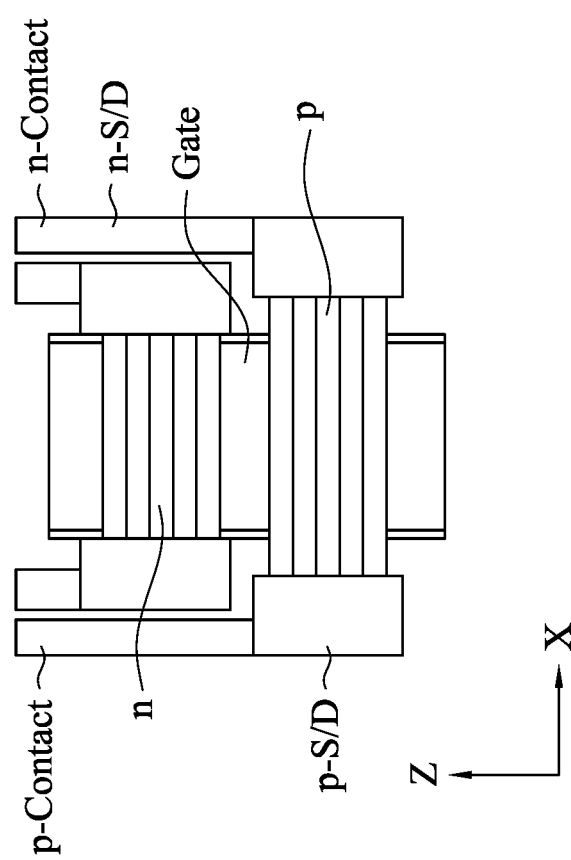

FIGS. 27A-27E show various channel arrangement according to embodiments of the present disclosure. FIG. 27F shows a cross sectional view along the X direction corresponding to the structure of FIG. 27A. In FIGS. 27A-27E, each of the GAA FETs includes multiple channels (wires) vertically stacked. In these embodiments, the current driving capacity can be adjusted by the number of the vertically stacked channels. In FIG. 27A, the number of the channels (wires) is the same for an n-type GAA FET and a p-type GAA FET, while in FIGS. 27B and 27C, the numbers are different (smaller or greater). In FIG. 27B, an n-type GAA FET includes three channels (semiconductor wires) where the ends of the vertically arranged three wires are connected to source/drain regions of the n-type GAA FET, while a channel of a p-type GAA FET includes two channels where the ends of the vertically arranged two wires are connected to source/drain regions of the p-type GAA FET. In some embodiments, a gate electrode is common to the n-type and p-type GAA FETs and at least ones of the sources and the drains of n-type and p-type GAA FETs are electrically separated. In FIG. 27C, the number of the channels (wires) of the p-type GAA FET is greater than that of the n-type GAA FET. Similar to FIGS. 26D and 26E, it is possible to stack the same conductivity type GAA FETs. In such cases, a gate electrode is common to two GAA FETs and at least ones of the sources and the drains of two GAA FETs are electrically separated. Further, as shown in FIG. 27G, in some embodiments, nanowires are arranged in multiple columns and rows. In the case of FIG. 27G, three vertically arranged n-channels or p-channels are arranged by two columns side-by-side. The matrix of the channels (nanowires) is not limited to 3×2. It can be 3×3, 2×3, 2×2, or any other suitable matrix.

The semiconductor wires as shown in FIGS. 27A-27E can be manufactured by alternately stacking the first (sacrificial) semiconductor layers and the second semiconductor layers (channel) according to the desired numbers of the channels.

The various embodiments or examples described herein offer several advantages over the existing art. For example, in the present disclosure, since different conductivity-type GAA FETs are vertically stacked, it is possible to reduce the area of the semiconductor device, such as an SRAM.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure is formed. The fin structure includes a bottom portion, a first sacrificial layer disposed over the bottom portion, a first semiconductor layer disposed over the first sacrificial layer, a second sacrificial layer disposed over the first semiconductor layer and a second semiconductor layer disposed over the second sacrificial layer. The second semiconductor layer protrudes from a first insulating layer. A dummy gate structure is formed over the second semiconductor layer. A sidewall spacer layer is formed on side faces of the dummy gate structure. A first dielectric layer is formed over the dummy gate structure and the sidewall spacer layer. The dummy gate structure is removed, thereby forming a gate space. The first insulating layer is etched in the gate space, thereby exposing the first semiconductor layer and the first and second sacrificial layers. The first and second sacrificial layers are removed. A gate dielectric layer is formed over the first and second semiconductor layers, and a gate electrode layer is formed over the gate dielectric layer. In one or more of the foregoing and the following embodiments, the first insulating layer includes a lower insulating layer covering the bottom portion of the fin structure and an upper insulating layer covering the first and second sacrificial layers and the first semiconductor layer, and the lower insulating layer is made of a different material than the upper insulating layer. In one or more of the foregoing and the following embodiments, the upper insulating layer is made of SiCO. In one or more of the foregoing and the following embodiments, the etching the first insulating layer in the gate space selectively etches the upper insulating layer. In one or more of the foregoing and the following embodiments, the lower insulating layer is formed by depositing a silicon oxide layer over the fin structures and recessing the deposited silicon oxide layer, and the upper insulating layer is formed by depositing an SiCO layer over the recessed silicon oxide layer and recessing the SiCO layer to expose the second semiconductor layer. In one or more of the foregoing and the following embodiments, by the recessing the SiCO layer, a part of the second sacrificial layer is exposed. In one or more of the foregoing and the following embodiments, the fin structure further includes a third sacrificial layer disposed on the second semiconductor layer. In one or more of the foregoing and the following embodiments, the first semiconductor layer is for a first type gate-all-around field effect transistor (GAA FET), and the second semiconductor layer is for a second type GAA FET different from the first type. In one or more of the foregoing and the following embodiments, in the method, a first source/drain contact electrically connected to a source/drain region of the first semiconductor layer is further formed, and a second source/drain contact electrically connected to a source/drain region of the second semiconductor layer is further formed. The first source/drain contact is electrically separated from the second source/drain contact. In one or more of the foregoing and the following embodiments, the first and second semiconductor layers are made of $Si_xGe_{1-x}$ and the first and second sacrificial layers are made of $Si_yGe_{1-y}$, where x<y. In one or more of the foregoing and the following embodiments, the first and second semiconductor layers are made of Si, and the first and second sacrificial layers are made of $Si_xGe_{1-x}$, where 0.1<x<0.9.

In accordance with another aspect of the present disclosure, in a method of manufacturing a semiconductor device, a gate-all-around structure is formed. The GAA structure wraps around a first semiconductor layer and a second semiconductor layer disposed above the first semiconductor layer, and is embedded in a first dielectric layer and a second dielectric layer disposed on the first dielectric layer. The second dielectric layer is etched, thereby forming a first opening, in which a source/drain region of the second semiconductor layer is exposed. A protective layer is formed over the exposed source/drain region of the second semiconductor layer in the first opening. The first dielectric layer is etched in the first opening thereby exposing a source/drain region of the first semiconductor layer. A first contact layer electrically contacting the first semiconductor layer is formed. A third dielectric layer is formed over the first contact layer such that the second semiconductor layer covered by the protective layer is exposed. The protective layer is removed and a second contact layer electrically contacting the second semiconductor layer is formed. In one or more of the foregoing and the following embodiments, before the gate-all-around structure is formed, a fin structure is formed, the fin structure includes a bottom portion, a first sacrificial layer disposed over the bottom portion, the first semiconductor layer disposed over the first sacrificial layer, a second sacrificial layer disposed over the first semiconductor layer and the second semiconductor layer disposed over the second sacrificial layer, and between etching the first dielectric layer and forming the first contact layer, the first and second semiconductor layers are removed from the source/drain regions of the first and second semiconductor layers. In one or more of the foregoing and the following embodiments, the bottom portion is embedded in an isolation insulating layer, and the first dielectric layer is made of a different material than the second dielectric layer and the isolation insulating layer. In one or more of the foregoing and the following embodiments, the first dielectric layer is made of SiCO. In one or more of the foregoing and the following embodiments, the protective layer is made of silicon oxide. In one or more of the foregoing and the following embodiments, before the first contact layer is formed, an epitaxial layer is formed on the exposed source/drain region of the first semiconductor layer. In one or more of the foregoing and the following embodiments, after the third dielectric layer is formed and before the protective layer is removed, a fourth dielectric layer is formed over the source/drain region of the second semiconductor layer with the protective layer, and a second opening is formed to expose the source/drain region of the second semiconductor layer with the protective layer. The protective layer is removed in the second opening. In one or more of the foregoing and the following embodiments, before the second contact layer is formed, an epitaxial layer is formed on the exposed source/drain region of the second semiconductor layer.

In accordance with another aspect of the present disclosure, in a method of manufacturing a semiconductor device, a fin structure is formed. The fin structure includes a bottom portion, a first sacrificial layer disposed over the bottom portion, a first semiconductor layer disposed over the first sacrificial layer, a second sacrificial layer disposed over the first semiconductor layer and a second semiconductor layer disposed over the second sacrificial layer. A gate-all-around structure is formed. The GAA structure wraps around a channel region of the first semiconductor layer and a channel region of the second semiconductor layer, and is embedded in a first dielectric layer and a second dielectric layer disposed on the first dielectric layer. The second dielectric layer is etched and the first dielectric layer is etched, thereby forming a first opening, in which a part of the first sacrificial layer, a source/drain region of the first semiconductor layer and a part of the second sacrificial layer are exposed. The part of the first sacrificial layer and the part of the second sacrificial layer are removed. A first conductive layer is formed in the first opening thereby covering the source/drain region of the first semiconductor layer and exposing a source/drain region of the second semiconductor layer. A third dielectric layer is formed over the first conductive layer. A second conductive layer is formed to cover the source/drain region of the second semiconductor layer.

In accordance with one aspect of the present disclosure, a semiconductor device includes a first gate-all-around field effect transistor (GAA FET) disposed over a substrate, and a second GAA FET disposed above the first GAA FET. The semiconductor device further includes an isolation insulating layer disposed over the substrate, a first dielectric layer disposed over the isolation insulating layer, and a second dielectric layer disposed over the first dielectric layer. A first channel region of the first GAA FET is located at a level between a bottom surface of the first dielectric layer and an upper surface of the first dielectric layer. In one or more of the foregoing and the following embodiments, the first GAA FET and the second GAA FET have different conductivity types from each other. In one or more of the foregoing and the following embodiments, the first dielectric layer is made of a different material than the isolation insulating layer and the second dielectric layer. In one or more of the foregoing and the following embodiments, the first dielectric layer includes SiCO. In one or more of the foregoing and the following embodiments, the semiconductor device further includes a first source/drain contact covering a source/drain region of the first GAA FET and embedded in the first dielectric layer, and a second source/drain contact covering a source/drain region of the second GAA FET and embedded in the second dielectric layer. In one or more of the foregoing and the following embodiments, the first source/drain contact is isolated from the second source/drain contact by a part of the first dielectric layer. In one or more of the foregoing and the following embodiments, the source/drain region of the first GAA FET includes a first epitaxial layer, and the source/drain region of the second GAA FET includes a second epitaxial layer. In one or more of the foregoing and the following embodiments, the semiconductor device further includes, a first contact plug connected to the first source/drain contact, and a second contact plug connected to the second source/drain contact, and the first contact plug passes through the second dielectric layer. In one or more of the foregoing and the following embodiments, a vertical length of the first channel region is different from a vertical length of the second channel region. In one or more of the foregoing and the following embodiments, the first GAA FET and the second GAA FET have a same conductivity type.

In accordance with another aspect of the present disclosure, a semiconductor device includes a first gate-all-around field effect transistor (GAA FET) disposed over a substrate, and a second GAA FET disposed above the first GAA FET. The first GAA FET includes a plurality of first semiconductor wires laterally arranged, and the second GAA FET includes a plurality of second semiconductor wires laterally arranged. In one or more of the foregoing and the following embodiments, the semiconductor device further includes an isolation insulating layer disposed over the substrate, a first dielectric layer disposed over the isolation insulating layer, and a second dielectric layer disposed over the first dielectric layer. First channel regions of the first GAA FET are located at a level between a bottom surface of the first dielectric layer and an upper surface of the first dielectric layer. In one or more of the foregoing and the following embodiments, the first GAA FET and the second GAA FET have different conductivity types from each other. In one or more of the foregoing and the following embodiments, the first dielectric layer includes SiCO or SiCON. In one or more of the foregoing and the following embodiments, the semiconductor device further includes a first source/drain contact covering source/drain regions of the first GAA FET and embedded in the first dielectric layer, and a second source/drain contact covering source/drain regions of the second GAA FET and embedded in the second dielectric layer. In one or more of the foregoing and the following embodiments, the first source/drain contact is isolated from the second source/drain contact by a part of the first dielectric layer. In one or more of the foregoing and the following embodiments, the source/drain regions of the first GAA FET include a first epitaxial layer, respectively, and the source/drain regions of the second GAA FET include a second epitaxial layer, respectively. In one or more of the foregoing and the following embodiments, the semiconductor device further includes a first contact plug connected to the first source/drain contact, and a second contact plug connected to the second source/drain contact. The first contact plug passes through the second dielectric layer. In one or more of the foregoing and the following embodiments, a vertical length of the first channel regions is different from a vertical length of the second channel regions.

In accordance with another aspect of the present disclosure, a semiconductor static random access memory includes a first pass-gate transistor, a second pass-gate transistor, a first pull-up transistor, a second pull-up transistor, a first pull-down transistor and a second pull-down transistor, each of which is formed by a gate-all-around field effect transistor (GAA FET). The first and second pull-up transistors are located at a first level and the first and second pass-gate transistors and the first and second pull-down transistors are located at a second level above the first level. The first pull-up transistor and the first pull-down transistor are vertically aligned. The second pull-up transistor and the second pull-down transistor are vertically aligned.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a fin structure including a bottom portion, a first sacrificial layer disposed over the bottom portion, a first semiconductor layer disposed over the first sacrificial layer, a second sacrificial layer disposed over the first semiconductor layer and a second semiconductor layer disposed over the second sacrificial layer;
    forming a lower insulating layer to cover the bottom portion of the fin structure;
    forming an upper insulating layer made of a different material than the lower insulating layer to cover the first sacrificial layer, the first semiconductor layer and the second sacrificial layer, so that the second semiconductor layer protrudes from the upper insulating layer;
    forming a dummy gate structure over the second semiconductor layer;
    forming a sidewall spacer layer on side faces of the dummy gate structure;
    forming a first dielectric layer over the dummy gate structure and the sidewall spacer layer;
    removing the dummy gate structure, thereby forming a gate space;
    etching the upper insulating layer in the gate space, thereby exposing the first semiconductor layer and the first and second sacrificial layers;
    removing the first and second sacrificial layers;
    forming a gate dielectric layer over the first and second semiconductor layers; and
    forming a gate electrode layer over the gate dielectric layer, wherein:
    the lower insulating layer is formed by depositing a silicon oxide layer over the fin structures and recessing the deposited silicon oxide layer, and
    the upper insulating layer is formed by depositing an SiCO layer over the recessed silicon oxide layer and recessing the SiCO layer to expose the second semiconductor layer.

2. The method of claim 1, wherein in the etching the upper insulating layer in the gate space, the upper insulating layer is etched selective to the lower insulating layer.

3. The method of claim 1, wherein by the recessing the SiCO layer, a part of the second sacrificial layer is exposed.

4. The method of claim 1, wherein the fin structure further includes a third sacrificial layer disposed on the second semiconductor layer.

5. The method of claim 1, wherein:
    the first semiconductor layer is for a first type gate-all-around field effect transistor (GAA FET), and
    the second semiconductor layer is for a second type GAA FET different from the first type.

6. The method of claim 5, further comprising:
    forming a first source/drain contact electrically connected to a source/drain region of the first semiconductor layer; and
    forming a second source/drain contact electrically connected to a source/drain region of the second semiconductor layer,
    wherein the first source/drain contact is electrically separated from the second source/drain contact.

7. The method of claim 1, wherein the first and second semiconductor layers are made of $Si_xGe_{1-x}$ and the first and second sacrificial layers are made of $Si_yGe_{1-y}$, where x<y.

8. The method of claim 1, wherein the first and second semiconductor layers are made of Si, and the first and second sacrificial layers are made of $Si_xGe_{1-x}$, where 0.1<x<0.9.

9. A method of manufacturing a semiconductor device, the method comprising:
    forming a gate-all-around structure wrapping around a first semiconductor layer and a second semiconductor layer disposed above the first semiconductor layer, the gate-all-around structure being embedded in a first dielectric layer and a second dielectric layer disposed on the first dielectric layer;
    etching the second dielectric layer, thereby forming a first opening, in which a source/drain region of the second semiconductor layer is exposed;
    forming a protective layer over the exposed source/drain region of the second semiconductor layer in the first opening;
    etching the first dielectric layer in the first opening, thereby exposing a source/drain region of the first semiconductor layer;
    forming a first contact layer electrically contacting the first semiconductor layer;
    forming a third dielectric layer over the first contact layer such that the second semiconductor layer covered by the protective layer is exposed; and
    removing the protective layer and forming a second contact layer electrically contacting the second semiconductor layer.

10. The method of claim 9, further comprising, before the gate-all-around structure is formed:
    forming a fin structure including a bottom portion, a first sacrificial layer disposed over the bottom portion, the first semiconductor layer disposed over the first sacrificial layer, a second sacrificial layer disposed over the first semiconductor layer and the second semiconductor layer disposed over the second sacrificial layer; and
    between the etching the first dielectric layer and the forming the first contact layer, removing the first and second semiconductor layers from the source/drain regions of the first and second semiconductor layers.

11. The method of claim 10, wherein:
    the bottom portion is embedded in an isolation insulating layer, and
    the first dielectric layer is made of a different material than the second dielectric layer and the isolation insulating layer.

12. The method of claim 11, wherein the first dielectric layer is made of SiCO.

13. The method of claim 9, wherein the protective layer is made of silicon oxide.

14. The method of claim 9, further comprising:
before the first contact layer is formed, forming an epitaxial layer on the exposed source/drain region of the first semiconductor layer.

15. The method of claim 9, further comprising, after the third dielectric layer is formed and before the protective layer is removed:
forming a fourth dielectric layer over the source/drain region of the second semiconductor layer with the protective layer; and
forming a second opening to expose the source/drain region of the second semiconductor layer with the protective layer,
wherein the protective layer is removed in the second opening.

16. The method of claim 15, further comprising:
before the second contact layer is formed, forming an epitaxial layer on the exposed source/drain region of the second semiconductor layer.

17. A method of manufacturing a semiconductor device, the method comprising:
forming a fin structure including a bottom portion, a first sacrificial layer disposed over the bottom portion, a first semiconductor layer disposed over the first sacrificial layer, a second sacrificial layer disposed over the first semiconductor layer and a second semiconductor layer disposed over the second sacrificial layer;
forming a gate-all-around structure wrapping around a channel region of the first semiconductor layer and a channel region of the second semiconductor layer, the gate-all-around structure being embedded in a first dielectric layer and a second dielectric layer disposed on the first dielectric layer;
etching the second dielectric layer and etching the first dielectric layer, thereby forming a first opening, in which a part of the first sacrificial layer, a source/drain region of the first semiconductor layer and a part of the second sacrificial layer are exposed;
removing the part of the first sacrificial layer and the part of the second sacrificial layer;
forming a first conductive layer in the first opening, thereby covering the source/drain region of the first semiconductor layer and exposing a source/drain region of the second semiconductor layer;
forming a third dielectric layer over the first conductive layer; and
forming a second conductive layer to cover the source/drain region of the second semiconductor layer.

* * * * *